US006876575B2

(12) United States Patent
Hidaka

(10) Patent No.: US 6,876,575 B2
(45) Date of Patent: Apr. 5, 2005

(54) THIN FILM MAGNETIC MEMORY DEVICE HAVING A MAGNETIC TUNNEL JUNCTION

(75) Inventor: Hideto Hidaka, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 09/982,936

(22) Filed: Oct. 22, 2001

(65) Prior Publication Data

US 2002/0172068 A1 Nov. 21, 2002

(30) Foreign Application Priority Data

May 16, 2001 (JP) ......................................... 2001-145984

(51) Int. Cl.⁷ .............................................. G11C 11/14
(52) U.S. Cl. ........................ 365/171; 365/173; 365/158
(58) Field of Search ................................ 365/171, 173, 365/158, 203, 210, 189.09, 189.05

(56) References Cited

U.S. PATENT DOCUMENTS

| | | | |
|---|---|---|---|
| 5,732,016 | A | 3/1998 | Chen et al. |
| 6,055,178 | A | 4/2000 | Naji |
| 6,072,718 | A | 6/2000 | Abraham et al. |
| 6,111,781 | A | 8/2000 | Naji |
| 6,215,707 | B1 | 4/2001 | Moyer |
| 6,219,273 | B1 * | 4/2001 | Katti et al. .................. 365/158 |
| 6,226,197 | B1 * | 5/2001 | Nishimura .................. 365/171 |
| 6,349,054 | B1 * | 2/2002 | Hidaka ........................ 365/158 |
| 6,359,805 | B1 * | 3/2002 | Hidaka ........................ 365/171 |

FOREIGN PATENT DOCUMENTS

| | | |
|---|---|---|
| JP | 10-116489 | 5/1998 |
| JP | 2001-297579 | 10/2000 |
| KR | 1999-0072259 | 9/1999 |

OTHER PUBLICATIONS

U.S. patent application No. 09/944,346, filed Sep. 4, 2001.
U.S. patent application No. 09/929,054, filed Aug. 15, 2001.
U.S. patent application No. 09/887,321, filed Jun. 25, 2001.
U.S. patent application No. 09/834,638, filed Apr. 16, 2001.
U.S. patent application No. 09/832,025, filed Apr. 11, 2001.
Scheuerlein, et al., "A 10ns Read and Write Non–Volatile Memory Array Using a Magnetic Tunnel Junction and FET Switch in Each Cell," ISSCC Digest of Technical Papers, TA7.2, Feb. 2000, pp. 94–95, 128–129 and 409–410.
Durlam, et al., "Nonvolatile RAM based on Magnetic Tunnel Junction Elements," ISSCC Digest of Technical Papers, TA7.3, Feb. 2000, pp. 96–97, 130–131 and 410–411.

* cited by examiner

Primary Examiner—David Lam
(74) Attorney, Agent, or Firm—McDermott Will & Emery LLP

(57) ABSTRACT

Bit lines and source lines are precharged to a power supply voltage before data read operation. In the data read operation, a corresponding bit line is coupled to a data bus as well as a corresponding source line is driven to a ground voltage only in the selected memory cell column. In the non-selected memory cell columns, the bit lines and the source lines are retained at the precharge voltage, i.e., the power supply voltage. No charging/discharging current is produced in the bit lines of the non-selected memory cell columns, that is, a charging/discharging current that does not directly contribute the data read operation is not produced, thereby allowing for reduction in power consumption in the data read operation.

33 Claims, 32 Drawing Sheets

THIN FILM MAGNETIC MEMORY DEVICE HAVING A MAGNETIC TUNNEL JUNCTION

BACKGROUND OF THE INVENTION

1. Field of the Invention

The present invention generally relates to a thin film magnetic memory device. More particularly, the present invention relates to a thin film magnetic memory device capable of random access and including memory cells having a magnetic tunnel junction (MTJ).

2. Description of the Background Art

An MRAM (Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the performance of the MRAM device is significantly improved by using tunnel magnetic resistive elements having a magnetic tunnel junction (MTJ) as memory cells. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, and "Nonvolatile RAM based on Magnetic Tunnel Junction Elements", ISSCC Digest of Technical Papers, TA7.3, February 2000.

FIG. 39 is a schematic diagram showing the structure of a memory cell having a magnetic tunnel junction (hereinafter, also simply referred to as "MTJ memory cell").

Referring to FIG. 39, the MTJ memory cell includes a magnetic tunnel junction MTJ having its electric resistance value varying according to the storage data level, and an access transistor ATR. The access transistor ATR is formed from a field effect transistor, and is connected in series with the magnetic tunnel junction MTJ between the bit line BL and the ground voltage VSS.

For the MTJ memory cell are provided a write word line WWL for instructing data write operation, a read word line RWL for instructing data read operation, and a bit line BL serving as a data line for transmitting an electric signal corresponding to the storage data level in the data read and write operations.

FIG. 40 is a conceptual diagram illustrating the data read operation from the MTJ memory cell.

Referring to FIG. 40, the magnetic tunnel junction MTJ has a magnetic layer FL having a fixed magnetization direction (hereinafter, also simply referred to as "fixed magnetic layer"), and a magnetic layer VL having a free magnetization direction (hereinafter, also simply referred to as "free magnetic layer"). A tunnel barrier TB of an insulator film is formed between the fixed magnetic layer FL and the free magnetic layer VL. The free magnetic layer VL has been magnetized in the direction corresponding to the storage data level, i.e., either in the same direction as that of the fixed magnetic layer FL or the direction different therefrom.

In the data read operation, the access transistor ATR is turned ON in response to activation of the read word line RWL. As a result, a sense current Is flows through a current path formed from the bit line BL, magnetic tunnel junction MTJ and ground voltage VSS. The sense current Is is supplied as a constant current from a not-shown control circuit.

The electric resistance value of the magnetic tunnel junction MTJ varies according to the relative relation of the magnetization direction between the fixed magnetic layer FL and the free magnetic layer VL. More specifically, when the fixed magnetic layer FL and the free magnetic layer VL have the same magnetization direction, the magnetic tunnel junction MTJ has a smaller electric resistance value as compared to the case where both magnetic layers have different magnetization directions.

In the data read operation, a voltage change produced at the magnetic tunnel junction MTJ by the sense current Is varies depending on the magnetization direction stored in the free magnetic layer VL. Therefore, by starting supply of the sense current Is after precharging the bit line BL to a high voltage, the storage data level in the MTJ memory cell can be read by sensing a change in voltage level on the bit line BL.

FIG. 41 is a conceptual diagram illustrating the data write operation to the MTJ memory cell.

Referring to FIG. 41, in the data write operation, the read word line RWL is inactivated, whereby the access transistor ATR is turned OFF. In this state, a data write current for generating a data write magnetic field for magnetizing the free magnetic layer VL in the direction corresponding to the storage data level is applied to the write word line WWL and the bit line BL. The magnetization direction of the free magnetic layer VL is determined by combination of the respective directions of the data write currents flowing through the write word line WWL and the bit line BL.

FIG. 42 is a conceptual diagram illustrating the relation between the direction of the data write current and the direction of the data write magnetic field in the data write operation.

Referring to FIG. 42, a magnetic field Hx of the abscissa indicates the direction of a data write magnetic field H(WWL) generated from the data write current flowing through the write word line WWL. A magnetic field Hy of the ordinate indicates the direction of a data write magnetic field H(BL) generated from the data write current flowing through the bit line BL.

The magnetization direction of the free magnetic layer VL is updated only when the sum of the data write magnetic fields H(WWL) and H(BL) reaches the region outside the asteroid characteristic line shown in the figure. In other words, the magnetization direction of the free magnetic layer VL is not updated when a data write magnetic field corresponding to the region inside the asteroid characteristic line is applied.

Accordingly, in order to write the storage data to the MTJ memory cell, a data write current must be applied to both write word line WWL and bit line BL. Once stored in the magnetic tunnel junction MTJ, the magnetization direction, i.e., the storage data level, is retained therein in a non-volatile manner until another data write operation is conducted.

A sense current Is flows through the bit line BL in the data read operation. However, the sense current Is is generally set to a value that is about one to two orders smaller than the data write current. Therefore, it is less likely that the storage data in the MTJ memory cell is erroneously rewritten by the sense current Is during the data read operation.

The aforementioned technical documents disclose the technology of forming an MRAM device, a random access memory, with such MTJ memory cells being integrated on a semiconductor substrate.

FIG. 43 is a conceptual diagram showing the MTJ memory cells arranged in a matrix in an integrated manner.

Referring to FIG. 43, with the MTJ memory cells arranged in a matrix on the semiconductor substrate, a highly integrated MRAM device can be realized. FIG. 43 shows the case where the MTJ memory cells are arranged in n rows by m columns (where n, m is a natural number). Herein, n write word lines WWL1 to WWLn, n read word lines RWL1 to RWLn, and m bit lines BL1 to BLm are arranged for the n×m MTJ memory cells.

In the data read operation, one of the read word lines RWL1 to RWLn is selectively activated, so that the memory cells on the selected memory cell row (hereinafter, also simply referred to as "selected row") are electrically coupled between the bit lines BL1 to BLm and the ground voltage VSS, respectively. As a result, the voltage on each bit line BL1 to BLm changes according to the storage data level in a corresponding memory cell.

Thus, the storage data level of the selected memory cell can be read by comparing the voltage on the bit line of the selected memory cell row (hereinafter, also simply referred to as "selected column") with a prescribed reference voltage using a sense amplifier or the like.

In such a data read operation, however, a path of the sense current Is is formed in every memory cell on the selected row. Therefore, a wasteful charging/discharging current that does not directly contribute to the data read operation is produced in the bit lines of the non-selected memory cell columns (hereinafter, also simply referred to as "non-selected columns"), thereby increasing the power consumption in the data read operation.

As described in the aforementioned technical documents, as the bias voltage applied to both ends of the magnetic tunnel junction is increased, the relative relation of the magnetization direction between the fixed magnetic layer FL and the free magnetic layer VL, i.e., a change in electric resistance value corresponding to the storage data level, is less likely to appear. Therefore, as the voltage applied to both ends of the magnetic memory cell is increased in the data read operation, the voltage on the bit line does not noticeably change according to the storage data level. This may possibly hinder the speed and stability of the data read operation.

Moreover, a dummy memory cell is generally used to produce a reference voltage to be compared with a voltage on the bit line coupled to the selected memory cell. For example, a resistive element having an electric resistance value Rd corresponding to an intermediate value of electric resistance values R1 and R0 can be used as a dummy cell for use in the data read operation to the MTJ memory cell. The electric resistance values R1 and R0 respectively correspond to the case where the data "1 (H level)" and "0 (L level)" are stored in the MTJ memory cell. The reference voltage can be produced by supplying to such a resistive element the same sense current Is as that supplied to the MTJ memory cell.

In general, the dummy memory cells are arranged in a dummy row or dummy column.

When the dummy memory cells are arranged in a dummy row, the data read operation can be conducted based on a so-called folded bit line structure by using a bit line pair of adjacent two bit lines. In this structure, the selected MTJ memory cell and the dummy memory cell can be respectively coupled to the adjacent two bit lines. Accordingly, the respective RC (resistance-capacitance) time constants between the selected MTJ memory cell and dummy memory cell and the sense amplifier have the same value, whereby a read operation margin can be ensured.

In this case, however, the sense current must be supplied also to the dummy memory cells on the non-selected memory cell columns, thereby increasing the power consumption in the data read operation.

On the contrary, when the dummy memory cells are arranged in a dummy column, the sense current need not be supplied to a plurality of dummy memory cells. However, a bit line to be coupled to the selected MTJ memory cell cannot necessarily be located near a dummy bit line of the dummy column to be coupled to the dummy memory cell. This may degrade the read operation margin or reduce the data read operation since the respective RC time constants between the selected MTJ memory cell and dummy memory cell and the sense amplifier have different values.

As described before, the data write operation to the MTJ memory cell is conducted with combination of the data write magnetic fields respectively generated from the data write currents flowing through the write word line WWL and the bit line BL. Accordingly, the data write current must be supplied so as to effectively and stably magnetize the free magnetic layer VL in the magnetic tunnel junction MTJ.

The data write magnetic field applied to the selected MTJ memory cell acts as magnetic noise on adjacent MTJ memory cells. Therefore, erroneous data write operation to a memory cell other than the selected memory cell must be prevented. In particular, reducing a data write current required to generate a prescribed magnetic field for the data write operation would implement reduced power consumption as well as stabilized operation due to suppressed magnetic noise.

SUMMARY OF THE INVENTION

It is an object of the present invention to provide a thin film magnetic memory device capable of rapidly reading the data with low power consumption.

It is another object of the present invention to provide a thin film magnetic memory device capable of efficiently and stably writing the data.

In summary, a thin film magnetic memory device of the present invention includes a plurality of memory cells, a plurality of first data lines, a plurality of source lines, a plurality of first data line selection portions, and a plurality of source line selection portions. The plurality of memory cells each have its electric resistance value varying according to a storage data level written thereto by an applied magnetic field. A plurality of first data lines are respectively provided for fixed groupings of the plurality of memory cells, for reading the storage data level in data read operation. The plurality of source lines are provided respectively corresponding to the plurality of first data lines, and each electrically coupled to a corresponding one of the plurality of first data lines through a selected one of the memory cells in a corresponding fixed grouping in the data read operation. The plurality of first data line selection portions are provided respectively corresponding to the plurality of first data lines. Each of the plurality of first data line selection portions precharges a corresponding one of the plurality of first data lines to a first voltage before the data read operation, and electrically disconnects the corresponding first data line from the first voltage in the data read operation. The plurality of source line selection portions are provided respectively corresponding to the plurality of source lines. Each of the plurality of source line selection portions includes a source line precharging portion for precharging a corresponding one of the plurality of source lines to a second voltage before the data read operation, and a source line driving portion for electrically coupling the corresponding source line to a third voltage in the data read operation.

Accordingly, a primary advantage of the present invention is the ability to change a voltage on the source lines between the precharging operation and the data read operation. This prevents an unnecessary charging/discharging current from flowing through the first data lines that do not directly relate to the data read operation, allowing for reduction in power consumption in the data read operation.

A thin film magnetic memory device according to another aspect of the present invention includes memory cell, a first signal line and a second signal line. The memory cell is provided in order to store data, and includes a magnetic storage portion having its electric resistance value varying according to a storage data level. The magnetic storage portion includes a first magnetic layer retaining a prescribed fixed magnetization direction, and a second magnetic layer retaining a magnetization direction written according to combination of a first data write magnetic field for applying a magnetic field in a hard magnetization direction and a second data write magnetic field for applying a magnetic field in an easy magnetization direction. The first signal line passes therethrough a first data write current generating the first data write magnetic field. The second signal line passes therethrough a second data write current generating the second data write magnetic field. In data write operation, supply of the first data write current is started prior to supply of the second data write current.

Thus, in the data write operation to the magnetic storage portion, the magnetic field in the easy axis direction is generated after generation of the magnetic field in the hard axis direction, thereby enabling stable data write operation in view of the magnetic characteristics of the memory cell.

A thin film magnetic memory device according to still another aspect of the present invention includes a plurality of memory cells, a plurality of write word lines, a plurality of bit lines, a plurality of source lines, and a plurality of coupling switch data write circuits. The plurality of memory cells are arranged in a matrix. Each of the plurality of memory cells includes a magnetic storage portion having its electric resistance value varying according to a storage data level written therein by combination of first and second data write magnetic fields. The plurality of write word lines are provided respectively corresponding to memory cell rows, and are selectively activated in data write operation to pass therethrough a first data write current for generating the first data write magnetic field. The plurality of bit lines are provided respectively corresponding to memory cell columns. The plurality of source lines are provided respectively corresponding to the memory cell columns. Each of the plurality of source lines interposes the memory cells on a corresponding memory cell column between itself and a corresponding one of the plurality of bit lines. The plurality of coupling switches are provided respectively corresponding to the memory cell columns, for electrically coupling one of the plurality of source lines and one of the plurality of bit lines to each other at their respective one ends in the data write operation according to a column selection result. In order to supply a second data write current for generating the second data write magnetic field in the data write operation, the data write circuit couples, according to the column selection result, one of the plurality of source lines to one of first and second voltages and one of the plurality of bit lines to the other voltage at the other ends according to the storage data level.

Thus, the magnetic fields respectively generated from the current flowing through the bit line and source line of the selected column, i.e., the magnetic fields interacting with each other in a constructive manner in the selected memory cell, are used as data write magnetic fields in the data write operation. As a result, the data write current flowing through the bit line can be reduced, allowing for reduced power consumption and reduced bit line current density in the data write operation. Such a reduced bit line current density enables improved reliability and suppressed magnetic noise to adjacent cells.

A thin film magnetic memory device according to yet another aspect of the present invention includes a plurality of memory cells, a plurality of write word lines, a plurality of source lines, a plurality of bit lines, and a word driver. The plurality of memory cells are arranged in a matrix. Each of the plurality of memory cells includes a magnetic storage portion having its electric resistance value varying according to a storage data level written by combination of first and second data write magnetic fields. The plurality of write word lines are provided respectively corresponding to memory cell rows, and are selectively activated in data write operation to pass therethrough a first data write current for generating the first data write magnetic field. The plurality of source lines are provided respectively corresponding to the memory cell rows, and coupled to a first voltage at their respective one ends. The plurality of bit lines are provided respectively corresponding to memory cell columns, and selectively receive a second data write current for generating the second data write magnetic field in the data write operation according to a column selection result. The word line driver couples the activated write word line to a second voltage at its one end in the data write operation. The second data write current flows through a current path formed from the activated write word line and at least one of the plurality of source lines which is electrically coupled to the activated write word line at the other ends.

Thus, a return path of the data write current flowing through the write word line of the selected row can be formed using a single source line. Therefore, the magnetic fields respectively generated from the current flowing through the write word line and the source line, i.e., the magnetic fields interacting with each other in a constructive manner in the selected memory cell, are used as the first data write magnetic field in the data write operation. As a result, the data write current flowing through the write word line can be reduced, allowing for reduced power consumption and reduced write word line current density in the data write operation. Such a reduced write word line current density enables improved reliability and suppressed magnetic noise to adjacent cells.

A thin film magnetic memory device according to a further aspect of the present invention includes a plurality of memory cells, a plurality of read word lines, a plurality of write word lines, a plurality of bit lines, a word line driver, coupling switches, and a data read circuit. The plurality of memory cells are arranged in a matrix. Each of the plurality of memory cells includes a magnetic storage portion having its electric resistance value varying according to a storage data level written therein by combination of first and second data write magnetic fields, and an access portion coupled in series with the magnetic storage portion, and selectively turned ON in data read operation to pass a data read current therethrough and turned OFF in data write operation. The plurality of read word lines are provided respectively corresponding to memory cell rows, for turning ON the access portion in the data read operation according to a row selection result. The plurality of write word lines are provided respectively corresponding to the memory cell rows, and are selectively activated to pass therethrough a first data write current generating the first data write magnetic field in the data write operation. The plurality of bit lines are provided respectively corresponding to memory cell columns. Each of the plurality of bit lines is electrically coupled to the plurality of write word lines through the memory cells. The word line driver couples the activated write word line to a first voltage at its one end and sets the remaining write word lines to a second voltage in order to supply a second data write current for generating the second data write magnetic field in the data write operation. The coupling switches are respectively coupled between each write word line and a plurality of write word lines of other memory cell rows. Each of the coupling switches is turned ON when one of the two write word lines coupled thereto is activated. The data read circuit supplies the data read current to one of the plurality of bit lines in the data read operation according to a column selection result, and conducts the data read operation based on a voltage change on the bit line corresponding to the column selection result. The word line driver sets each of the plurality of write word lines to a read reference voltage in the data read operation.

Thus, in the memory array structure having no source line, a return path of the data write current flowing through the write word line of the selected row can be formed using a plurality of write word lines of other rows. As a result, the magnetic fields respectively generated from the current flowing through the write word line of the selected row and a plurality of write word lines of the non-selected rows, i.e., the magnetic fields interacting with each other in a constructive manner in the selected memory cell, can be used as data write magnetic fields in the data write operation. Thus, the data write current flowing through the write word line can be reduced, allowing for reduced power consumption and reduced write word line current density in the data write operation. Such a reduced write word line current density enables improved reliability and suppressed magnetic noise to adjacent cells.

A thin film magnetic memory device according to a still further aspect of the present invention includes a plurality of memory cells, a plurality of data lines, and a plurality of reference voltage generating portions. The plurality of memory cells are arranged in a matrix. Each of the plurality of memory cells includes a magnetic storage portion having its electric resistance value varying according to a storage data level written therein, and an access portion selectively turned ON in data read operation to pass a data read current therethrough. The plurality of data lines are provided respectively corresponding to memory cell columns, for selectively receiving the data read current in the data read operation. The plurality of reference voltage generating portions are provided respectively corresponding to the memory cell columns. Each of the plurality of reference voltage generating portions is selectively activated in the data read operation according to a column selection result to produce a reference voltage to be compared with a voltage on a corresponding one of the plurality of data lines. Each of the plurality of memory cells is coupled between a corresponding one of the plurality of data lines and a prescribed voltage.

Thus, the data read operation can be conducted while retaining the reference voltage generating portions of the non-selected columns inactive. As a result, the data read operation can be conducted with a large signal margin while suppressing the power consumption in the reference voltage generating portions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
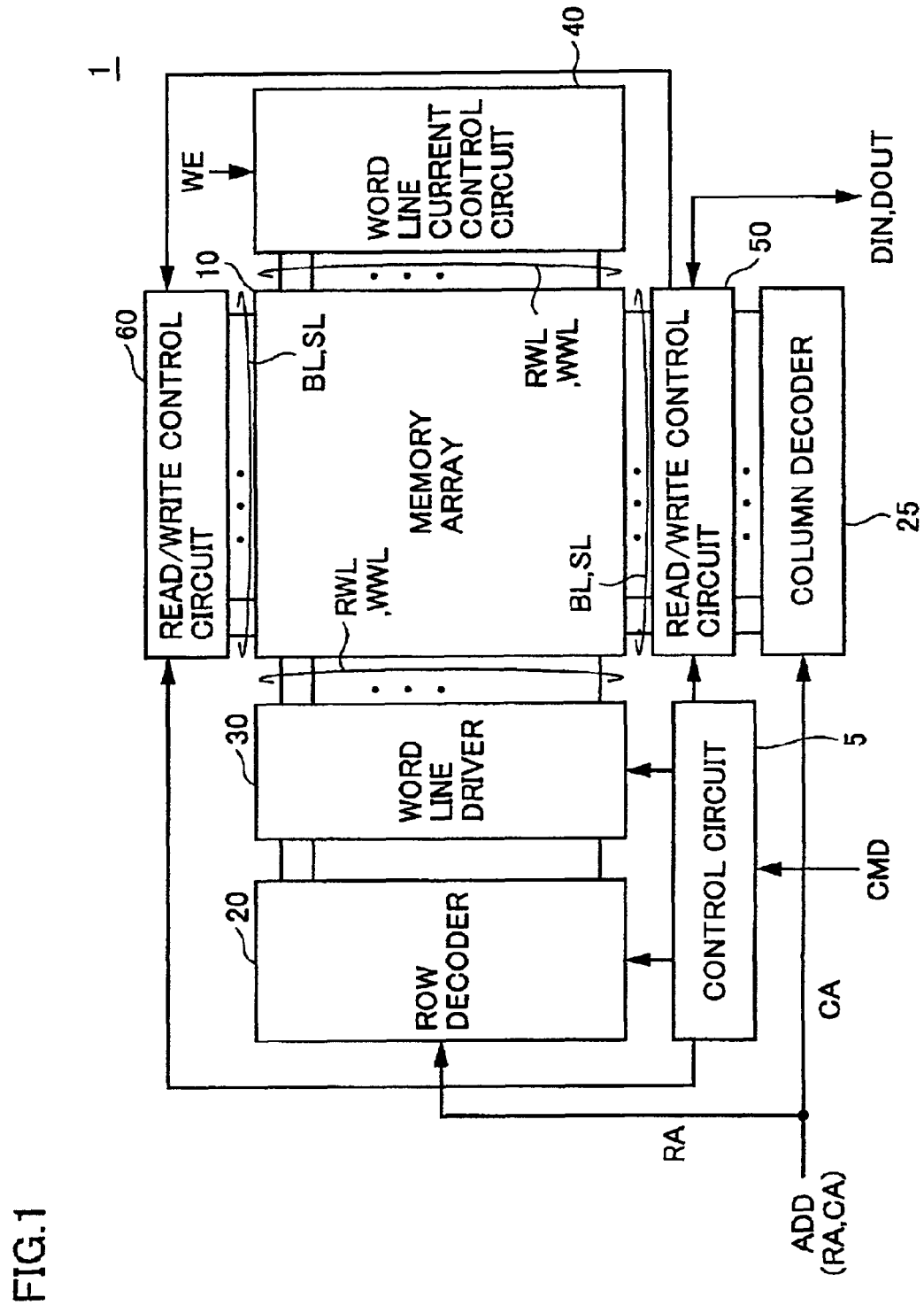
FIG. 1 is a schematic block diagram showing the overall structure of an MRAM device 1 according to an embodiment of the present invention.

Hereinafter, embodiments of the present invention will be described in detail with reference to the accompanying drawings. Note that the same reference numerals and characters denote the same or corresponding portions in the following description.

First Embodiment

Referring to FIG. 1, an MRAM device 1 according to a first embodiment of the present invention conducts random access in response to an external control signal CMD and address signal ADD, thereby receiving write data DIN and outputting read data DOUT.

The MRAM device 1 includes a control circuit 5 for controlling the overall operation of the MRAM device 1 in response to the control signal CMD, and a memory array 10 having a plurality of MTJ memory cells arranged in a matrix. Although the structure of the memory array 10 will be specifically described below, a plurality of write word lines WWW and a plurality of read word lines RWL are provided respectively corresponding to the MTJ memory cell rows. Bit lines BL and source lines SL are provided respectively corresponding to the MTJ memory cell columns.

The MRAM device 1 further includes a row decoder 20, a column decoder 25, a word line driver 30, a word line current control circuit 40 and read/write control circuits 50, 60.

The row decoder 20 conducts row selection in the memory array 10 according to a row address RA indicated by the address signal ADD. The column decoder 25 conducts column selection in the memory array 10 according to a column address CA indicated by the address signal ADD. The word line driver 30 selectively activates a read word line RWL or a write word line WWL according to the row selection result of the row decoder 20. The row address RA and the column address CA indicate a memory cell selected for the data read or write operation.

The word line current control circuit 40 applies a data write current to the write word line WWL in the data write operation. For example, the word line current control circuit 40 couples each write word line WWL to the ground voltage VSS, so that the data write current can be applied to the write word line WWL selectively coupled to the power supply voltage VDD by the word line driver 30. The read/write control circuit 50, 60 correctively refers to the circuitry provided in a region adjacent to the memory array 10, for applying a data write current and a sense current (data read current) to a bit line in the data read and write operations, respectively.

Figure 2:
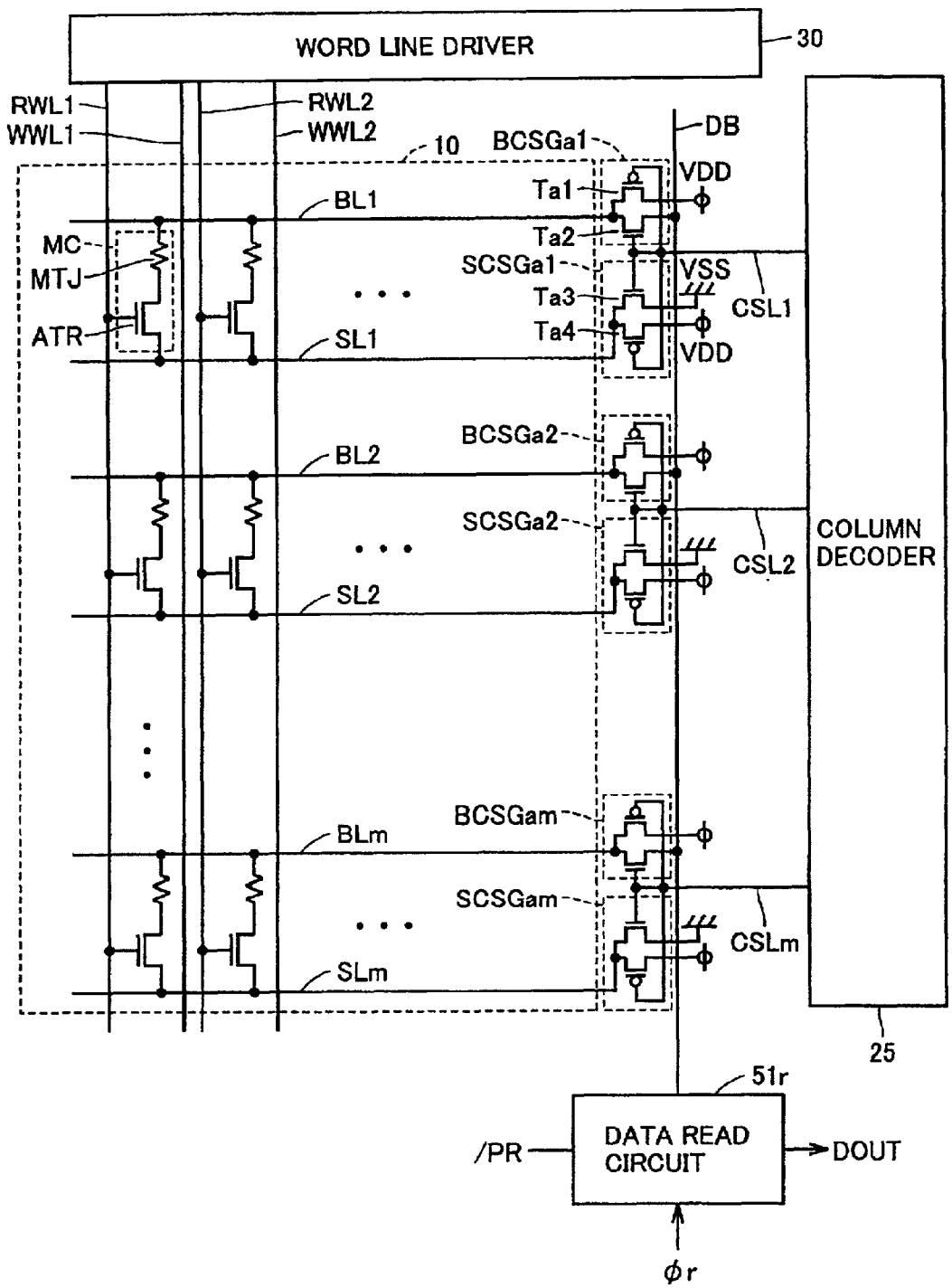
FIG. 2 is a conceptual diagram showing the structure of a memory array 10 and its peripheral circuitry according to a first embodiment.

FIG. 2 is a conceptual diagram showing the structure of the memory array 10 and its peripheral circuitry according to the first embodiment. FIG. 2 primarily shows the structure associated with the data read operation.

Figure 39:
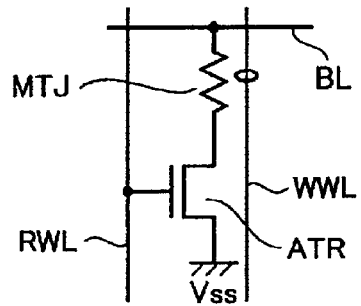
FIG. 39 is a schematic diagram showing the structure of an MTJ memory cell.
Figure 40:
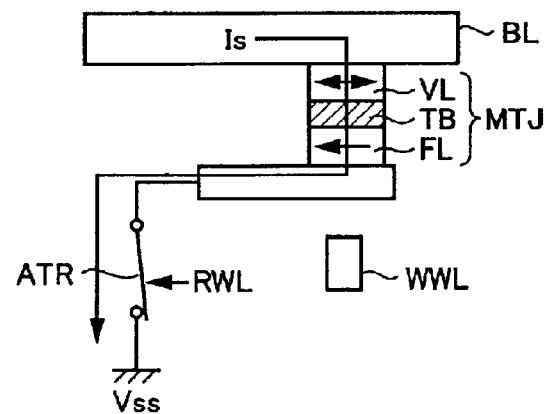
FIG. 40 is a conceptual diagram illustrating the data read operation from the MTJ memory cell.
Figure 41:
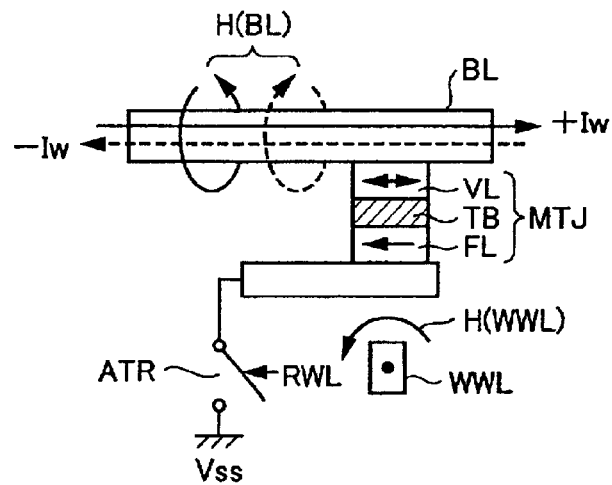
FIG. 41 is a conceptual diagram illustrating the data write operation to the MTJ memory cell.
Figure 42:
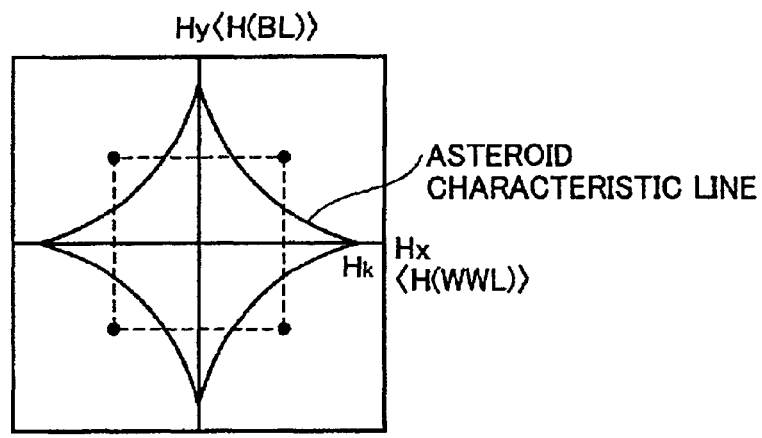
FIG. 42 is a conceptual diagram illustrating the relation between the direction of a data write current and the direction of a data write magnetic field in the data write operation.
Figure 43:
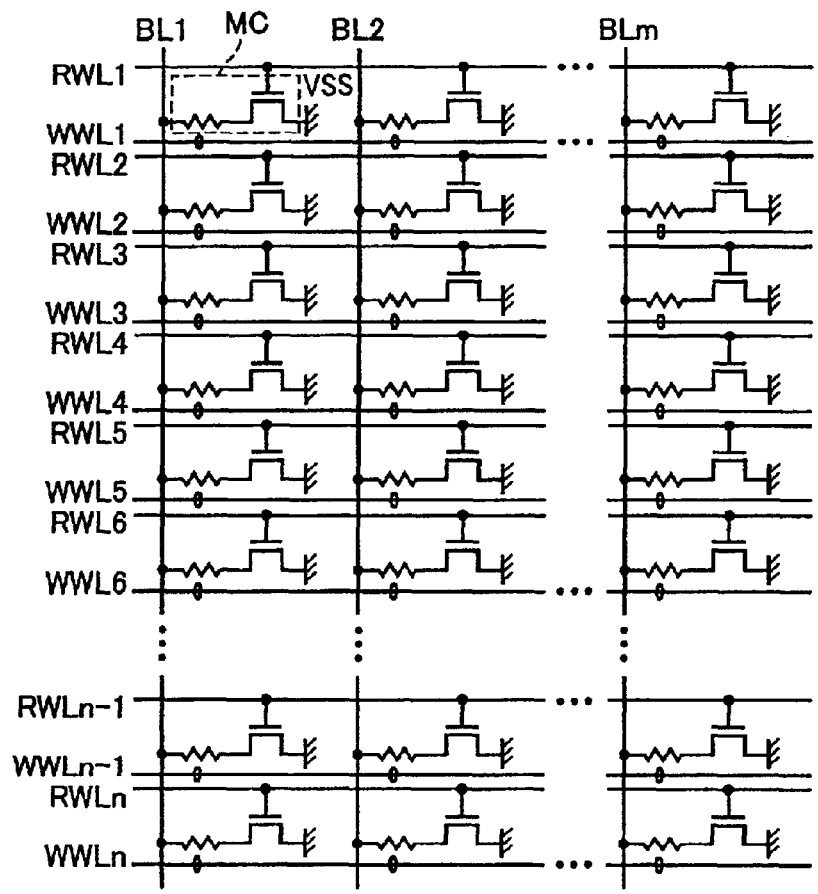
FIG. 43 is a conceptual diagram showing the MTJ memory cells arranged in a matrix in an integrated manner.

Referring to FIG. 2, the memory array 10 includes the MTJ memory cells MC (hereinafter, also simply referred to as "memory cells MC") arranged in n rows by m columns. Each memory cell MC has the same structure as that of FIG. 39. Read word lines RWL1 to RWLn and write word lines WWL1 to WWLn are provided respectively corresponding to the MTJ memory cell rows (hereinafter, also simply referred to as "memory cell rows"). Bit lines BL1 to BLm and source lines SL1 to SLm are provided respectively corresponding to the MTJ memory cell columns (hereinafter, also simply referred to as "memory cell columns").

FIG. 2 exemplarily shows the write word lines WWL1, WWL2, read word lines RWL1, RWL2, bit lines BL1, BL2, BLm, source lines SL1, SL2, SLm and some memory cells corresponding to the first and second rows and the first, second and $m^{th}$ columns.

Hereinafter, the write word lines, read word lines, bit lines and source lines are also generally denoted with WWL, RWL, BL and SL, respectively. A specific write word line, read word line, bit line and source line are denoted with, e.g., RWL1, WWL1, BL1 and SL1, respectively. The high voltage state (power supply voltage VDD) and low voltage state (ground voltage VSS) of a signal or a signal line are also referred to as H level and L level, respectively.

In the data read operation, the word line driver 30 activates one of the read word lines RWL1 to RWLn to H level according to the decode result of the row address RA, i.e., the row selection result. In response to this, the respective access transistors ATR of the memory cells on the selected memory cell row are turned ON, whereby the respective magnetic tunnel junctions MTJ are electrically coupled between the corresponding bit lines BL and source lines SL.

A data bus DB is provided in a region adjacent to the memory array 10 so as to extend in the same direction as that of the read word line RWL and write word line WWL. Column selection lines CSL1 to CSLm for conducting column selection are provided respectively corresponding to the memory cell columns. In the data read operation, the column decoder 25 activates one of the column selection lines CSL1 to CSLm to H level according to the decode result of the column address CA, i.e., the column selection result.

Bit line selection gates BCSGa1 to BCSGam are provided respectively corresponding to the bit lines BL1 to BLm. The bit line selection gate BCSGa1 includes a bit line precharging transistor Ta1 electrically coupled between the power supply voltage VDD and the bit line BL1, and a bit line driving transistor Ta2 electrically coupled between the data bus DB and the bit line BL1.

The bit line precharging transistor Ta1 is a P-type MOS (metal oxide semiconductor) transistor, and the bit line driving transistor Ta2 is an N-type MOS transistor, a MOS transistor of the opposite conductivity type to that of the bit line precharging transistor Ta1. The bit line precharging transistor Ta1 and the bit line driving transistor Ta2 have their respective gates coupled to the column selection line CSL1.

Since the bit line selection gates BCSGa2 to BCSGam corresponding to the other memory cell columns have the same structure, detailed description thereof will not be repeated.

Source line selection gates SCSGa1 to SCSGam are provided respectively corresponding to the source lines SL1 to SLm. The source line selection gate SCSGa1 includes a source line driving transistor Ta3 electrically coupled between the ground voltage VSS and the source line SL1, and a source line precharging transistor Ta4 electrically coupled between the power supply voltage VDD and the source line SL1.

The source line driving transistor Ta3 is an N-type MOS transistor, and the source line precharging transistor Ta4 is a P-type MOS transistor, a MOS transistor of the opposite conductivity type to that of the source line driving transistor Ta3. The source line driving transistor Ta3 and the source line precharging transistor Ta4 have their respective gates coupled to the column selection line CSL1.

Since the source line selection gates SCSGa2 to SCSGam corresponding to the other memory cell columns have the same structure, detailed description thereof will not be repeated.

Hereinafter, the column selection lines CSL1 to CSLm, bit line selection gates BCSGa1 to BCSGam and source line selection gates SCSGa1 to SCSGam are also generally referred to as column selection line CSL, bit line selection gate BCSGa, and source line selection gate SCSGa, respectively.

A data read circuit 51r outputs read data DOUT according to a voltage on the data bus DB.

Figure 3:
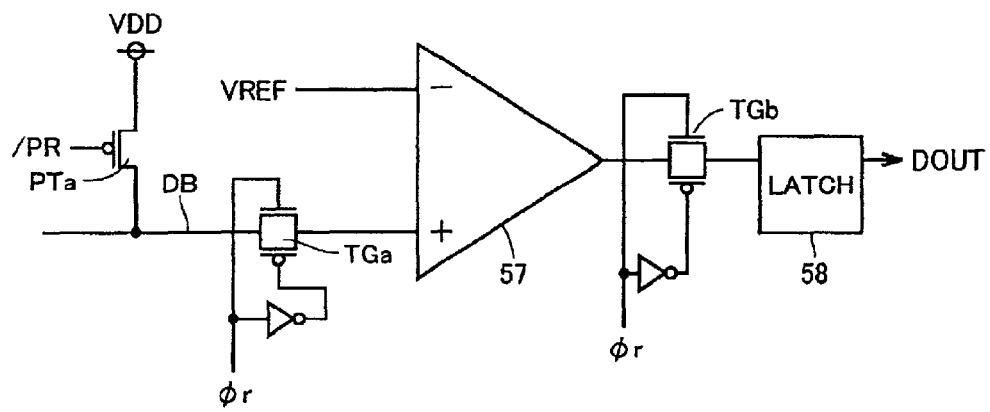
FIG. 3 is a circuit diagram showing the structure of a data read circuit of FIG. 2.

Referring to FIG. 3, the data read circuit 51r includes a differential amplifier 57, transfer gates TGa, TGb, a latch circuit 58, and a precharging transistor PTa.

The differential amplifier 57 amplifies the voltage difference between two input nodes to produce read data Dout.

The transfer gate TGa operates in response to a trigger pulse φr. In response to an active period of the trigger pulse φr, the transfer gate TGa electrically couples the data bus DB to one input node of the differential amplifier 57. A prescribed reference voltage VREF is applied to the other input node of the differential amplifier 57.

Like the transfer gate TGa, the transfer gate TGb operates in response to a trigger pulse φr. In response to an active period of the trigger pulse φr, the transfer gate TGb transmits the output of the differential amplifier 57 to the latch circuit 58. The latch circuit 58 outputs the latched output voltage of the differential amplifier 57 as read data DOUT.

Accordingly, in the active period of the trigger pulse φr, the data read circuit 51r amplifies the difference between the voltage on the data bus DB and the reference voltage VREF to set the level of the read data DOUT. In the inactive period of the trigger pulse φr, the level of the read data DOUT is retained in the latch circuit 58.

The precharging transistor PTa is electrically coupled between the power supply voltage VDD and the data bus DB, and is turned ON/OFF according to a control signal /PR. The control signal /PR is rendered active (L level) in the precharging period of the data bus DB. In the active period of the MRAM device 1, the control signal /PR is activated to L level at least in a prescribed period before data read operation. During data read operation in the active period of the MRAM device 1, the control signal/PR is inactivated to H level.

As a result, in the precharging period during which the control signal /PR is activated to L level, the data bus DB is precharged to the power supply voltage VDD like the bit lines BL. In the data read operation, the control signal/PR is inactivated to H level, so that the data bus DB is disconnected from the power supply voltage VDD.

Figure 4:
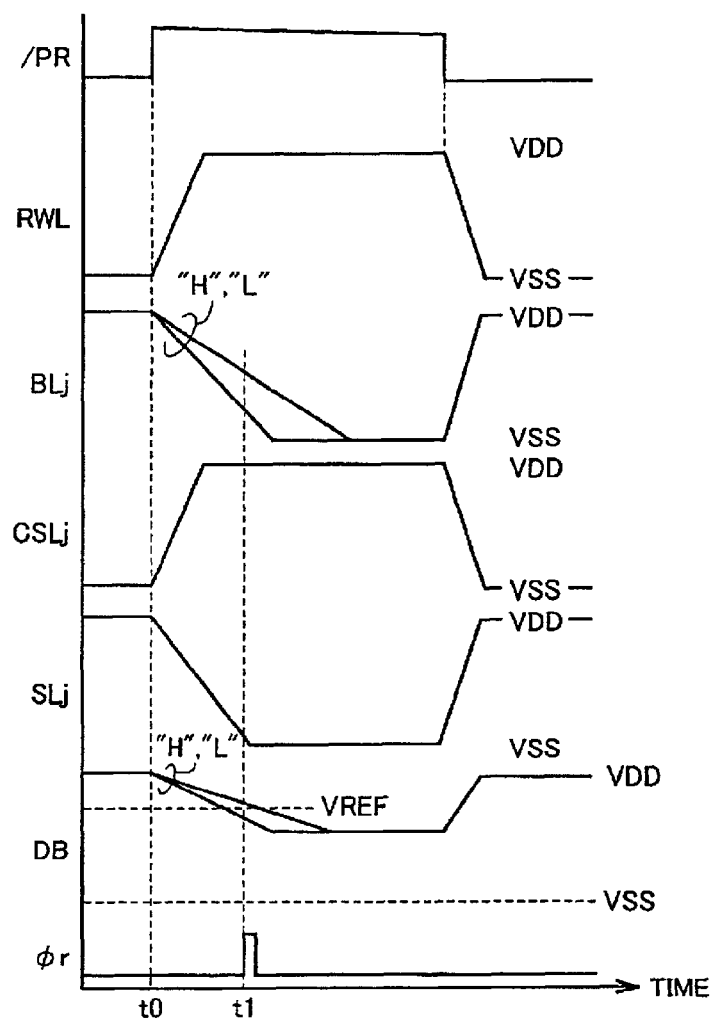
FIG. 4 is a timing chart illustrating the data read operation according to the first embodiment.

FIG. 4 shows the data read operation of the case where the $j^{th}$ memory cell column is selected for the data read operation (where j is a natural number of 1 to m).

Referring to FIG. 4, before time t0 when the data read operation is started, every read word line RWL and column selection line CSL are inactivated (L level).

In response to this, the bit line precharging transistor Ta1 in each bit line selection gate BCSGa as well as the source line precharging transistor Ta4 in each source line selection gate SCSGa are turned ON. Therefore, each bit line BL and each source line SL are precharged to the power supply voltage VDD.

The data bus DB is precharged to the power supply voltage VDD in response to the control signal/PR that is rendered active before data read operation.

At time t0, the data read operation is started, and the control signal /PR is inactivated to H level. In response to this, the precharging transistor PTa is turned OFF, whereby the data bus DB is disconnected from the power supply voltage VDD in the data read operation.

The word line driver 30 activates the read word line of the selected row to H level. As a result, the memory cells on the selected row are electrically coupled between each bit line BL and each source line SL. The remaining read word lines of the non-selected rows are retained at L level.

The column selection line CLSj of the selected column is selectively activated to H level. In response to this, in the bit line selection gate BCSGaj and the source line selection gate SCSGaj of the selected column, the bit line driving transistor Ta2 and the source line driving transistor Ta3 are turned ON, as well as the bit line precharging transistor Ta1 and the source line precharging transistor Ta4 are turned OFF.

As a result, the bit line selection gate BCSGaj disconnects the bit line BLj of the selected column from the precharge voltage, i.e., the power supply voltage VDD, and couples the bit line BLj to the data bus DB. The source line selection gate SCSGaj electrically couples the source line SLj of the selected column to the ground voltage VSS. In other words, only the source line SLj of the selected column is selectively driven to the ground voltage VSS.

Accordingly, a current path is formed from the data bus DB (precharged to the power supply voltage VDD), bit line driving transistor Ta2, bit line BLj, selected memory cell, and source line SLj (driven to the ground voltage VSS), whereby the voltage on the data bus DB falls at a rate corresponding to the electric resistance value of the selected memory cell.

In other words, the rate at which the voltage on the data bus DB changes from the precharge voltage varies depending on the storage data level in the selected memory cell. Therefore, the storage data level of the selected memory cell can be read by sensing the voltage on the data bus DB at fixed timing in the data read operation.

Although not shown in the figure, the remaining column selection lines of the non-selected columns are retained at L level. Therefore, the bit lines BL and the source lines SL of the non-selected columns are retained at the precharge voltage.

Accordingly, a current corresponding to the difference in precharge voltage between the bit line BL and the source line SL flows through the bit lines BL and the source lines SL of the non-selected columns. By precharging the source lines SL and the bit lines BL to the same precharge voltage, an unnecessary charging/discharging current can be prevented from flowing through the bit lines BL of the non-selected columns.

At time t1, i.e., after a prescribed time has passed from starting of the data read operation, the trigger pulse φr is activated (H level) in a one-shot form. In response to this, the data read circuit 51r senses the voltage on the data bus DB, and amplifies the difference between the sensed voltage and the prescribed reference voltage VREF to produce read data DOUT. The reference voltage VREF is set to an intermediate value of the voltages on the data bus DB at time t1, which respectively correspond to the case where the storage data is at H level and L level.

Thus, the voltage on the source line SL is not fixed to the ground voltage VSS to which the source line SL is to be driven in the data read operation, but is precharged like the bit line BL before the data read operation. Accordingly, only the bit line BLj of the selected column directly required for the data read operation consumes a charging/discharging current, allowing for the data read operation with reduced power consumption.

Moreover, the voltage on the source line SLj of the selected column can be adjusted to change at a reduced rate at the start of the data read operation, so that a bias voltage applied to both ends of the magnetic tunnel junction MTJ in the selected memory cell is suppressed. The change rate of the voltage on the source line SLj can be adjusted with the amount of current passing therethrough, which depends on the size of the source line driving transistor Ta3. At least the source line driving transistor Ta3 is designed to have a smaller size than that of the source line precharging transistor Ta4 through which a precharging current passes.

As a result, a change in electric resistance value according to the storage data level is more likely to appear in each memory cell. Accordingly, at the timing of sensing the voltage on the data bus DB (time t1), the data bus DB has an increased voltage difference resulting from the difference in storage data level, whereby a data read margin can be ensured.

After the data read operation, every read word line RWL and column selection line CSL is inactivated (L level) as before time t1. The control signal /PR is activated again, so that each of the bit lines BL, source lines SL and data bus DB is precharged to the power supply voltage VDD.

Note that, in the first embodiment, the bit lines BL, source lines SL and data bus DB are precharged to the power supply voltage VDD. However, a different voltage level such as VDD/2 may alternatively be used as the precharge voltage.

First Modification of First Embodiment

Figure 5:
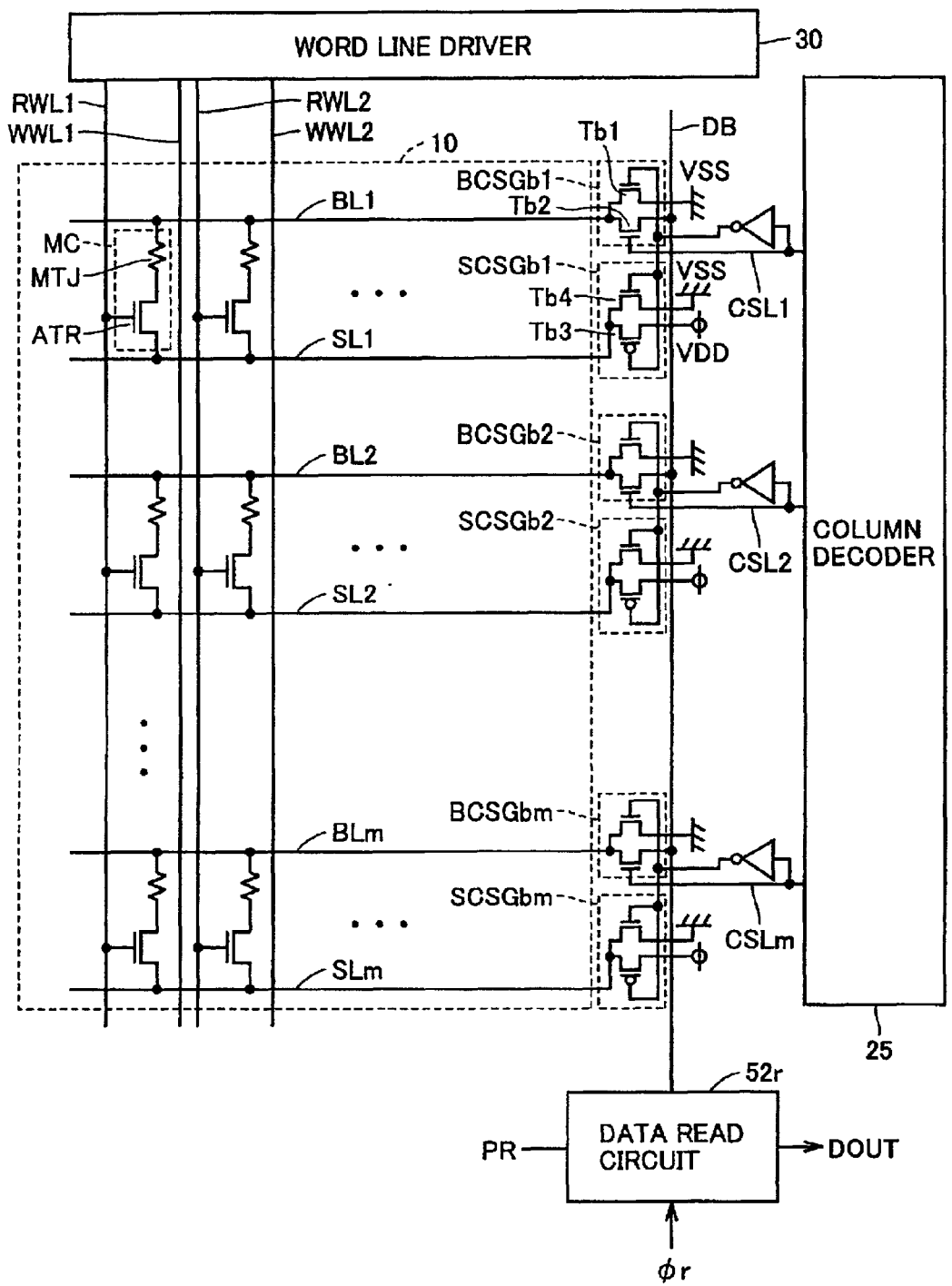
FIG. 5 is a conceptual diagram showing the structure of a memory array 10 and its peripheral circuitry according to a first modification of the first embodiment.

Referring to FIG. 5, the structure of the first modification of the first embodiment is different from that of the first embodiment shown in FIG. 2 in that the bit line selection gates BCSGa1 to BCSGam and the source line selection gates SCSGa1 to SCSGam are respectively replaced with bit line selection gates BCSGb1 to BCSGbm and source line selection gates SCSGb1 to SCSGbm, and in that the data read circuit 51r is replaced with a data read circuit 52r. Since the structure is otherwise the same as that of the first embodiment, detailed description thereof will not be repeated.

In the first modification of the first embodiment, the bit lines BL and the source lines SL are precharged to the ground voltage VSS, and the source line SL is driven to the power supply voltage VDD in the data read operation. In other words, the precharge voltage and the driving voltage in the data read operation are reversed in polarity from those of the first embodiment.

The bit line selection gate BCSGb1 includes a bit line precharging transistor Tb1 electrically coupled between the ground voltage VSS and the bit line BL1, and a bit line driving transistor Tb2 electrically coupled between the data bus DB and the bit line BL1. Each of the bit line precharging transistor Tb1 and the bit line driving transistor Tb2 is an N-type MOS transistor. The bit line precharging transistor Tb1 receives an inverted voltage of the column selection line CSL1 at its gate. The bit line driving transistor Tb2 has its gate coupled to the column selection line CSL1.

Since the bit line selection gates BCSG2b to BCSGbm of the other memory cell columns have the same structure, detailed description thereof will not be repeated.

The source line selection gate SCSGb1 includes a source line driving transistor Tb3 electrically coupled between the power supply voltage VDD and the source line SL1, and a source line precharging transistor Tb4 electrically coupled between the ground voltage VSS and the source line SL1.

The source line driving transistor Tb3 is a P-type MOS transistor, and the source line precharging transistor Tb4 is an N-type MOS transistor. The source line driving transistor Tb3 and the source line precharging transistor Tb4 receive an inverted voltage of the column selection line CSL1 at their respective gates.

Since the source line selection gates SCSGa2 to SCSGam of the other memory cell columns have the same structure, detailed description thereof will not be repeated.

Note that, hereinafter, the bit line selection gates BCSGb1 to BCSGbm and the source line selection gates SCSGb1 to SCSGbm are also generally referred to as bit line selection gates BCSGb and source line selection gate SCSGb, respectively.

Each bit line selection gate BCSGb electrically couples a corresponding bit line BL to the ground voltage VSS, i.e., the precharge voltage, when a corresponding column selection line CSL is inactive (L level), but electrically couples the corresponding bit line BL to the data bus DB when the corresponding column selection line CSL is active (H level).

Each source line selection gate SCSGb electrically couples a corresponding source line SL to the ground voltage VSS, i.e., the precharge voltage, when a corresponding column selection line CSL is inactive (L level), but drives the corresponding source line SL to the power supply voltage VDD when the corresponding column selection line CSL is active (H level).

Figure 6:
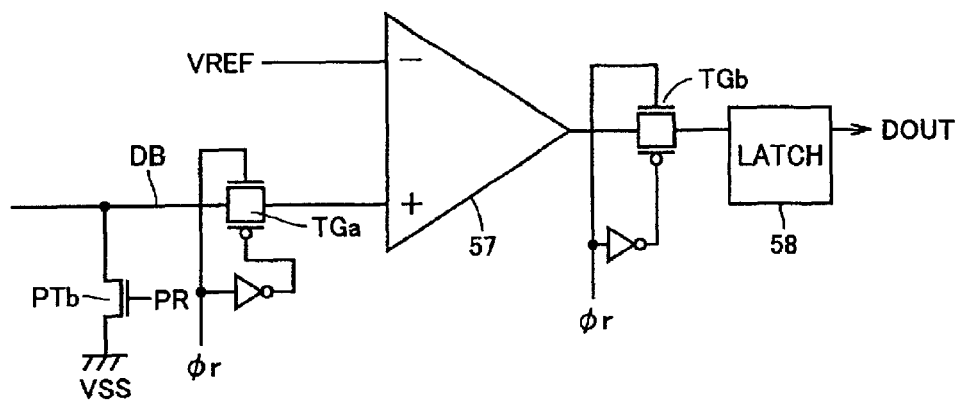
FIG. 6 is a circuit diagram showing the structure of a data read circuit of FIG. 5.

Referring to FIG. 6, the data read circuit 52r is different from the data read circuit 51r in that the precharging transistor PTa is replaced with a precharging transistor PTb. Since the structure is otherwise the same as that of the data read circuit 51r, detailed description thereof will not be repeated.

The precharging transistor PTb is electrically coupled between the ground voltage VSS and the data bus DB, and is turned ON/OFF according to a control signal PR. The control signal PR is rendered active (H level) in the precharge period of the data bus DB. The control signals PR and /PR have different signal levels in the active state, but are activated in the same period.

As a result, in the precharge period during which the control signal PR is activated to H level, the data bus DB is precharged to the ground voltage VSS like the bit lines BL. In the data read operation, however, the control signal PR is inactivated to L level, so that the data bus DB is disconnected from the ground voltage VSS.

Hereinafter, the data read operation of the first modification of the first embodiment will be described with reference to FIG. 7.

Figure 7:
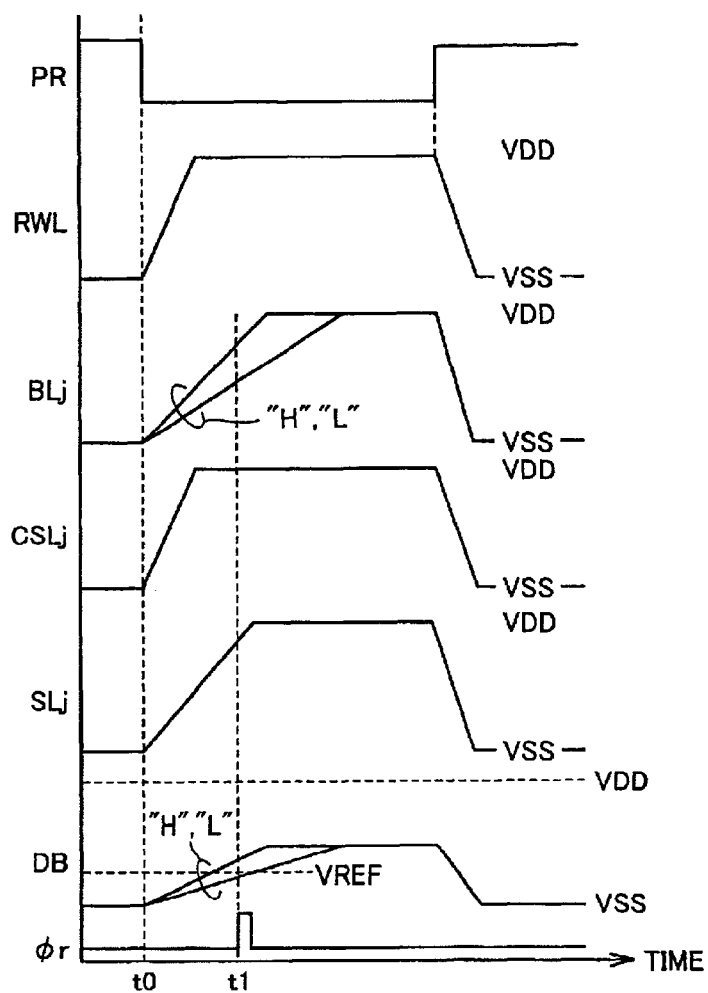
FIG. 7 is a timing chart illustrating the data read operation according to the first modification of the first embodiment.

Referring to FIG. 7, before time t0, each bit line BL and each source line SL are precharged to the ground voltage VSS. The data bus DB is also precharged to the ground voltage VSS.

At time t0, the data read operation is started, and the read word line RWL of the selected row is activated, whereby the memory cells on the selected row are electrically coupled between each bit line BL and each source line SL.

In the data read operation, the precharging transistor PTb is turned OFF, so that the data bus DB is disconnected from the ground voltage VSS.

The column selection line CSLj of the selected column is selectively activated to H level. In response to this, the bit line BLj and the source line SLj of the selected column are electrically coupled to the data bus DB and the power supply voltage VDD, respectively. In other words, only the source line SLj of the selected column is selectively driven to the power supply voltage VDD.

As in the first embodiment, the change rate of the voltage on the source line SLj of the selected column can be adjusted with the size of the source line driving transistor Tb3. Thus, a bias voltage applied to both ends of the magnetic tunnel junction MTJ in the selected memory cell is suppressed, whereby a signal margin of the data read operation can be ensured. The source line driving transistor Tb3 and the source line precharging transistor Tb4 are designed to have the same size as that of the source line driving transistor Ta3 and the source line precharging transistor Ta4, respectively.

In response to activation of the column selection line CSLj, a current path is formed from the data bus DB (precharged to the ground voltage VSS), bit line driving transistor Tb2, bit line BLj, selected memory cell, and source line SLj (driven to the power supply voltage VDD), whereby the voltage on the data bus DB rises at a rate corresponding to the electric resistance value of the selected memory cell.

Accordingly, as in the first embodiment, the trigger pulse φr is activated (H level) in a one-shot form at prescribed time t1, so that the data read circuit 52r senses the voltage on the data bus DB and amplifies the difference between the sensed voltage and the reference voltage VREF to produce read data DOUT.

The bit lines BL and the source lines SL of the non-selected columns are retained at the precharge voltage. This can prevent an unnecessary charging/discharging current from flowing through the bit lines BL of the non-selected columns, thereby allowing for reduction in power consumption as in the first embodiment.

In the first modification of the first embodiment, the precharge voltage is set to the ground voltage VSS. Accordingly, the amount of charging current consumed to precharge the bit lines BL and the source lines SL can further be reduced. As a result, further reduction in power consumption can be realized as compared to the first embodiment.

Second Modification of First Embodiment

Figure 8:
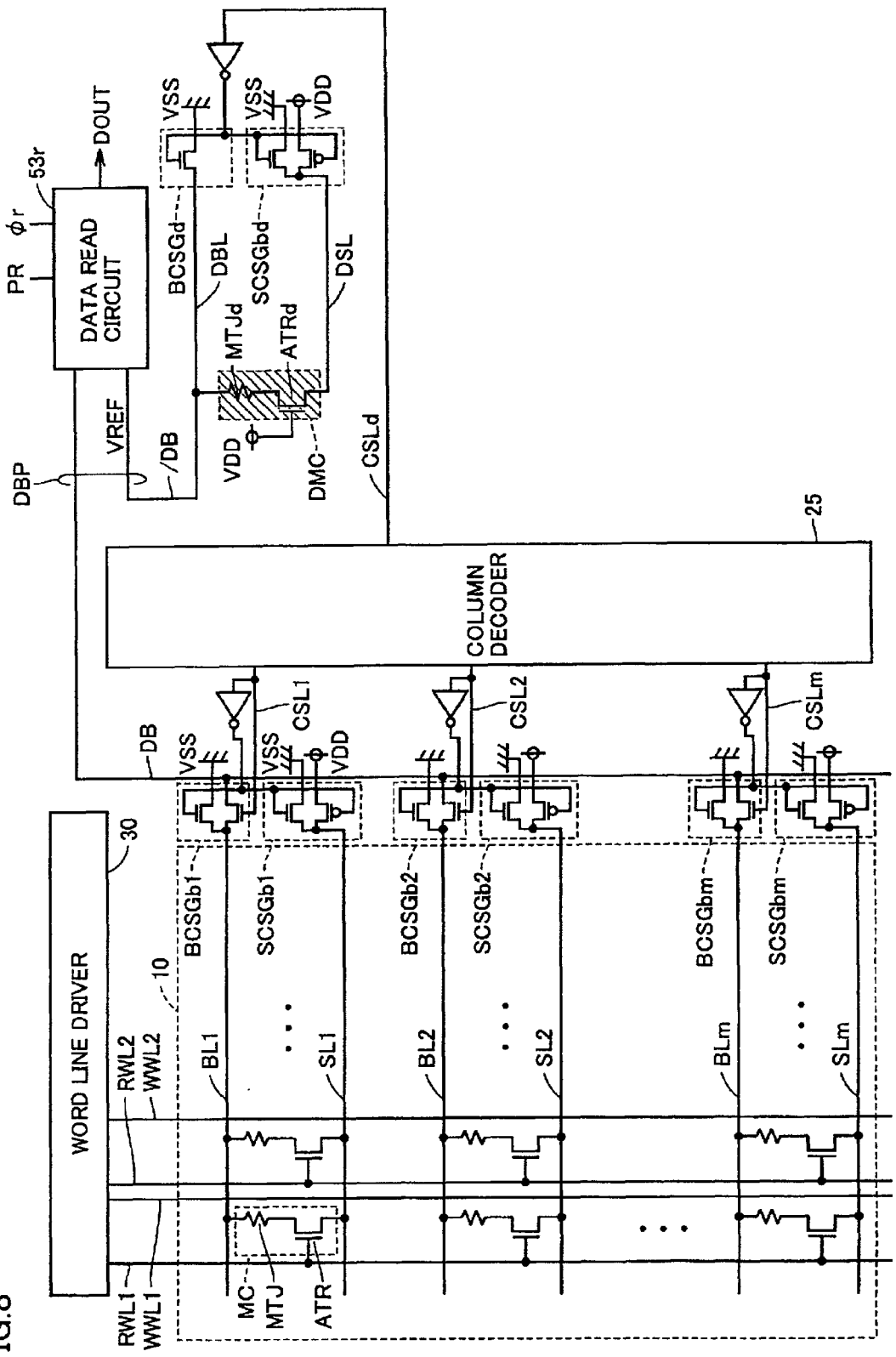
FIG. 8 is a conceptual diagram showing the structure of a memory array 10 and its peripheral circuitry according to a second modification of the first embodiment.

Referring to FIG. 8, in the structure of the second modification of the first embodiment, a dummy memory cell DMC for producing a reference voltage VREF, as well as a dummy bit line DBL, a dummy source line DSL, a dummy bit line selection gate BCSGd and a dummy source line selection gate SCSGbd corresponding to the dummy memory cell DMC are added to the structure of the first modification of the first embodiment shown in FIG. 5.

In addition, a data bus /DB for transmitting the reference voltage VREF is provided so as to form a data bus pair DBP with the data bus DB. The data read circuit 52r is replaced with a data read circuit 53r. Since the structure is otherwise the same as that of the first embodiment, detailed description thereof will not be repeated.

The dummy memory cell DMC includes a dummy resistance MTJd and a dummy access transistor ATRd that are connected in series between the dummy bit line DBL and the dummy source line DSL. The dummy resistance MTJd has an electric resistance value Rd corresponding to an intermediate value of electric resistance values R1 and R2 of the memory cell MC. The memory cell MC has the electric resistance value R1 when H level data is stored therein, and has the electric resistance value R2 when L level data is stored therein. Since the power supply voltage VDD is applied to the gate of the dummy access transistor ATRd, the dummy resistance MTJd is electrically coupled between the dummy bit line DBL and the dummy source line DSL.

In the data read operation, a dummy selection line CSLd is always rendered active (H level) regardless of the column selection result.

The dummy bit line selection gate BCSGd includes a transistor switch electrically coupled between the ground voltage VSS and the dummy bit line DBL and turned ON/OFF in response to an inverted voltage of the dummy selection line CSLd. Accordingly, the dummy bit line selection gate BCSGd precharges the dummy bit line DBL to the ground voltage VSS before data read operation in which the dummy selection line CSLd is rendered inactive (L level), and disconnects the dummy bit line DBL from the ground voltage VSS in the data read operation in which the dummy selection line CSLd is rendered active (H level). The dummy bit line DBL is electrically coupled to the data bus /DB.

The dummy source line selection gate SCSGbd having the same structure as that of the source line selection gate SCSGb precharges the dummy source line DSL to the ground voltage VSS before data read operation, and drives the dummy source line DSL to the power supply voltage VDD in the data read operation. In other words, the voltage on the dummy source line DSL is set in the same manner as that of the source line SL of the selected column.

With such a structure, the dummy bit line DBL and the data bus /DB are coupled to the dummy memory cell DMC as well as the data bus DB is coupled to the selected memory cell in the data read operation.

Figure 9:
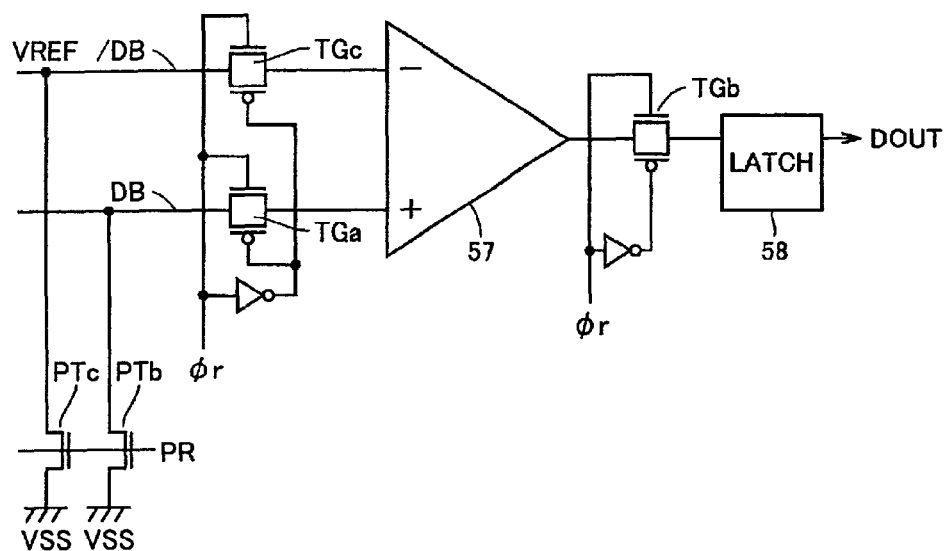
FIG. 9 is a circuit diagram showing the structure of a data read circuit of FIG. 8.

Referring to FIG. 9, the data read circuit 53r is different from the data read circuit 52r in that the data read circuit 53r further includes a precharging transistor PTc and a transfer gate TGc both corresponding to the data bus /DB. Since the structure is otherwise the same as that of the data read operation 51r, detailed description thereof will not be repeated.

The precharging transistor PTc is electrically coupled between the ground voltage VSS and the data bus /DB, and is turned ON/OFF in response to the control signal PR like the precharging transistor PTb. Accordingly, the data buses DB and /DB are precharged to the ground voltage VSS before data read operation. In the data read operation, the data buses DB and /DB are disconnected from the ground voltage VSS.

The transfer gate TGc is connected between the data bus /DB and one input node of the differential amplifier 57, and operates in response to a trigger pulse φr like the transfer gate TGa. Accordingly, in the active period of the trigger pulse φr, the transfer gates TGa and TGc electrically couple the data buses DB and /DB to the input nodes of the differential amplifier 57, respectively.

The differential amplifier 57 produces read data DOUT according to the voltage difference between the data buses DB and /DB.

Hereinafter, the data read operation of the second modification of the first embodiment will be described with reference to FIG. 10.

Figure 10:
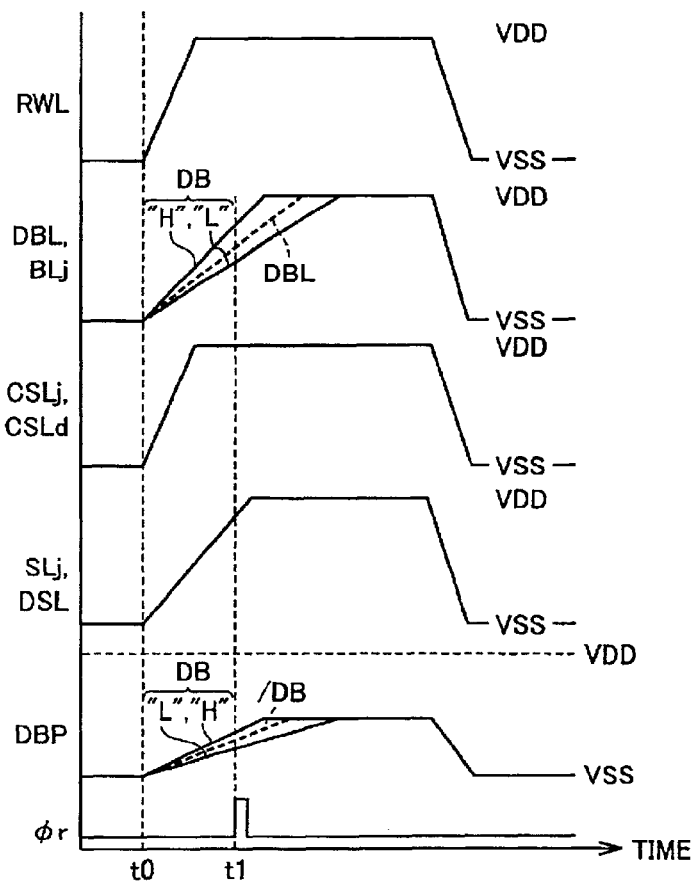
FIG. 10 is a timing chart illustrating the data read operation according to the second modification of the first embodiment.

Referring to FIG. 10, the respective voltages on the dummy selection line CSLd and the dummy source line DSL are set in the same manner as those on the column selection line CSLj and the source line SLj of the selected column.

In addition to the timing chart of FIG. 4, FIG. 10 shows the voltage waveforms of the dummy bit line DBL and the data bus /DB.

The dummy bit line DBL and the data bus /DB are electrically coupled through the dummy memory cell DMC to the dummy source line DSL that is driven to the power supply voltage VDD. The voltage on the dummy bit line DBL and the data bus /DB changes at a rate corresponding to the intermediate electric resistance value Rd of the dummy resistance MTJd. In other words, the voltage on the data bus /DB changes at an intermediate rate of the respective voltage change rates on the data bus /DB when the storage data is at H level and at L level.

Accordingly, as in the first modification of the first embodiment, a trigger pulse φr is activated (H level) in a one-shot form at prescribed time t1, so that the data read circuit 53r senses and amplifies the voltage difference between the data buses DB and /DB to produce read data DOUT.

Note that, in order to accurately produce the reference voltage VREF using the dummy memory cell DMC, the data buses DB, /DB, bit lines BL and dummy bit line DBL must be designed so that first and current paths formed between the data read circuit 53r and the ground voltage VSS, i.e., first and second paths respectively including the selected memory cell and the dummy memory cell DMC, have the same electric resistance value. For example, the resistance value per unit length of these wirings may be designed in view of the aforementioned conditions.

The reference voltage VREF for comparison is thus produced using the dummy memory cell. Therefore, the data read operation can be accurately conducted within a margin of the voltage sensing timing of the data read circuit 53r, i.e., the activation timing of the trigger pulse φr. In other words, a read operation margin can be ensured even if the voltage sensing timing of the data read circuit 53r varies.

Third Modification of First Embodiment

The arrangement of dummy memory cells in the open bit line structure is shown in the third modification of the third embodiment.

Figure 11:
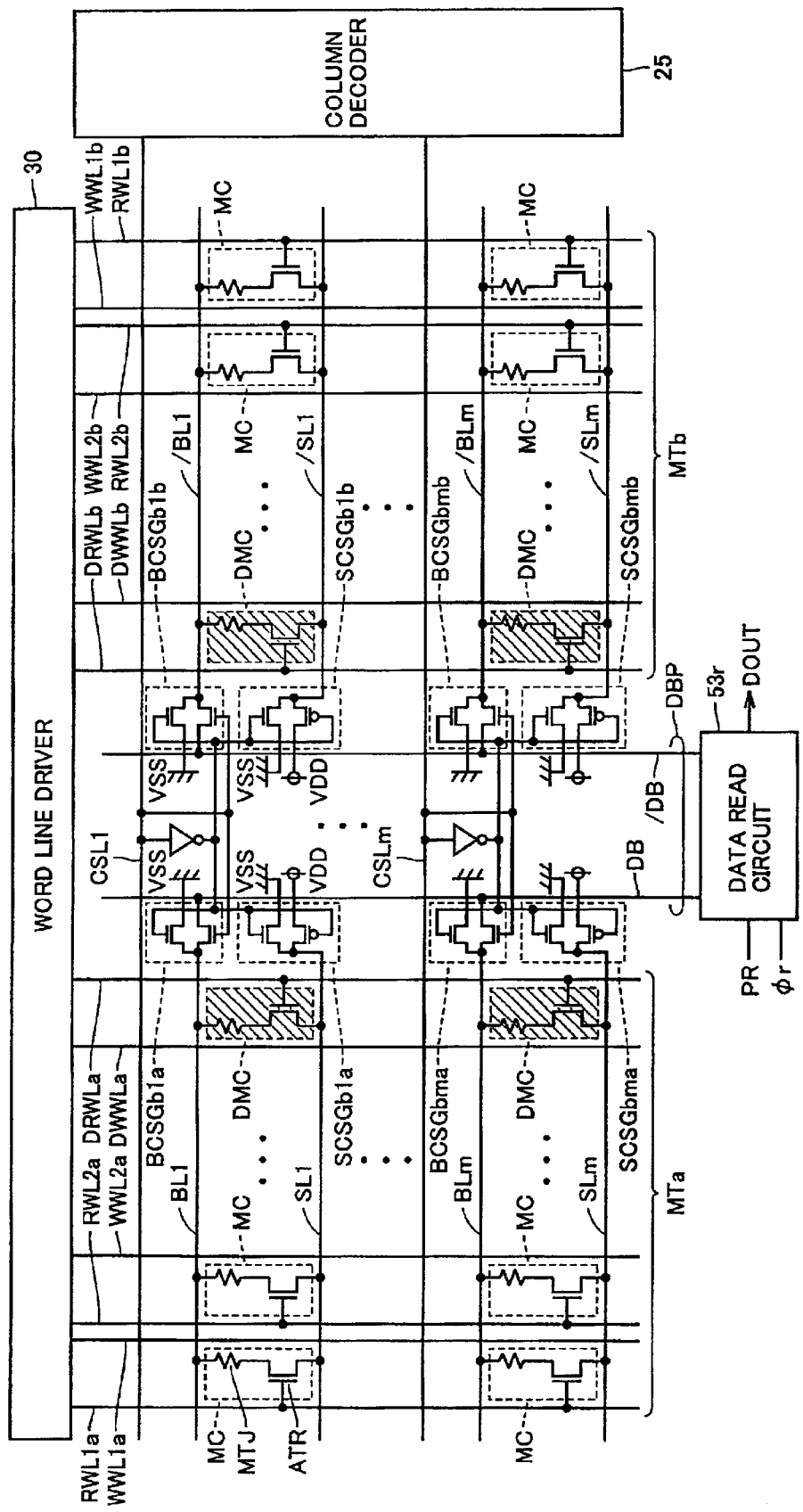
FIG. 11 is a conceptual diagram showing the structure of a memory array 10 and its peripheral circuitry according to a third modification of the first embodiment.

Referring to FIG. 11, in the structure of the third modification of the first embodiment, the memory array 10 is divided into two memory mats MTa and MTb in the row direction. In each memory mat MTa, MTb, read word lines RWL and write word lines WWL are provided respectively corresponding to the memory cell rows, and bit lines BL and source lines SL are provided respectively corresponding to the memory cell columns.

In each memory mat MTa, MTb, m bit lines are provided according to a so-called open bit line structure. In FIG. 11, the bit lines and source lines in one memory mat MTa are denoted with BL1 to BLm and SL1 to SLm, and the bit lines and source lines in the other memory mat MTb are denoted with /BL1 to /BLm and /SL1 to /SLm. In each memory cell row, memory cells MC are provided between each bit line BL and each source line SL. The bit lines /BL1 to /BLm and the source lines /SL1 to /SLm are also generally referred to as bit lines /BL and source lines /SL.

Bit line selection gates BCSGb1a to BCSGbma are provided respectively corresponding to the bit lines BL1 to BLm of the memory mat MTa. Similarly, bit line selection gates BCSGb1b to BCSGbmb are provided respectively corresponding to the bit lines /BL1 to /BLm of the memory mat MTb.

Each bit line selection gate BCSGb1a to BCSGbma having the same structure as that of the bit line selection gate BCSGb precharges a corresponding bit line BL to the ground voltage VSS before data read operation, and electrically couples the corresponding bit line BL to the data bus DB when a corresponding memory cell column is selected for the data read operation.

Each bit line selection gate BCSGb1b to BCSGbmb having the same structure as that of the bit line selection gate BCSGb precharges a corresponding bit line /BL to the ground voltage VSS before data read operation, and electrically couples the corresponding bit line /BL to the data bus /DB when a corresponding memory cell column is selected for the data read operation.

Source line selection gates SCSGb1a to SCSGbma are provided respectively corresponding to the source lines SL1 to SLm of the memory mat MTa. Similarly, source line selection gates SCSGb1b to SCSGbmb are provided respectively corresponding to the source lines /SL1 to /SLm of the memory mat MTb.

Each source line selection gate SCSGb1a to SCSGbma, SCSGb1b to SCSGbmb having the same structure as that of the source line selection gate SCSGb precharges a corresponding source line SL or /SL to the ground voltage VSS before data read operation, and drives the corresponding source line SL or /SL to the power supply voltage VDD when a corresponding memory cell column is selected for the data read operation.

The data read circuit 53r having the structure of FIG. 9 senses and amplifies the precharge and data voltages on the data buses DB and /DB forming a data bus pair DBP.

In each memory mat MTa, MTb, a plurality of dummy memory cells DMC are arranged in a single dummy row. A plurality of dummy memory cells DMC in the memory mat MTa are provided between the bit lines BL1 to BLm and the source lines SL1 to SLm. In other words, a plurality of memory cells MC and a dummy memory cell DMC on the same memory cell column are efficiently arranged so as to share a corresponding bit line BL, source line SL, bit line selection gate BCSGb and source line selection gate SCSGb.

Similarly, a plurality of dummy memory cell DMC in the memory mat MTb are provided between the bit lines /BL1 to /BLm and the source lines /SL1 to /SLm. In other words, a plurality of memory cells MC and a dummy memory cell DMC on the same memory cell column are arranged so as to share a corresponding bit line /BL, source line /SL, bit line selection gate BCSGb and source line selection gate SCSGb.

In the memory mat MTa, read word lines RWL1a, RWL2a, ... and write word lines WWL1a, WWL2a, ... are provided respectively corresponding to the memory cell rows. A dummy read word line DRWLa and a dummy write word line DWWLa are also provided corresponding to the dummy row. Note that, although the magnetic data write operation is not necessarily required for the dummy memory cell DMC, it is desired to provide the dummy write word line DWWLa in order to ensure continuity of the shape with the memory cell region.

Similarly, in the memory mat MTb, read word lines RWL1b, RWL2b, ... and write word lines WWL1b, WWL2b, ... are provided respectively corresponding to the memory cell rows. A dummy read word line DRWLb and a dummy write word line DWWLb are also provided corresponding to the dummy row.

Hereinafter, the data read operation of the third modification of the first embodiment will be described with reference to FIG. 12.

Figure 12:
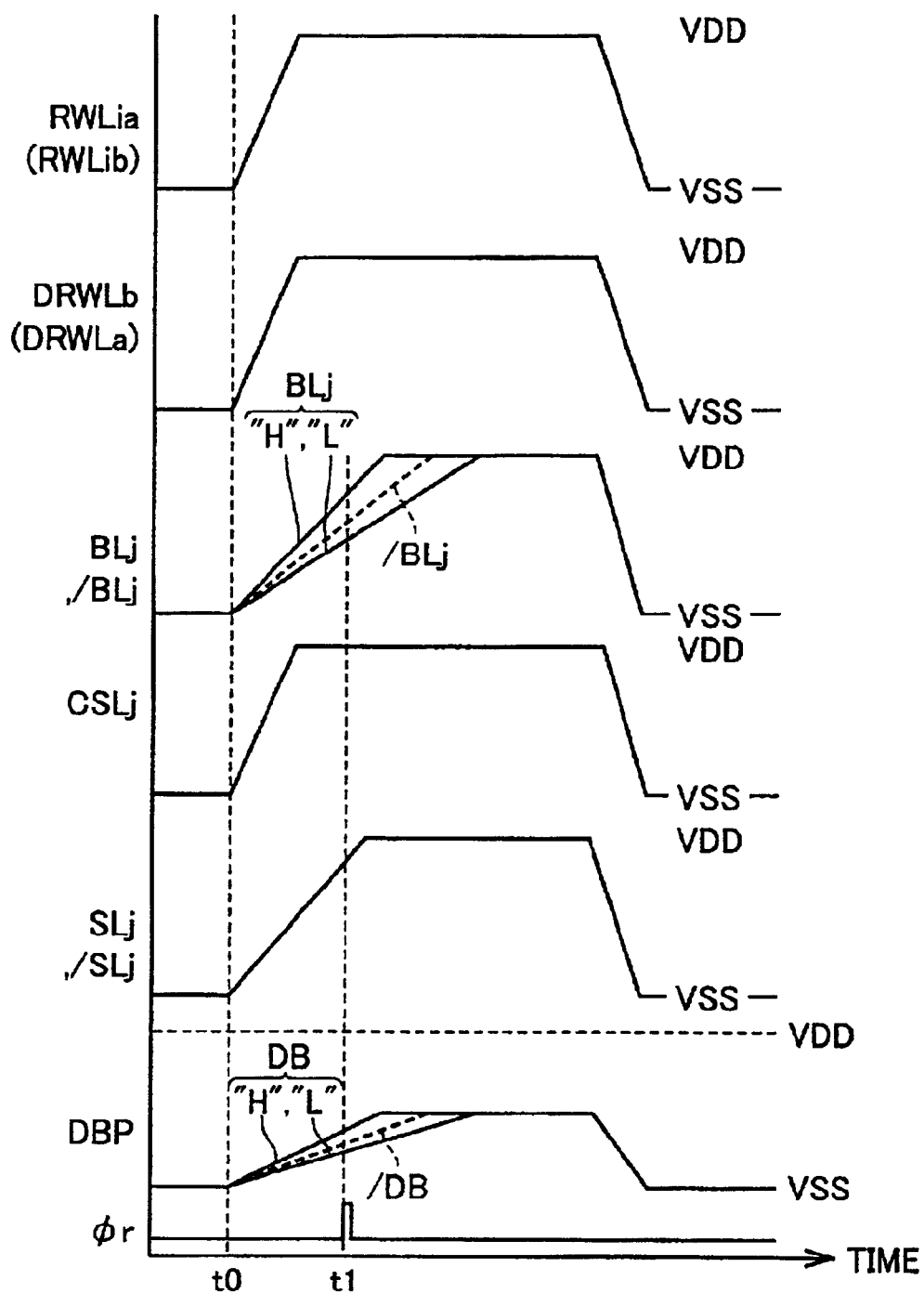
FIG. 12 is a timing chart illustrating the data read operation according to the third modification of the first embodiment.

Referring to FIG. 12, the dummy read word line DRWLa, DRWLb is activated in a non-selected memory block that does not include the selected memory cell to be read. In the selected memory block including the selected memory cell, a read word line RWL is activated according to the row selection result.

For example, when the selected memory cell is located on the $i^{th}$ row (where i is a natural number) of the memory mat MTa, the read word line RWLia is activated (H level) and the dummy read word line DRWLa is retained inactive (L level) in the selected memory mat MTa. In the non-selected memory mat MTb, the dummy read word line DRWLb is activated, whereas every read word line RWL1b to RWLnb is retained inactive (L level).

On the contrary, when the selected memory cell is located on the $i^{th}$ row (where i is a natural number) of the memory mat MTb, the read word line RWLib is activated (H level) and the dummy read word line DRWLb is retained inactive (L level) in the selected memory mat MTb. In the non-selected memory mat MTa, the dummy read word line DRWLa is activated, whereas every read word line RWL1a to RWLna is retained inactive (L level).

As a result, the memory cells MC are electrically coupled between the bit lines and the source lines in the selected memory mat, whereas the dummy memory cells DMC are electrically coupled between the bit lines and the source lines in the non-selected memory mat.

Among the bit lines BL, /BL and the source lines SL, /SL that have been precharged to the ground voltage VDD, the bit lines BLj and /BLj of the selected column are respectively coupled to the data buses DB and /DB, and the source lines SLj and /SLj of the selected column are driven to the power supply voltage VDD.

FIG. 12 shows the voltage waveforms of the case where the memory mat MTa is selected, i.e., the selected memory cell is coupled to the bit line BLj and the data bus DB as well as the dummy memory cell DMC is coupled to the bit line /BLj and the data bus /DB.

Since the voltages on the bit lines BLj, /BLj and source lines SLj, /SLj of the selected column as well as the voltages on the data buses DB change in the same manner as that of FIG. 10, detailed description thereof will not be repeated.

Thus, as in the second modification of the first embodiment, a read operation margin can be ensured even if the voltage sensing timing of the data read circuit 53r, i.e., the activation timing of the trigger pulse φr, varies.

Moreover, the dummy bit line DBL, dummy source line DSL and their respective selection gates exclusive for the dummy memory cell are not required, allowing for reduction in device size, as compared to the structure of the second modification of the first embodiment.

Provided that the bit lines BL, /BL, source lines SL, /SL and data buses DB, /DB formed in pairs in the memory mats MTa, MTb are designed with the same material, cross-sectional shape, cross-sectional area and the like so that they have the same electric resistance value per unit length, first and second current paths formed between the data read circuit 53r and the ground voltage VSS, i.e., first and second current paths respectively including the selected memory cell and the dummy memory cell, have the same electric resistance value without any special consideration. This enables accurate production of the reference voltage VREF.

Fourth Modification of First Embodiment

The arrangement of dummy memory cells in the folded bit line structure is shown in the fourth modification of the first embodiment.

Figure 13:
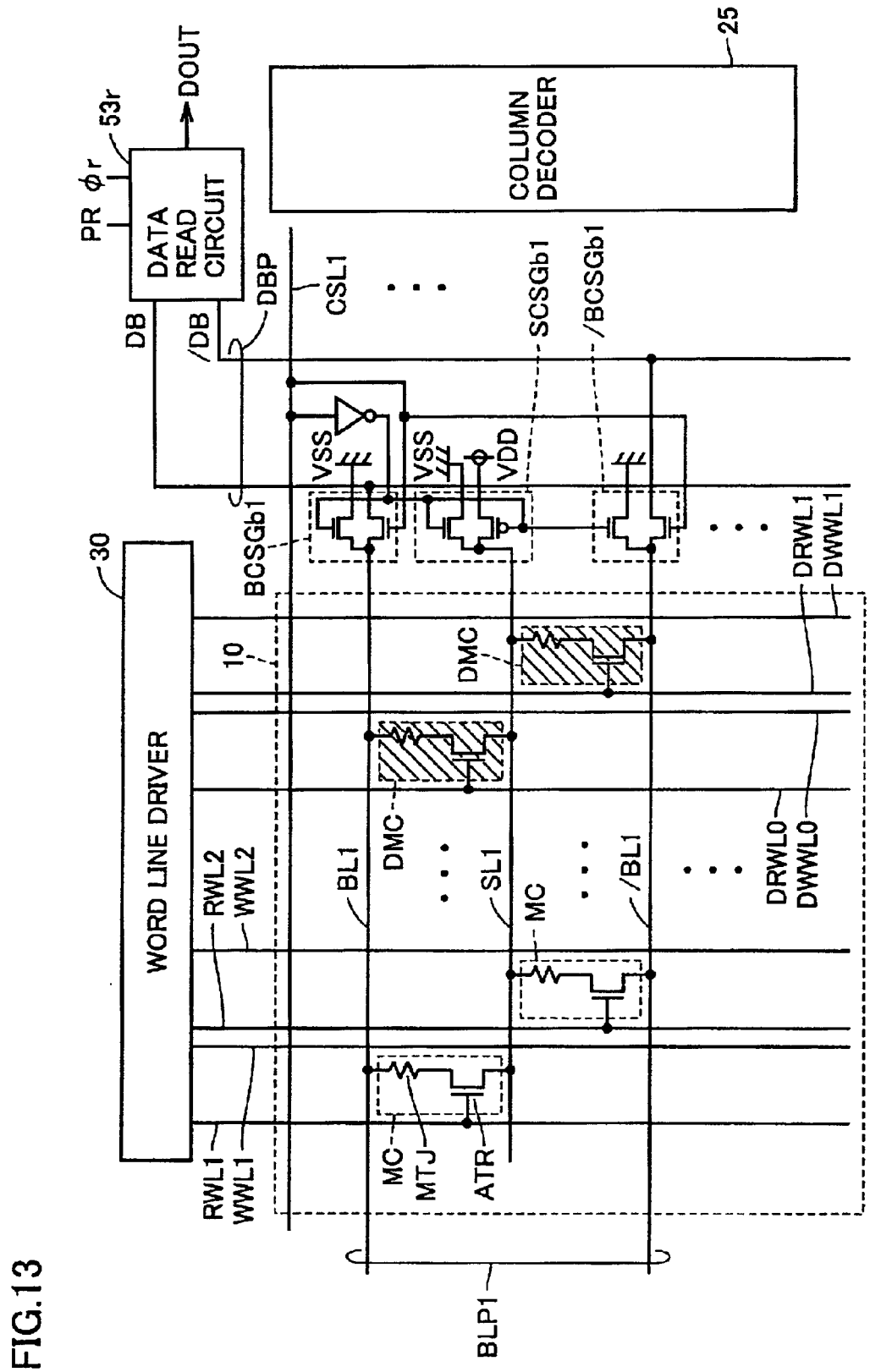
FIG. 13 is a conceptual diagram showing the structure of a memory array 10 and its peripheral circuitry according to a fourth modification of the first embodiment.

Referring to FIG. 13, in the structure of the fourth modification of the first embodiment, bit line pairs BLP and source lines SL are provided respectively corresponding to the memory cell columns. Each bit line pair BLP is formed from complementary bit lines BL and /BL.

FIG. 13 exemplarily shows a bit line pair BLP1 of bit lines BL1 and /BL1 and a source line SL1 of the first memory cell column.

Bit line selection gates BCSGb1 and /BCSGb1 are provided respectively corresponding to the bit lines BL1 and /BL1. The bit line selection gate BCSGb1 having the same structure as that of the bit line selection gate BCSGb precharges the bit line BL1 to the ground voltage VSS before data read operation, and electrically couples the bit line BL1 to the data bus DB when the corresponding memory cell column is selected for the data read operation.

The bit line selection gate /BCSGb1 having the same structure as that of the bit line selection gate BCSGb precharges the bit line /BL1 to the ground voltage VSS before data read operation, and electrically couples the bit line /BL1 to the data bus /DB when the corresponding memory cell column is selected for the data read operation.

A source line selection gate SCSGb1 is provided corresponding to the source line SL1. The source line selection gate SCSGb1 having the same structure as that of the source line selection gate SCSGb precharges the source line SL1 to the ground voltage VSS before data read operation, and drives the source line SL1 to the power supply voltage VDD when the corresponding memory cell column is selected for the data read operation.

Bit line pairs, bit line selection gates respectively corresponding to the complementary bit lines of each bit line pair, source lines, and source line selection gates are similarly provided in the following memory cell columns.

The data read circuit 53r having the structure of FIG. 9 senses and amplifies the precharge and data voltages on the data buses DB and /DB forming a data bus pair DBP.

Read word lines RWL1, RWL2, and write word lines WWL1, WWL2, ... are provided respectively corresponding to the memory cell rows. The memory cells MC on each column are alternately coupled between the bit lines BL and /BL and the source line SL. For example, for the memory cells MC on the first column, the memory cell MC on the first row is provided between the bit line BL1 and the source line SL, and the memory cell MC on the second row is provided between the bit line /BL1 and the source line SL1. Similarly, the memory cells MC on every odd row are provided between the bit lines BL and the source lines SL, and the memory cells MC on every even row are provided between the bit lines /BL and the source lines SL.

Thus, when a read word line RWL is selectively activated according to the row selection result, the memory cell MC is coupled between the bit line BL and the source line SL or between the bit line /BL and the source line SL in each memory cell column.

Dummy memory cells DMC are arranged in two dummy rows. Dummy read word lines DRWL0, DRWL1 and dummy write word lines DWWL0, DWWL1 are provided respectively corresponding to the dummy rows. As described before, the dummy write word lines DWWL0, DWWL1 are provided in view of continuity of the shape with the memory cell region.

In each memory cell column, the dummy memory cells DMC are provided between the bit lines BL, /BL and the source line SL. In other words, a plurality of memory cells MC and a plurality of dummy memory cells DMC on the same memory cell column are efficiently arranged so as to share the corresponding bit line BL, /BL, source line SL, bit line selection gate BCSGb, /BCSGb and source line selection gate SCSGb.

Hereinafter, the data read operation of the fourth modification of the first embodiment will be described with reference to FIG. 14.

Figure 14:
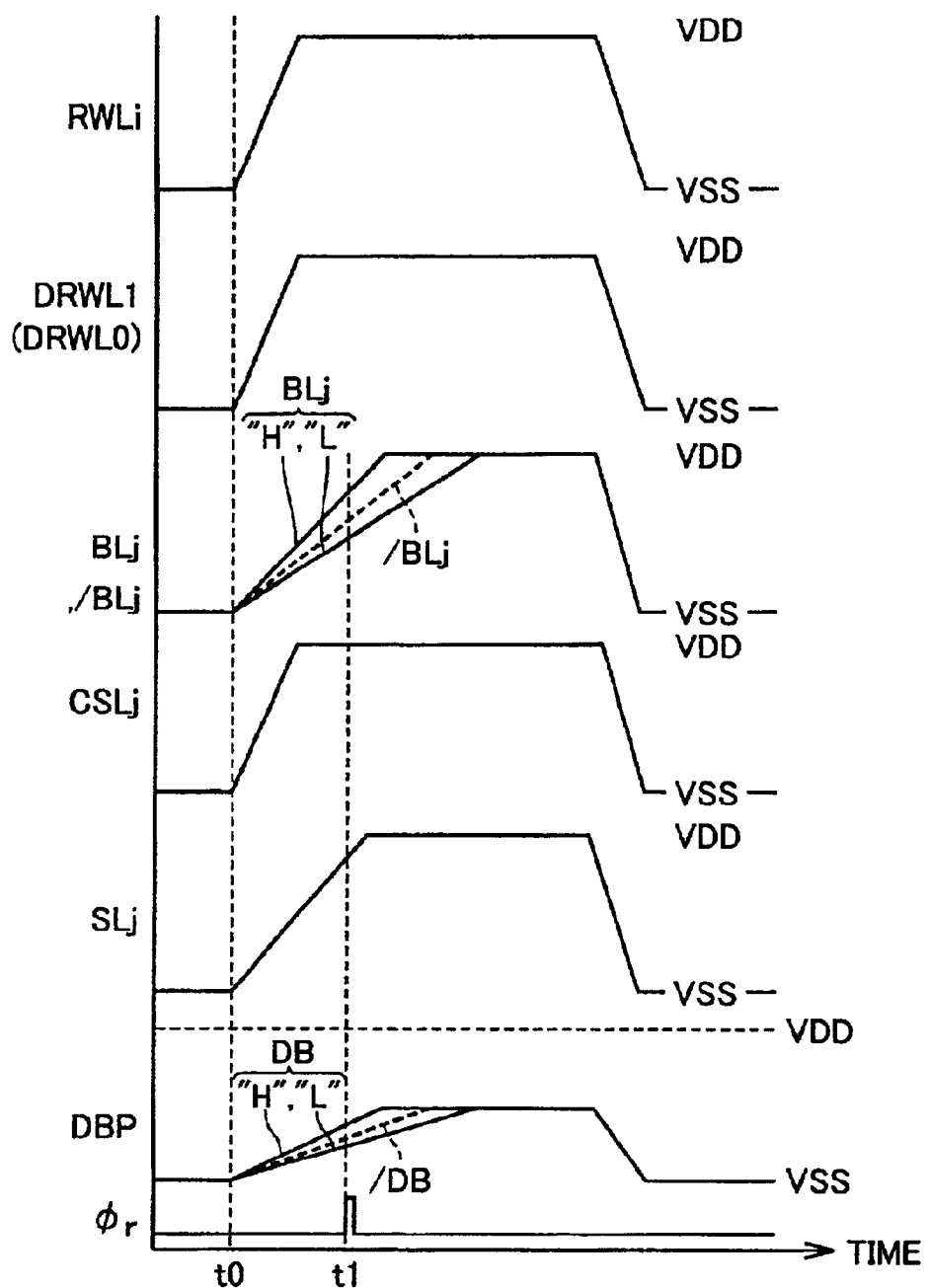
FIG. 14 is a timing chart illustrating the data read operation according to the fourth modification of the first embodiment.

Referring to FIG. 14, the dummy read word line DRWL0, DRWL1 is selectively activated so as to couple either the bit line BL or /BL of each bit line pair, i.e., the bit line that is not coupled to the memory cell MC, to the dummy memory cell DMC.

More specifically, the dummy read word line DRWL1 is activated when an odd row is selected, whereas the dummy read word line DRWL0 is activated when an even row is selected. As a result, in each memory cell column, one of the memory cell MC and the dummy memory cell DMC is coupled between the bit line BL and the source line SL, and the other is coupled between the bit line /BL and the source line SL.

In FIG. 14, it is exemplarily assumed that the $i^{th}$ row (where i is an odd number) is selected. In this case, in each memory cell column, the memory cell MC is electrically coupled between the bit line BL and the source line SL, whereas the dummy memory cell DMC is electrically coupled between the bit line /BL and the source line SL.

Among the bit lines BL, /BL and the source lines SL that have been precharged to the ground voltage VSS, the bit lines BLj and /BLj of the selected column are respectively coupled to the data buses DB and /DB, and the source line SLj of the selected column is driven to the power supply voltage VDD.

Since the voltages on the bit lines BLj, /BLj and source lines SLj, /SLj of the selected column as well as the voltages on the data buses DB, /DB change in the same manner as that of FIGS. 10 and 12, detailed description thereof will not be repeated.

Accordingly, as in the third modification of the first embodiment, a read operation margin can be ensured even if the voltage sensing timing of the data read circuit 53r varies. And also, the memory cells MC and the dummy memory cells DMC share the source lines, bit line pairs and their respective selection gates, allowing for reduction in device size. Moreover, first and second current paths formed between the data read circuit 53r and the ground voltage VSS, i.e., first and second current paths respectively including the selected memory cell and the dummy memory cell DMC, can be easily made to have the same electric resistance value without any special consideration, enabling accurate production of the reference voltage VREF.

Moreover, in the structure of the fourth modification of the first embodiment, the data read operation can be conducted based on the folded bit line structure, enabling improved resistance of the bit line pairs BLP and the data bus pair DBP to electric noise.

Second Embodiment

The structure for supplying a data write current so as to stabilize the data write operation to the memory cell will be described in the second embodiment.

Figure 15:
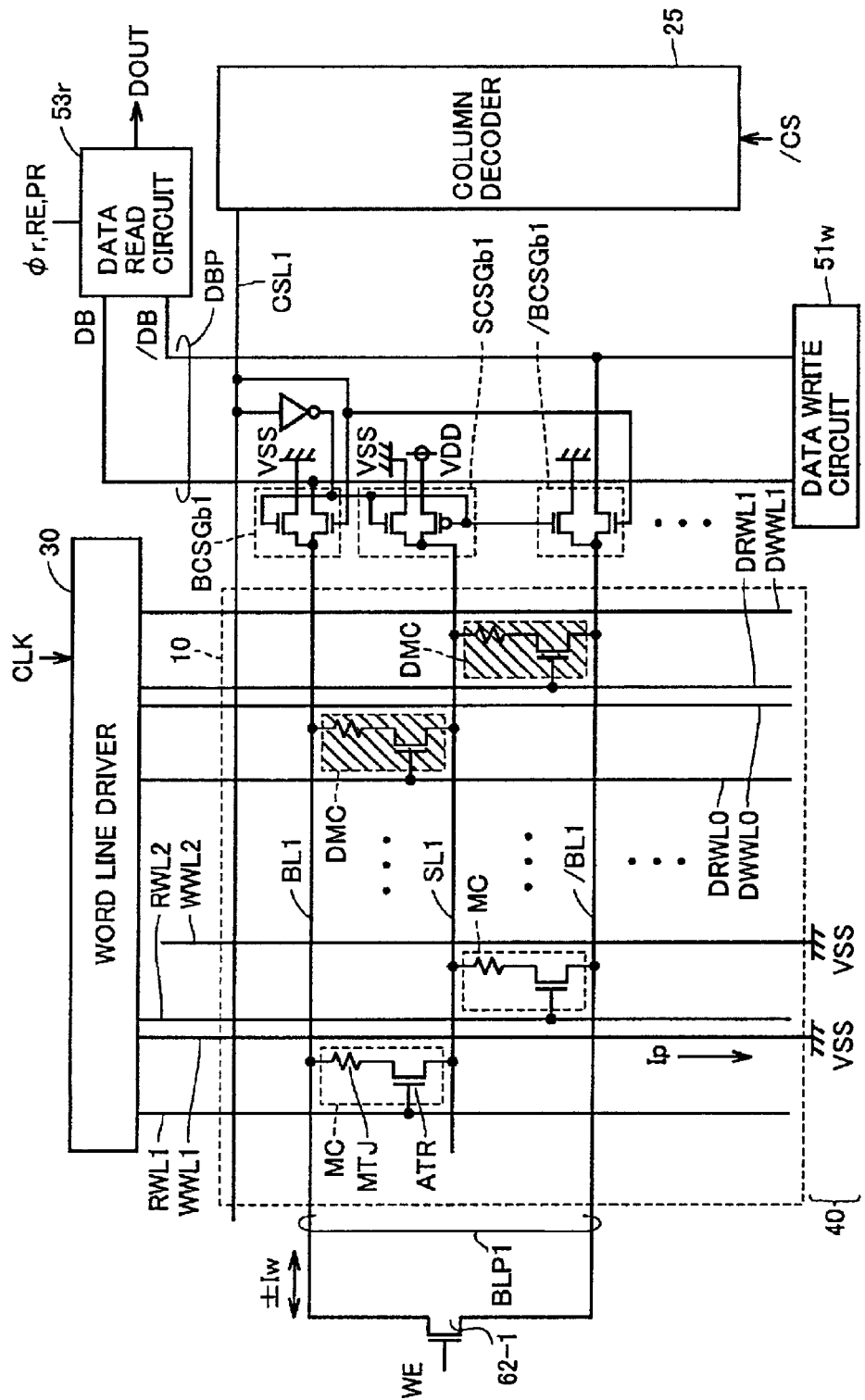
FIG. 15 is a conceptual diagram showing the structure of a memory array 10 and its peripheral circuitry according to a second embodiment of the present invention.

Referring to FIG. 15, in the second embodiment, the memory cells MC, read word lines RWL, bit line pairs BLP, source lines SL and the like in the memory array 10, and the circuitry associated with the data read operation have the same structure as that of FIG. 13. Therefore, detailed description thereof will not be repeated.

FIG. 15 additionally shows a word line current control circuit 40 for supplying a data write current, and a data write circuit 51w. Bit line coupling transistors 62 are provided respectively corresponding to the bit line pairs. The bit line coupling transistors 62 are provided in the region located opposite to the bit line selection gates BCGSb and the source line selection gates SCSGb with the memory array 10 interposed therebetween. FIG. 15 exemplarily shows a bit line coupling transistor 62-1 corresponding to the bit line pair BLP1.

In the data write operation, the bit line coupling transistor 62 electrically couples complementary bit lines of a corresponding bit line pair together at their respective one ends. For example, the bit line coupling transistor 62-1 electrically couples the bit lines BL1 and /BL1 in response to a control signal WE that is activated to H level in the data write operation.

The word line current control circuit 40 couples each write word line WWL to the ground voltage VSS in the region located opposite to the word line driver 30 with the memory array 10 interposed therebetween. The word line driver 30 electrically couples the write word line WWL of the selected row to the power supply voltage VDD according to the row selection result, thereby activating that write word line WWL. A data write current Ip can be applied in the direction from the word line driver 30 toward the word line current control circuit 40 in response to selective activation of the write word line WWL by the word line driver 30.

Figure 16:
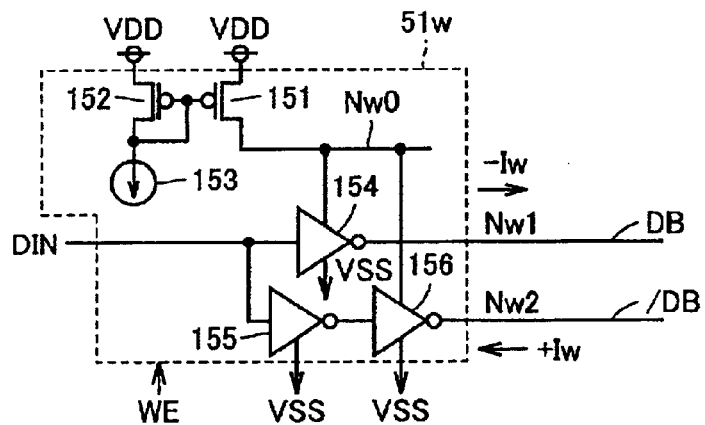
FIG. 16 is a circuit diagram showing the structure of a data write circuit of FIG. 15.

Referring to FIG. 16, the data write circuit 51w operates in response to the control signal WE. The data write circuit 51w includes a P-type MOS transistor 151 for supplying a constant current to an internal node Nw0, and a P-type MOS transistor 152 and a current source 153 which form a current mirror circuit for controlling a current passing through the transistor 151.

The data write circuit 51w further includes inverters 154, 155 and 156 operating with an operating current supplied from the internal node Nw0. The inverter 154 inverts the voltage level of the write data DIN for transmission onto the data bus DB. The inverter 155 inverts the voltage level of the write data DIN for transmission to the input node of the inverter 156. The inverter 156 inverts the output of the inverter 154 for transmission onto the data bus /DB.

Thus, the data write circuit 51w sets the voltage on the data bus DB to one of the power supply voltage VDD and the ground voltage VSS and the voltage on the data bus /DB to the other according to the voltage level of the write data DIN.

Referring back to FIG. 15, the column selection line CSL of the selected column is activated to H level also in the data write operation. In response to this, the bit lines BL and /BL of the selected column are electrically coupled to the data buses DB and /DB, respectively, which have been respectively set to the voltages corresponding to the write data level DIN by the data write circuit 51w.

As described before, in each memory cell column, the bit lines BL and /BL are electrically coupled together at their respective one ends through a corresponding bit line coupling transistor 62. Accordingly, in the selected column, a reciprocating current path is formed from the data write circuit 51w, data bus DB (/DB), bit line selection gate BCSGb (/BCSGb), bit line /BL (BL), bit line coupling transistor 62, bit line BL (/BL), bit line selection gate /BCSGb (BCSGb), data bus /DB (DB) and data write circuit 51w, in response to activation (H level) of a corresponding column selection line CSL. Thus, a data write current ±Iw can be supplied through the reciprocating current path in the direction corresponding to the write data level DIN.

The word line driver 30 selectively activates a read word line RWL or a write word line WWL in response to an internal clock CLK according to the row selection result. The column decoder 25 selectively activates a column selection line CSL in response to a column selection clock /CS according to the column selection result.

Figure 17:
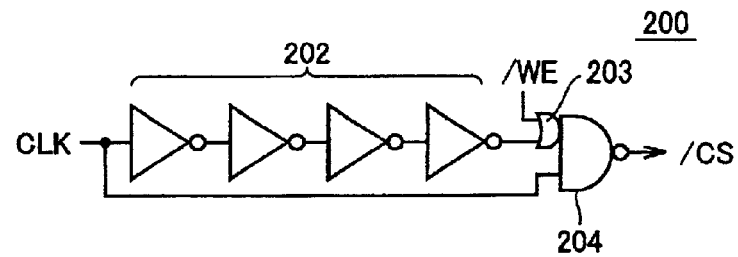
FIG. 17 is a circuit diagram showing the structure of a column selection clock generation circuit.

Referring to FIG. 17, a column selection clock generation circuit 200 includes a delay stage 202 including a plurality of inverters, and logic gates 203, 204.

The delay stage 202 delays the internal clock CLK by a prescribed delay time ΔTW. The logic gate 203 outputs the OR logic operation result of the internal clock delayed in the delay stage 202 and the control signal /WE. The control signal /WE is rendered active (L level) in the data write operation, and inactive (H level) in the data read operation. The logic gate 204 outputs the NAND logic operation result of the output of the logic gate 203 and the internal clock CLK as a column selection clock /CS.

Figure 18:
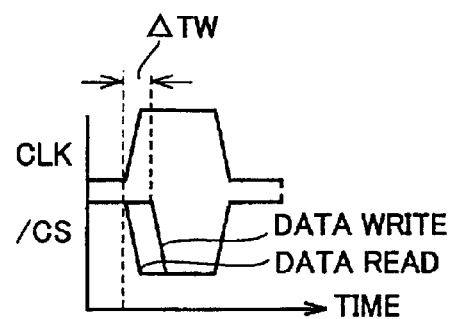
FIG. 18 is a timing chart illustrating a phase change of a column selection clock.

Referring to FIG. 18, in the data read operation, the control signal WE is set to H level, and therefore the logic gate 203 always output H level. Thus, the column selection clock /CS corresponds to an inverted signal of the internal clock CLK. Accordingly, the internal clock CLK and the column selection clock /CS are activated at the same timing.

In the data write operation, the control signal /WE is set to L level, and therefore the logic gate 203 outputs the internal clock delayed in the delay stage 202. As a result, the column selection clock /CS is activated at the timing delayed by the delay time ΔTW of the delay stage 202 with respect to the activation timing of the internal clock CLK.

Hereinafter, the data read and write operations of the second embodiment will be described with reference to FIG. 19.

Figure 19:
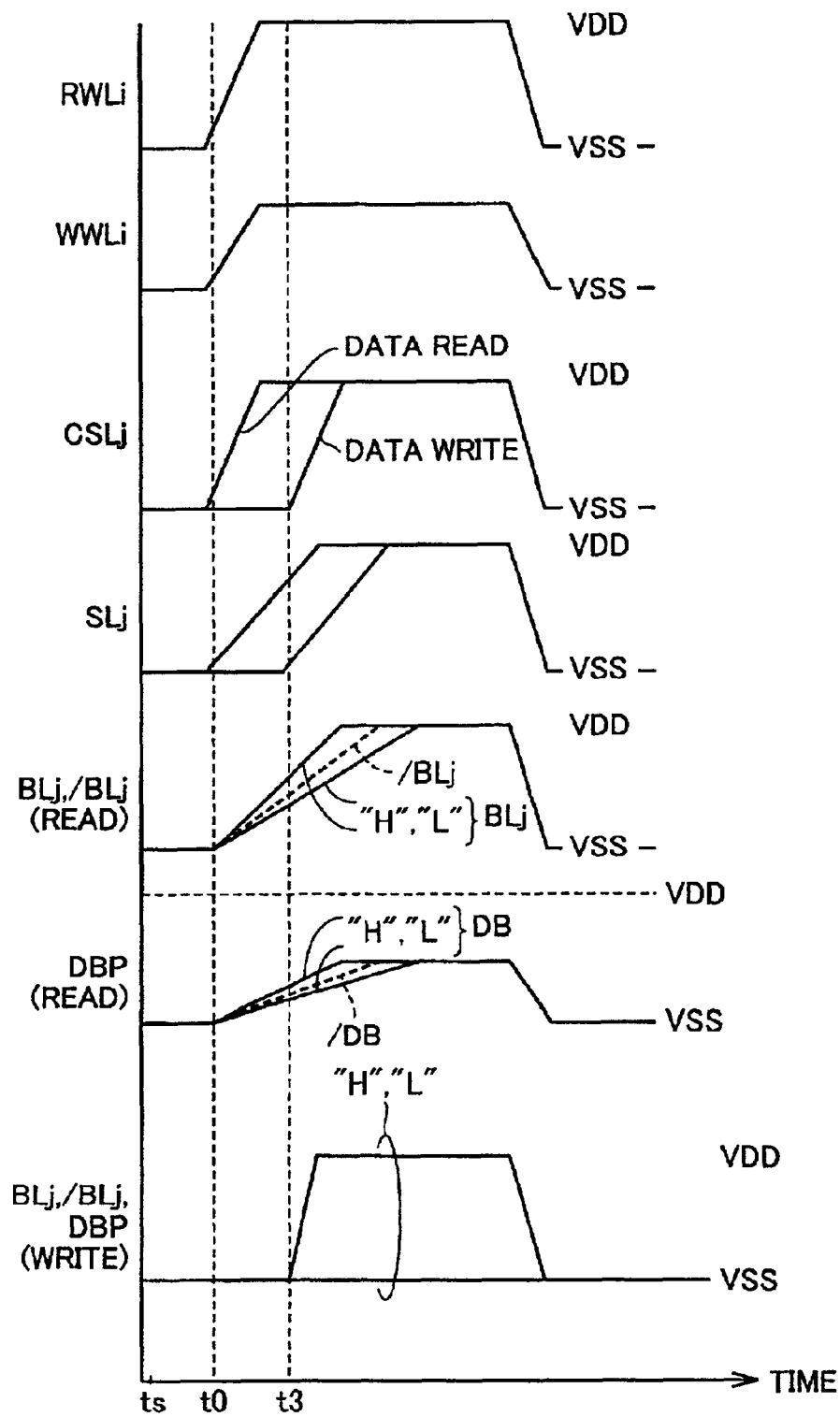
FIG. 19 is a timing chart illustrating the data read and write operations according to the second embodiment.

Referring to FIG. 19, the data read operation is started at time ts. Then, the word line driver 30 activates the read word line RWLi of the selected row at time t0 in response to the internal clock CLK. Similarly, the column decoder 25 activates the column selection line CSLj of the selected column approximately at time t0 in response to the column selection clock /CS that is activated approximately at the same timing as that of the internal clock CLK.

In response to activation of the read word line RWL and the column selection line CSL, a sense current (data read current) is applied to the memory cell. Thus, the voltages on the bit lines BLj, /BLj and the source line SLj of the selected column change in the same manner as that of FIG. 14, whereby the data read operation is conducted in the same manner as that of the fourth modification of the first embodiment.

In other words, in the data read operation, activation of the read word line RWL and the column selection line CSL is determined based on the same timing. More specifically, the order of activating the read word line RWL and the column selection line CSL is not specifically restricted, but the read word line RWL and the column selection line CSL are each activated at the earliest possible timing for rapid access.

In the data write operation as well, the word line driver 30 operates in response to the internal clock CLK as in the data read operation. Accordingly, after the data write operation is started at time ts, the word line driver 30 activates the write word line WWLi of the selected row at time t0 as in the data read operation. In response to this, a data write current starts to be supplied to the write word line WWLi.

The column decoder 25 activates the column selection line CSLj of the selected column at time t3, which is later than time t0, based on the column selection clock /CS that is activated at the timing delayed by ΔTW with respect to the internal clock CLK. In response to this, one of the bit lines BLj and /BLj of the selected column is set to the power supply voltage VDD and the other is set to the ground voltage VSS through the data buses DB and /DB, respectively, whereby a data write current starts to be supplied to the bit lines.

Thus, in the data write operation, the timing of starting supply of the data write current to the bit lines of the selected column is intentionally delayed with respect to the timing of starting supply of the data write current to the write word line. In other words, supply of the data write current is started in a stepwise manner.

As a result, the selected memory cell is first subjected to a data write magnetic field resulting from the data write current Ip flowing through the write word line WWL, and then to a data write magnetic field resulting from the data write current ±Iw flowing through the bit line BL.

Hereinafter, the relation between the stepwise supply of the data write current and characteristics of the magnetic data write operation to the memory cell will be described.

Figure 20:
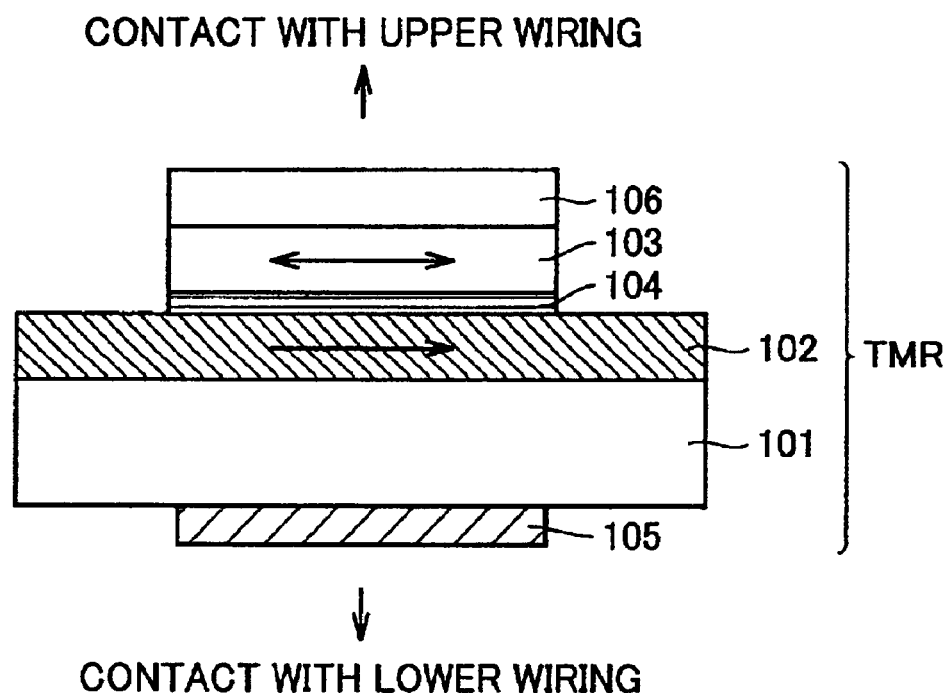
FIG. 20 is a cross-sectional view showing the structure of a tunnel magnetic resistive element in a memory cell.

Referring to FIG. 20, a tunnel magnetic resistive element TMR corresponding to the magnetic tunnel junction MTJ includes an antiferromagnetic layer 101, a partial region of a fixed magnetic layer 102 formed on the antiferromagnetic layer 101 and having a fixed magnetic field of a fixed direction, a free magnetic layer 103 that is magnetized by an applied magnetic field, a tunnel barrier 104, i.e., an insulator film formed between the fixed magnetic layer 102 and the free magnetic layer 103, and a contact electrode 105.

The antiferromagnetic layer 101, fixed magnetic layer 102 and free magnetic layer 103 are formed from an appropriate magnetic material such as FeMn or NiFe. The tunnel barrier 104 is formed from $Al_2O_3$ or the like.

The tunnel magnetic resistive element TMR is electrically coupled to an upper wiring through a barrier metal 106 that is provided as necessary. The barrier metal 106 serves as a buffer material for electrically coupling with a metal wiring. The contact electrode 105 is electrically coupled to a lower wiring (not shown). For example, the upper wiring corresponds to a bit line BL, and the lower wiring corresponds to a metal wiring coupled to the access transistor ATR.

Thus, the tunnel magnetic resistive element TMR having a magnetic tunnel junction can be electrically coupled between the upper and lower wirings.

Figure 21:
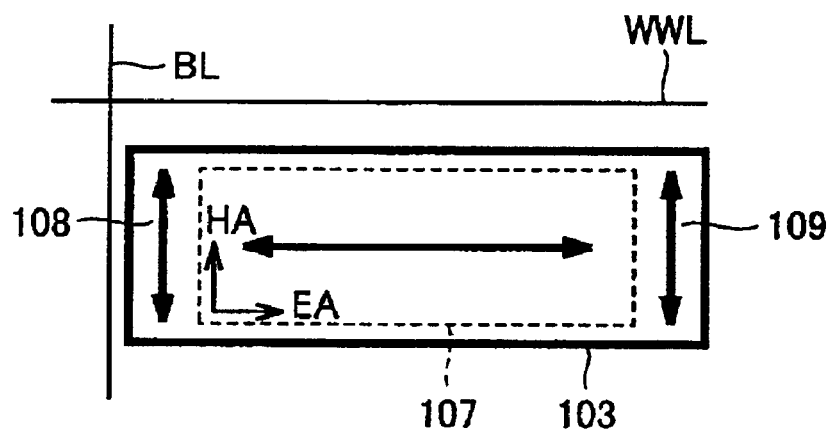
FIG. 21 is a conceptual diagram showing the magnetization direction in a free magnetic layer of the tunnel magnetic resistive element.

FIG. 21 exemplarily shows a plan view of the free magnetic layer 103 in the case where the tunnel magnetic resistive element TMR has a rectangular shape.

Referring to FIG. 21, the rectangular free magnetic layer 103 has an easy axis (EA) in the lengthwise direction (the horizontal direction in FIG. 21), and a hard axis (HA) in the widthwise direction (the vertical direction in FIG. 21).

A data write magnetic field resulting from the data write current flowing through the bit line BL has a direction along the easy axis (EA). A data write magnetic field resulting from the data write current flowing through the write word line WWL has a direction along the hard axis (HA). In the case of a rectangular memory cell, the write word line WWL is provided in the direction along the longer side of the memory cell, and the bit line BL is provided in the direction along the shorter side thereof, in order to obtain the aforementioned directions of the data write magnetic field.

In an easy axis region 107 located in the center of the free magnetic layer 103, the magnetization direction is easily inverted in response to an external magnetic field of the easy axis direction. In hard axis regions 108 and 109 located at the right and left ends of the free magnetic layer 103, however, the magnetization direction is not easily inverted even if an external magnetic field of the easy axis direction is applied.

Figure 22:
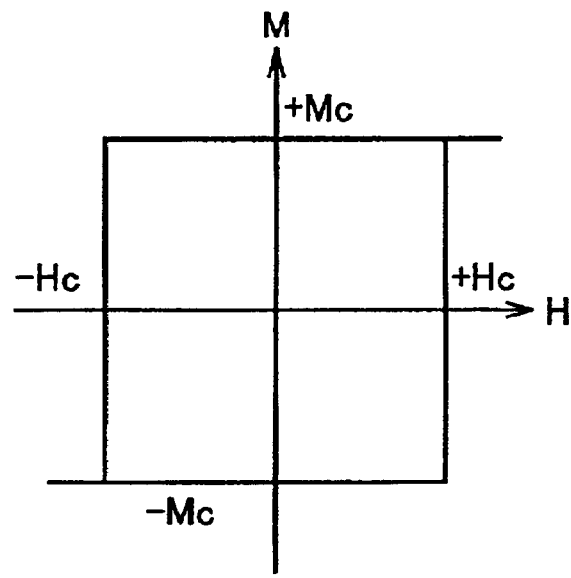
FIG. 22 shows a hysteresis curve illustrating magnetization characteristics in an easy axis region.
Figure 23:
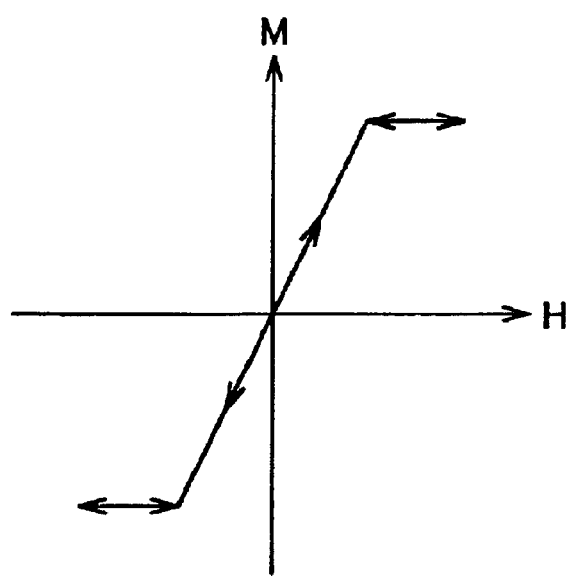
FIG. 23 shows a hysteresis curve illustrating magnetization characteristics in a hard axis region.

FIGS. 22 and 23 show a hysteresis curve illustrating magnetization characteristics in the easy axis and hard axis regions, respectively.

Referring to FIG. 22, the easy axis region 107 is magnetized to +Mc in response to a magnetic field of the positive direction that is larger than a prescribed magnetic field +Hc of the easy axis direction, and is magnetized to −Mc in response to a magnetic field of the negative direction that is larger than a prescribed magnetic field −Hc. Thus, the magnetization direction of the easy axis region 107 does not change when a magnetic field of a prescribed level or less, i.e., in the range from −Hc to +Hc, is applied. Therefore, the easy axis region 107 has characteristics that are desirable as a memory cell.

Referring to FIG. 23, the hard axis regions 108, 109 are not easily magnetized in response to a magnetic field of the easy axis direction, and the magnetization direction and amount vary gradually in the hard axis regions 108, 109. Accordingly, unlike the easy axis region in which the magnetization direction and amount are set on a binary basis in response to the magnetic field of the easy axis direction, the hard axis regions have characteristics that are undesirable as a memory cell.

FIGS. 24A to 24E are conceptual diagrams illustrating magnetization of the free magnetic layer in the data write operation.

Figure 24A:
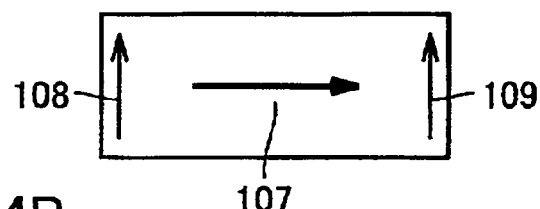
FIGS. 24A to 24E are conceptual diagrams illustrating magnetization of the free magnetic layer in the data write operation.
Figure 24B:
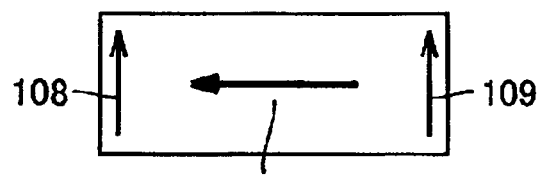

For stable data write operation to the memory cell, the easy axis region 107 and the hard axis regions 108, 109 in the free magnetic layer must be uniformly magnetized in one direction along the easy axis and the hard axis, respectively, as shown in FIG. 24A or FIG. 24B.

As described above, by delaying the activation timing of the column selection line CSL with respect to that of the write word line WWL, a data write current generating a data write magnetic field in the hard axis direction is first supplied to the write word line WWL, so that the hard axis regions 108, 109 are uniformly magnetized in one direction (in the upward direction in FIGS. 24A, 24B). Thereafter, a data write current generating a data write magnetic field in the easy axis direction is supplied to the bit line BL. As a result, as shown in FIG. 24A, 24B, the easy axis region 107 is uniformly magnetized in one direction along the easy axis according to the write data level, whereby a desirable magnetization state for data storage can be obtained.

Figure 24C:
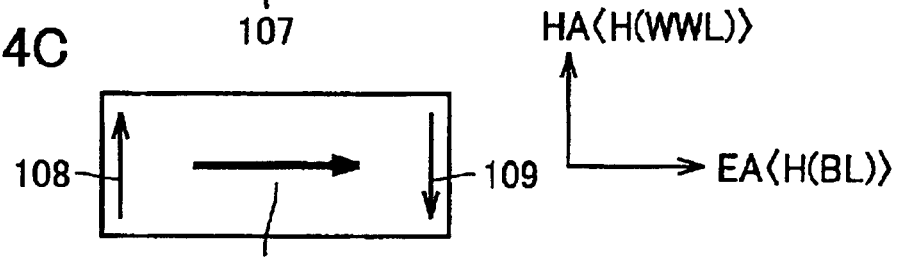
Figure 24D:
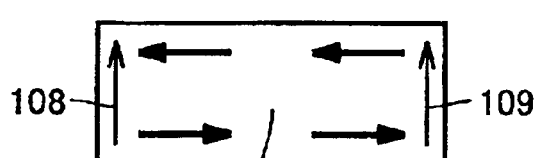
Figure 24E:
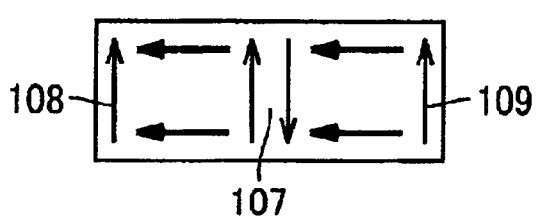

In the case where the write word line WWL and the column selection line CSL are activated approximately at the same timing, or the column selection line CSL is activated before the write word line WWL, the free magnetic layer is rendered in a multi-stable state. Accordingly, the free magnetic layer is rendered in a non-uniform, intermediate state rather than a desired stable state in terms of the magnetization direction, as shown in FIGS. 24C, 24D and 24E. As a result, the free magnetic layer is not magnetized in the direction as shown in FIG. 24A or 24B as a result of the data write operation. Accordingly, a desired electric resistance difference corresponding to the difference in storage data level cannot be ensured in the written memory cell, resulting in malfunction and thus degraded operation stability of the MRAM device.

Thus, in the second embodiment, supply of the data write current is started in a stepwise manner such that the data write current generating a magnetic field in the hard axis direction is applied before the data write current generating a magnetic field in the easy axis direction. As a result, stable data write operation can be realized in view of the magnetic characteristics of the memory cell.

Regarding the bit line of the selected column, the activation timing of the column selection clock /CS is varied between the data read and write operations. As a result, the time from the start of the data write operation to supply of the data write current (from time ts to time t3 in FIG. 19) is set longer than the time from the start of the data read operation to supply of the sense current (from time ts to time t0 in FIG. 19). In other words, the timing of supplying the data write current in the data write operation is intentionally delayed, whereas supply of the sense current is started at the earliest possible timing in the data read operation. Thus, stable data write operation as well as rapid data read operation can be achieved.

Note that the structure for supplying a data write current according to the second embodiment has been described in connection with FIG. 16 based on the structure of the fourth modification of the first embodiment shown in FIG. 14. However, the structure of the second embodiment is applicable independently of the structure of the memory array and its peripheral circuitry associated with the data read operation.

Third Embodiment

The structure for efficiently supplying a data write current is described in the third embodiment.

Figure 25:
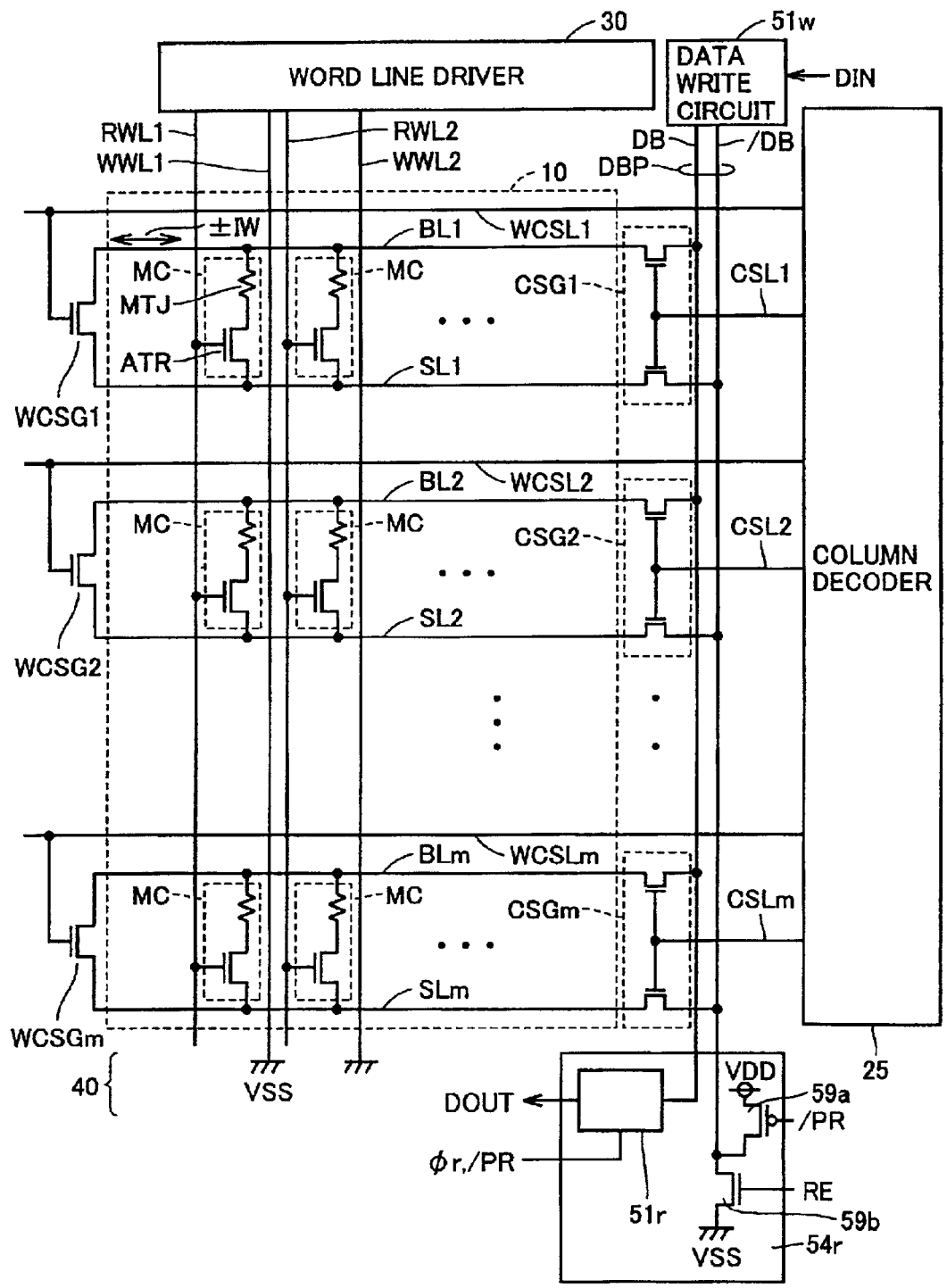
FIG. 25 is a conceptual diagram showing the structure of a memory array 10 and its peripheral circuitry according to a third embodiment of the present invention.

Referring to FIG. 25, in the structure of the third embodiment, a memory array 10 includes memory cells MC arranged in n rows by m columns. In the memory array 10, read word lines RWL1, RWL2, . . . and write word lines WWL1, WWL2, are provided respectively corresponding to the memory cell rows. Bit lines BL1 to BLm and source lines SL1 to SLm are provided respectively corresponding to the memory cell columns.

The word line current control circuit 40 couples each write word line WWL to the ground voltage VSS in the region located opposite to the word line driver 30 with the memory array 10 interposed therebetween.

A data bus pair DBP of data buses DB, /DB is provided in a region adjacent to the memory array 10 so as to extend in the same direction as that of the read word lines RWL and the write word lines WWL.

Column selection lines CSL1 to CSLm, write column selection lines WCSL1 to WCSLm, column selection gates CSG1 to CSGm and write column selection gates WCSG1 to WCSGm for conducting column selection are provided respectively corresponding to the memory cell columns.

The column selection gates CSG1 to CSGm and the write column selection gates WCSG1 to WCSGm are respectively located in the regions opposite to each other with the memory array 10 interposed therebetween.

Hereinafter, the write column selection lines, column selection gates and write column selection gates are also generally denoted with WCSL, CSG and WCSG, respectively. A specific write column selection line, column selection gate and write column selection gate are denoted with, e.g., WCSL1, CSG1 and WCSG1, respectively.

In the data write operation, the column decoder 25 activates one of the column selection lines CSL1 to CSLm and one of the write column selection lines WCSL1 to WCSLm to H level according to the decode result of the column address CA, i.e., the column selection result. In the data read operation, the column decoder 25 activates one of the column selection lines CSL1 to CSLm according to the column selection result. In other words, in the data read operation, every write column selection line WCSL1 to WCSLm is retained inactive (L level) regardless of the column selection result.

The column selection gate CSG couples a corresponding bit line BL and source line SL to the data buses DB and /DB, respectively, in response to activation of a corresponding column selection line CSL. The data buses DB and /DB are thus electrically coupled to the bit line BL and the source line SL of the selected column, respectively.

The write column selection gate WCSG electrically couples a corresponding bit line BL and source line SL together at their respective one ends in response to activation of a corresponding write column selection line WCSL.

In the data write operation, the word line driver 30 activates the write word line WWL of the selected row to supply a data write current thereto. The data write circuit 51w sets one of the data buses DB, /DB to the ground voltage VSS and the other to the power supply voltage VDD in order to supply a data write current.

In the selected column, the bit line BL and the source line SL are respectively coupled to the data buses DB, /DB through the column selection gate CSG, and are also coupled together at their respective one ends through the write column selection gate WCSG.

As a result, a reciprocating current path is formed from the data write circuit 51w, data bus DB, bit line BL, write column selection gate WCSG, source line SL, data bus /DB and data write circuit 51w. Thus, a data write current ±Iw of the direction corresponding to the write data level can be supplied to the bit line of the selected column.

In the data write operation, a current of the opposite directions is thus applied to the bit line BL and the source line SL of the selected column. The bit lines BL and the source lines SL are arranged such that the magnetic fields resulting from the current flowing through the bit line BL and the source line SL have the same direction in the magnetic tunnel junction MTJ.

Figure 26:
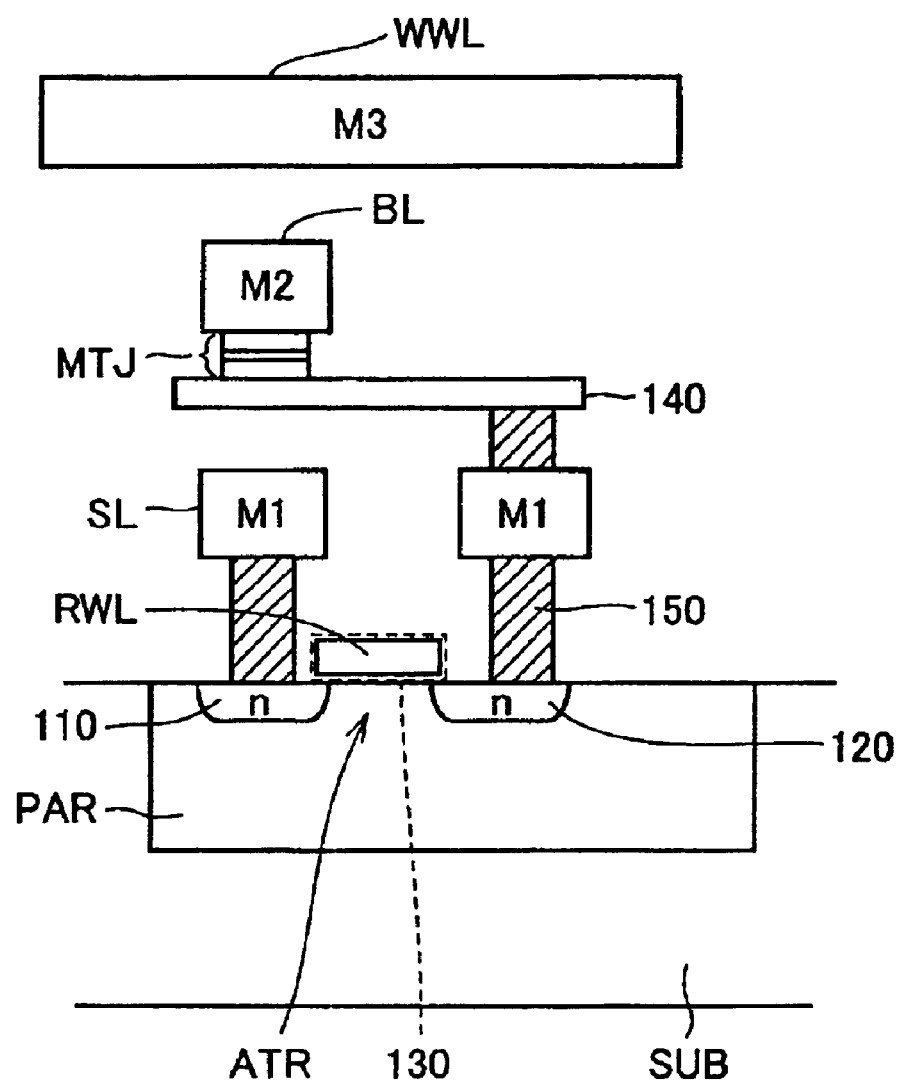
FIG. 26 is a structural diagram showing the arrangement of a bit line and a source line of FIG. 25.

Referring to FIG. 26, an access transistor ATR is formed in a p-type region PAR of a semiconductor main substrate SUB. The access transistor ATR has source/drain regions (n-type regions) 110, 120 and a gate 130. The source/drain region 110 is coupled to the source line SL formed in a first metal wiring layer M1.

The bit line BL is formed in a second metal wiring layer M2, and coupled to the magnetic tunnel junction MTJ. The write word line WWL is formed in a third metal wiring layer M3. In the data write operation, a data write current for generating a magnetic field of prescribed magnitude or more must be applied to the write word line WWL and the bit line BL. Accordingly, the bit line BL and the write word line WWL are formed from a metal wiring.

Since the read word line RWL is provided in order to control the gate voltage of the access transistor ATR, a current need not be actively applied to the read word line RWL. Accordingly, from the standpoint of improved integration, the read word line RWL is formed from a polysilicon layer, polycide structure or the like in the same wiring layer as that of the gate 130 without providing an additional independent metal wiring layer.

The source/drain region 120 of the access transistor ATR is electrically coupled to the magnetic tunnel junction MTJ through a metal film 150 formed in a contact hole, the first metal wiring layer M1 and a barrier metal 140. The barrier metal 140 serves as a buffer material for electrically coupling the magnetic tunnel junction MTJ and the metal wiring to each other.

Thus, the bit line BL and the source line SL are formed in the different metal wiring layers so as to interpose the magnetic tunnel junction MTJ therebetween in the vertical direction. In the data write operation, the magnetic fields generated in the magnetic tunnel junction MTJ from the currents of the opposite directions flowing through the bit line BL and the source line SL interact with each other in a constructive manner. As a result, the data write current flowing through the bit line BL in the data write operation can be reduced, allowing for reduced power consumption and reduced bit line current density in the data write operation. Such a reduced bit line current density enables improved reliability and suppressed magnetic noise to adjacent cells.

Referring back to FIG. 25, a data read circuit 54r includes a precharging transistor 59a and a driving transistor 59b both corresponding to the data bus /DB, in addition to the data read circuit 51r corresponding to the data bus DB.

Since the data read circuit 51r have the same structure as that shown in FIG. 3, detailed description thereof will not be repeated. The data read circuit 51r precharges the data bus DB to the power supply voltage VDD before data read operation. The data bus /DB is also precharged to the power supply voltage VDD through the precharging transistor 59a at the same timing as that of the data bus DB. Similarly, each bit line BL is also precharged to the power supply voltage VDD before data read operation.

In the data read operation, the precharging transistor 59a is turned OFF, whereas the driving transistor 59b is turned ON in response to a control signal RE. The write column selection gates WCSG are turned OFF.

The data buses DB, /DB are respectively coupled to the bit line BL and the source line SL of the selected column through the column selection gate CSG of the selected column. The source line SL is responsively driven to the ground voltage VSS, whereby the voltage on the data bus DB coupled to the selected memory cell changes in the same manner as that shown in FIG. 4. Thus, the data read operation can be conducted in the same manner as that of the first embodiment.

Note that it is also possible to precharge the data bus DB to the ground voltage VSS and drive the bit line BL and the source line SL of the selected column to the power supply voltage VDD in the data write operation. In this case, the data read circuit 51r included in the data read circuit 54r is replaced with the data read circuit 52r of FIG. 6, and the precharging transistor 59a is disposed between the ground voltage VSS and the data bus /DB as well as the driving transistor 59b is disposed between the power supply voltage VDD and the data bus /DB. At this time, it is desirable to use N-type and P-type MOS transistors as the precharging transistor 59a and the driving transistor 59b, respectively.

First Modification of Third Embodiment

Figure 27:
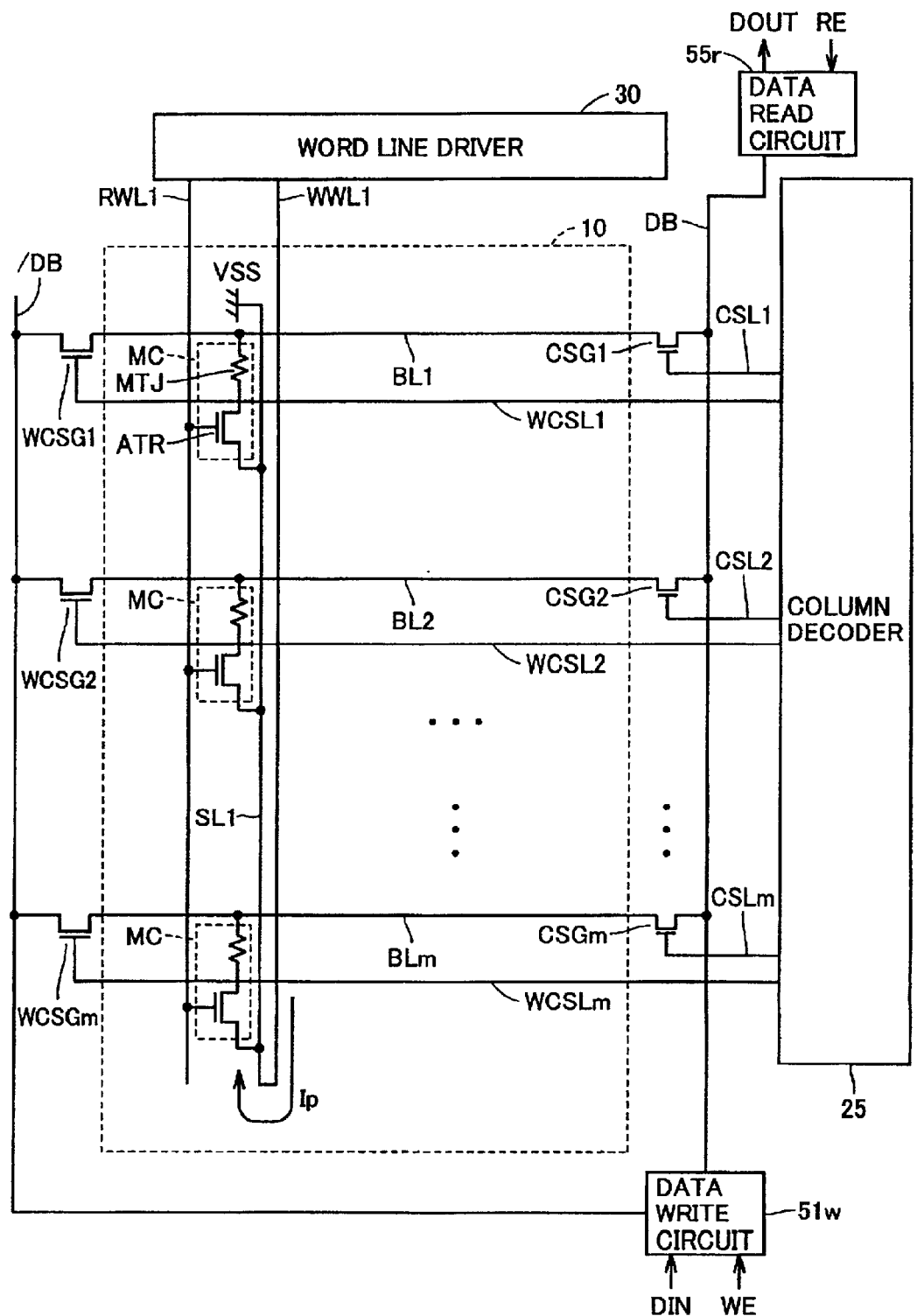
FIG. 27 is a conceptual diagram showing the structure of a memory array 10 and its peripheral circuitry according to a first modification of the third embodiment.

Referring to FIG. 27, in the structure of the first modification of the third embodiment, the memory array 10 includes memory cells MC arranged in n rows by m columns. In the memory array 10, read word lines RWL, write word lines WWL and source lines SL are provided respectively corresponding to the memory cell rows. Bit lines BL are provided respectively corresponding to the memory cell columns.

FIG. 27 exemplarily shows the write word line WWL1, read word line RWL1, source line SL1, bit lines BL1, BL2, BLm, and some memory cells corresponding to the first row and the first, second and $m^{th}$ rows.

Each source line SL is coupled to the ground voltage VSS at its one end located at the word line driver 30. The other end of each source line SL is electrically coupled to the write word line WWL of the same row in the region located opposite to the word line driver 30 with the memory array 10 interposed therebetween. The word line current control circuit 40 for coupling the write word lines WWL to the ground voltage VSS is eliminated from the region located opposite to the word line driver 30 with the memory array 10 interposed therebetween.

In the data write operation, the word line driver 30 activates the write word line WWL of the selected row to H level (power supply voltage VDD). Thus, in the selected row, a reciprocating current path is formed from the word line driver 30, write word line WWL, junction (which is located opposite to the word line driver 30), source line SL, and ground voltage VSS (at the word line driver 30), and a data write current Ip of a fixed direction is applied to the write word line WWL.

Thus, in the data write operation, a current of the opposite directions is applied to the write word line WWL and the source line SL of the selected row. The write word lines WWL and the source lines SL are arranged such that the magnetic fields resulting from the current flowing through the write word line WWL and the source line SL have the same direction in the magnetic tunnel junction MTJ.

Figure 28:
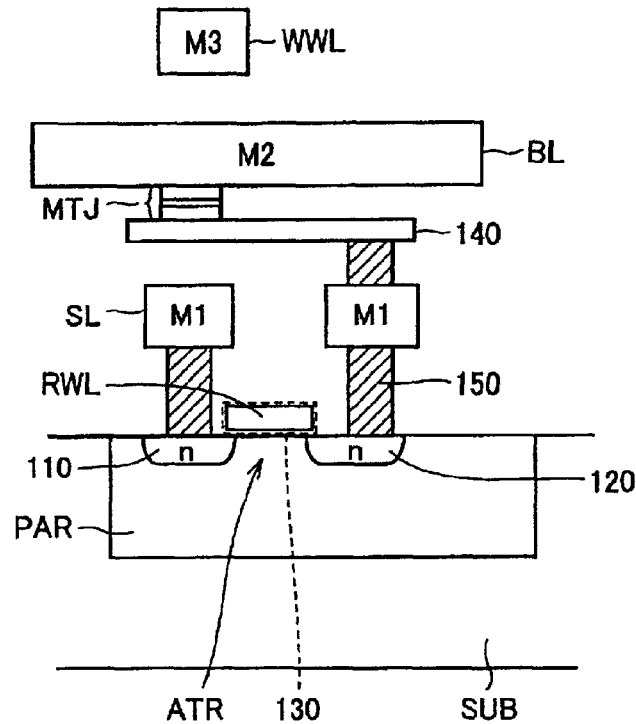
FIG. 28 is a structural diagram showing the arrangement of a write word line and a source line of FIG. 27.

Referring to FIG. 28, the access transistor ATR, magnetic tunnel junction MTJ, source line SL, bit line BL, write word line WWL and read word line RWL are arranged in the same manner as that of FIG. 26. Accordingly, the write word line WWL and the source line SL are formed in the different metal wiring layers so as to interpose the magnetic tunnel junction MTJ therebetween in the vertical direction.

As a result, in the data write operation, the magnetic fields generated in the magnetic tunnel junction MTJ from the currents of the opposite directions flowing through the write word line WWL and the source line SL interact with each other in a constructive manner. As a result, the data write current flowing through the write word line WWL in the data write operation can be reduced, allowing for reduced power consumption and reduced write word line current density in the data write operation. Such a reduced write word line current density enables improved reliability and suppressed magnetic noise to adjacent cells.

Referring back to FIG. 27, the data buses DB and /DB extending in the same direction as that of the read word line RWL and the write word line WWL are respectively provided in the opposite regions with the memory array 10 interposed therebetween.

The column selection gates CSG are respectively provided between the data bus DB and the bit lines BL. The write column selection gates WCSG are respectively provided between the data bus /DB and the bit lines BL. The column selection gate CSG and the write column selection gate WCSG are turned ON in response to activation of a corresponding column selection line CSL and write column selection line WCSL, respectively.

In the data write operation, the bit line BL of the selected column is electrically coupled between the data buses DB, /DB. The data write circuit 51w sets one of the data buses DB, /DB to the ground voltage VSS and the other to the power supply voltage VDD in order to supply a data write current. Thus, a data write current ±Iw of the direction corresponding to the write data level can be supplied to the bit line of the selected column.

A data read circuit 55r produces read data DOUT based on a change in voltage on the data bus DB.

Figure 29:
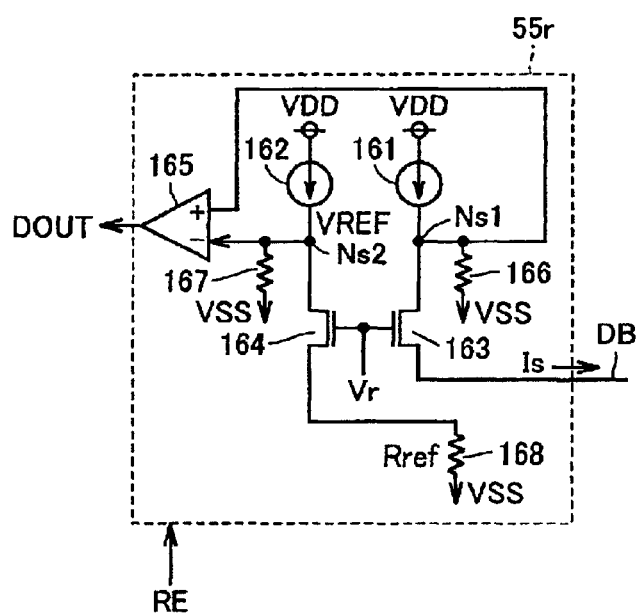
FIG. 29 is a circuit diagram showing the structure of a data read circuit of FIG. 27.

Referring to FIG. 29, the data read circuit 55r operates in response to a control signal RE that is activated in the data read operation.

The data read circuit 55r includes current sources 161, 162 for receiving the power supply voltage VDD and supplying a constant current to nodes Ns1, Ns2, respectively, an N-type MOS transistor 163 electrically coupled between the node Ns1 and the data bus DB, an N-type MOS transistor 164 and a resistance 168 which are coupled in series between the node Ns2 and the ground voltage VSS, and an amplifier 165 for amplifying the difference in voltage level between the nodes Ns1, Ns2 and outputting read data DOUT.

The transistors 163, 164 receive a prescribed voltage Vr at their respective gates. The current supply amount of the current sources 161, 162 and the prescribed voltage Vr are set according to the design value of the sense current Is. Resistances 166, 167 are provided in order to pull down the nodes Ns1, Ns2 to the ground voltage VSS, respectively.

With such a structure, the data read circuit 55r supplies a constant sense current Is to the data bus DB in the data read operation. The write column selection gates WCSG are turned OFF in the data read operation. Therefore, the sense current Is is supplied to a current path formed between the data read circuit 55r and the ground voltage VSS, i.e., a current path formed from the data read circuit 55r, data bus DB, column selection gate CSG, bit line BL, selected memory cell, source line SL, and ground voltage VSS.

Thus, a change in voltage on the bit line BL according to the storage data level in the selected memory cell can be transmitted to the node Ns1. By designing the resistance 168 with the same electric resistance value Rref as that of the dummy resistance MTJd of FIG. 8, the reference voltage VREF can be produced on the node Ns2.

The data read circuit 55r can read the storage data level of the selected memory cell by amplifying the voltage difference between the nodes Ns1, Ns2.

Second Modification of Third Embodiment

Figure 30:
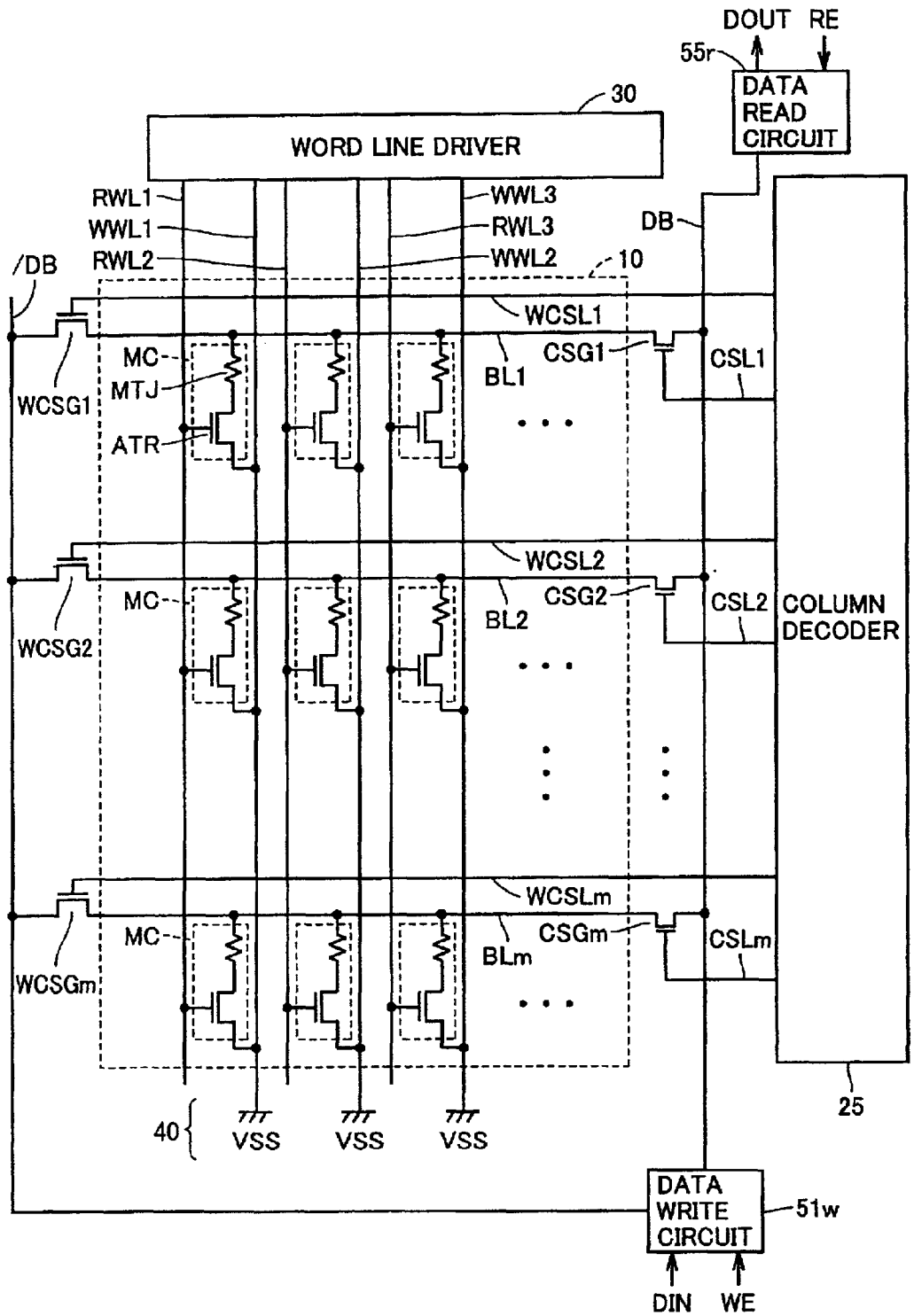
FIG. 30 is a conceptual diagram showing the structure of a memory array 10 and its peripheral circuitry according to a second modification of the third embodiment.

Referring to FIG. 30, in the structure of the second modification of the third embodiment, the write word line WWL also serves as a source line SL in the data read operation. The word line current control circuit 40 couples each write word line WWL to the ground voltage VSS. In the data read operation, the word line driver 30 couples one end of each write word line WWL to the ground voltage VSS so as to retain the write word lines WWL inactive (L level).

Accordingly, although the source lines SL are eliminated, the data read operation can be conducted in the same manner as that of FIG. 27 with the memory cells on the selected row being electrically coupled between the respective bit lines BL1 to BLm and the ground voltage VSS. As a result, the number of wirings is reduced, achieving reduced device size and simplified manufacturing process.

In the data write operation, the word line driver 30 couples one end of the write word line WWL to the power supply voltage VDD, thereby activating the write word line WWL, as in the case of FIG. 25. A data write current is applied to the activated write word line WWL in the direction from the word line driver 30 toward the word line current control circuit 40.

By using the data write circuit 51w, column selection gate CSG, write column selection gate WCSG and data buses DB, /DB arranged in the same manner as that of FIG. 27, a data write current is supplied to the bit line BL in the same manner as that of the first modification of the third embodiment.

Third Modification of Third Embodiment

Figure 31:
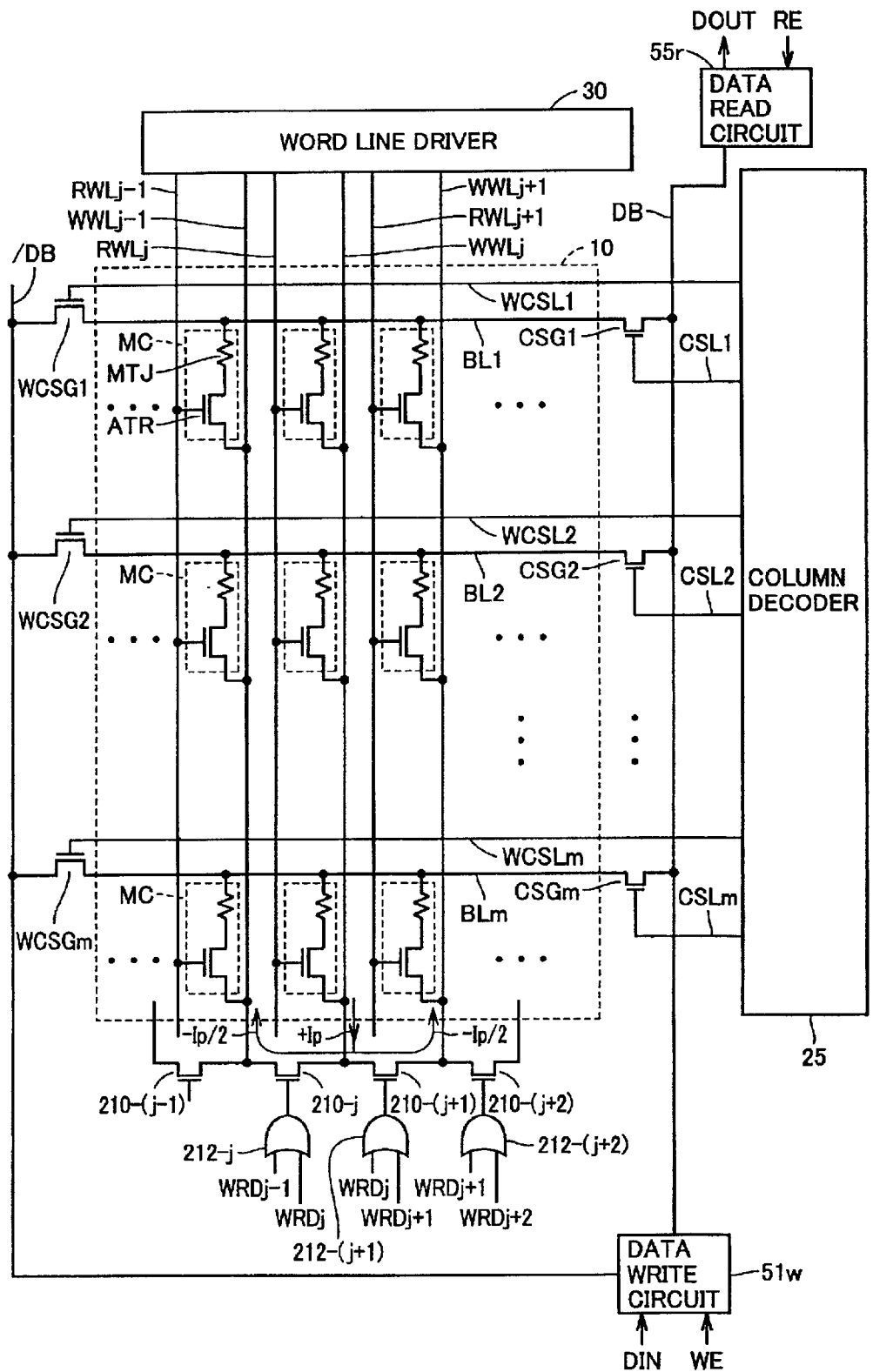
FIG. 31 is a conceptual diagram showing the structure of a memory array 10 and its peripheral circuitry according to a third modification of the third embodiment.

Referring to FIG. 31, in the third modification of the third embodiment, write word line coupling switches are added to the structure of FIG. 30. Each write word line WWL is provided with write word line coupling switches that are respectively coupled between that write word line WWL and a plurality of other write word lines WWL.

In FIG. 31, a write word line coupling switch is exemplarily provided between every adjacent two write word lines WWL. More specifically, for the $j^{th}$ write word line WWLj, the write word line coupling switches 210-$j$ and 210($j$+1) are provided between the $j^{th}$ write word line WWLj and its adjacent write word lines WWLj−1 and WWLj+1, respectively.

The word line current control circuit 40 for coupling the write word lines WWL to the ground voltage VSS is eliminated from the region located opposite to the word line driver 30 with the memory array 10 interposed therebetween.

Each write word line coupling switch is turned ON when one of the two write word lines coupled thereto is selected. For example, the write word line coupling switch 210-$j$ is turned ON when the output of a logic gate 212-$j$ is at H level. The logic gate 212-$j$ outputs the OR logic operation result of write row decode signals WRDj−1 and WRDj that are respectively activated (H level) when the $(j-1)^{th}$ and $j^{th}$ rows are selected in the data write operation.

Thus, the write word line coupling switch 210-$j$ electrically couples the write word lines WWLj and WWLj−1 to each other when the $(j-1)^{th}$ row or the $j^{th}$ row is selected in the data write operation. The same write word line coupling switch is provided between every adjacent two write word lines.

For example, when the $i^{th}$ row is selected for the data write operation, the write word line WWLj is electrically coupled to the write word lines WWLj−1 and WWLj+1. The word line driver 30 activates the write word line WWLj of the selected row, so that the write word line WWLj is coupled to the power supply voltage VDD at its one end. Since the write word lines WWLj−1 and WWLj+1 correspond to the non-selected rows, the word line driver 30 couples the write word lines WWLj−1 and WWLj+1 to the ground voltage VSS at their respective one ends.

Thus, a return path of the data write current Ip flowing through the write word line WWLj of the selected row can be formed from the write word lines WWLj−1 and WWLj+1 of the non-selected rows. In other words, a return current of −Ip/2 flows through each of the write word lines WWLj−1 and WWLj+1 of the non-selected rows.

The write word line of the selected row is thus electrically coupled to a plurality of write word lines of the non-selected rows in the region located opposite to the word line driver 30 with the memory array 10 interposed therebetween, thereby forming a return path of the data write current Ip. Like the magnetic field generated from the source line SL in FIG. 27, the magnetic fields respectively applied from the write word lines of the selected and non-selected rows interact with each other in a constructive manner in the selected memory cell. In the memory cell of the non-selected row, however, the magnetic fields respectively applied from the write word lines of the selected and non-selected rows cancel each other.

As a result, the data write current flowing through the write word line WWL in the data write operation can be reduced, allowing for reduced power consumption and reduced write word line current density in the data write operation. Such a reduced write word line current density enables improved reliability and suppressed magnetic noise to adjacent cells.

By forming a return path of the data write current Ip from a plurality of write word lines WWL of the non-selected rows, a return current flowing through each of the write word lines WWL of the non-selected rows can be suppressed to such a level that prevents the data to be erroneously written to the memory cell of a corresponding non-selected row.

Note that, in FIG. 31, each write word line WWL is provided with write word line coupling switches respectively coupled between that write word line WWL and its adjacent two write word lines WWL. However, the write word line coupling switches may alternatively be coupled to any other write word lines WWL.

Fourth Modification of Third Embodiment

Figure 32:
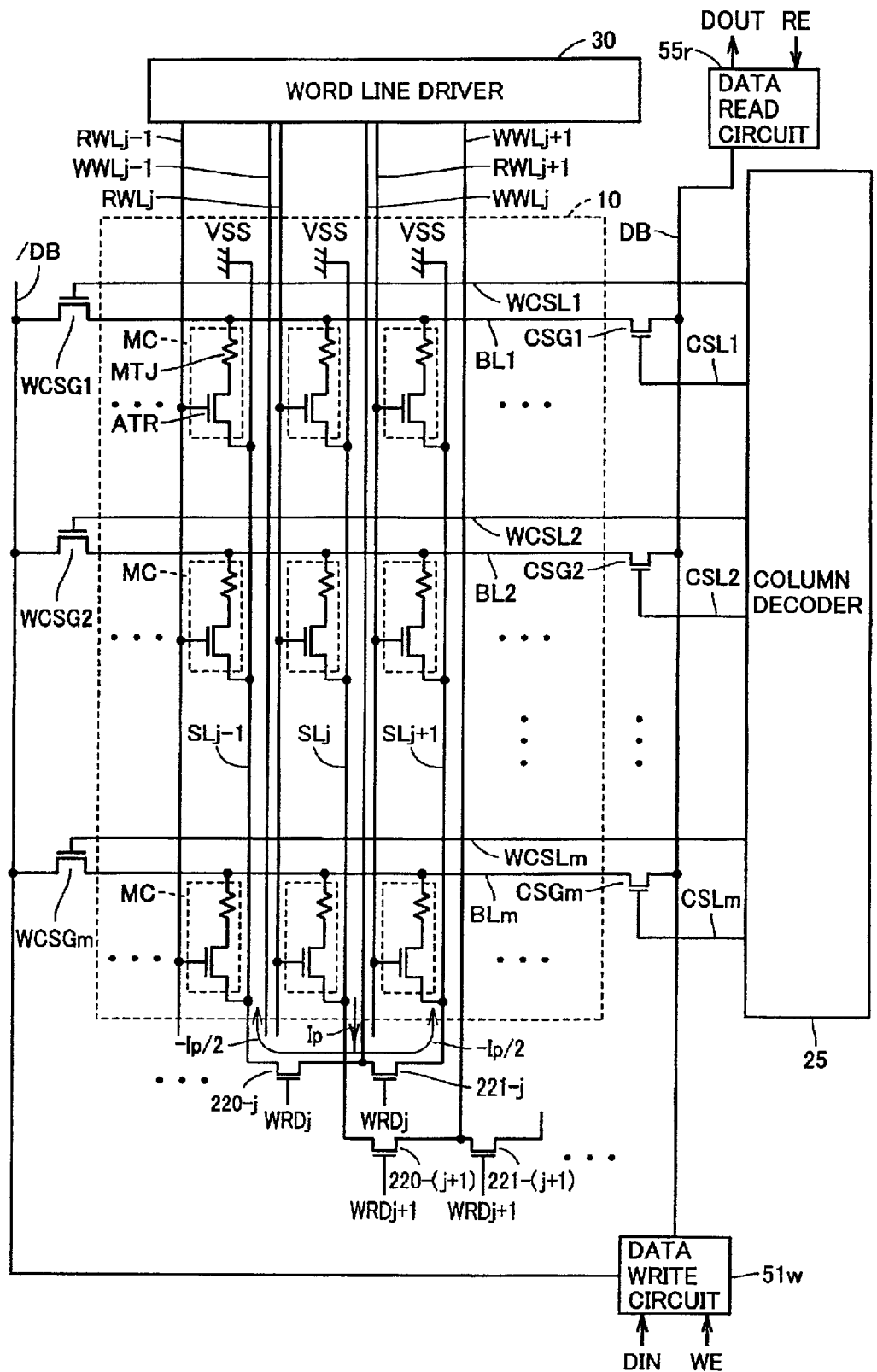
FIG. 32 is a conceptual diagram showing the structure of a memory array 10 and its peripheral circuitry according to a fourth modification of the third embodiment.

Referring to FIG. 32, in the fourth modification of the third embodiment, the write word lines WWL and the source lines SL are provided independently. The source lines SL are provided respectively corresponding to the memory cell rows, and coupled to the ground voltage VSS at their respective one ends located at the word line driver 30.

For each write word line WWL, a write word line coupling switch is provided between that write word line WWL and at least one source line SL of another row. The write word line coupling switches are provided in the region located opposite to the word line driver 30 with the memory array 10 interposed therebetween.

In FIG. 32, each write word line WWL is exemplarily provided with write word line coupling switches that are respectively coupled between that write word line WWL and the source lines SL of adjacent two rows. More specifically, the write word line WWLj of the $j^{th}$ row is provided with the write word line coupling switches 220-$j$ and 221-$j$. The write word line coupling switches 220-$j$ and 221-$j$ are electrically coupled between the write word line WWLj and the source lines SLj−1 and SLj+1 of adjacent memory cell rows, respectively.

The word line current control circuit 40 for coupling the write word lines WWL to the ground voltage VSS is eliminated from the region located opposite to the word line driver 30 with the memory array 10 interposed therebetween.

Each write word line coupling switch is turned ON when a corresponding write word line WWL is selected. For example, the write word line coupling switches 220-$j$ and 221-$j$ are turned ON in response to activation of a write row decode signal WRDj. The same write word line coupling switches are provided for the other write word lines WWL.

For example, when the $j^{th}$ row is selected for the data write operation, the write word line WWLj is electrically coupled to the source lines SLj−1 and SLj+1. The word line driver 30 activates the write word line WWLj of the selected row, so that the write word line WWLj is coupled to the power supply voltage VDD at its one end. The source lines SLj−1 and SLj+1 are coupled to the ground voltage VSS at their respective one ends located at the word line driver 30.

Thus, a return path of the data write current Ip flowing through the write word line WWLj of the selected row can be formed from the source lines SLj−1 and SLj+1 of other rows. In other words, a return current of −Ip/2 flows through each of the source lines SLj−1, SLj+1.

The write word line of the selected row is thus electrically coupled to a plurality of source lines of the non-selected rows in the region located opposite to the word line driver 30 with the memory array 10 interposed therebetween, thereby forming a return path of the data write current Ip. In the selected memory cell, the magnetic fields respectively applied from the source line of the non-selected row and the write word line of the selected row interact with each other in a constructive manner. In the memory cell of the non-selected row, however, the magnetic fields respectively applied from the write word line of the selected row and the source line of the non-selected row cancel each other.

As a result, as in the third modification of the third embodiment, reduced power consumption and reduced write word line current density are achieved in the data write operation. Such a reduced write word line current density enables improved reliability and suppressed magnetic noise to adjacent cells.

By forming a return path of the data write current Ip from a plurality of source lines SL of other memory cell rows, a return current flowing through each of the source lines SL can be suppressed to such a level that prevents the data to be erroneously written to the memory cell of a corresponding non-selected row.

Note that, in FIG. 32, each write word line WWL is provided with write word line coupling switches respectively coupled between that write word line WWL and the source lines SL of its adjacent rows. However, the write word line coupling switches may alternatively be coupled to any other source lines WWL.

Fourth Embodiment

The structure for reducing the power consumption in the data read operation using a dummy memory cell is described in the fourth embodiment.

Figure 33:
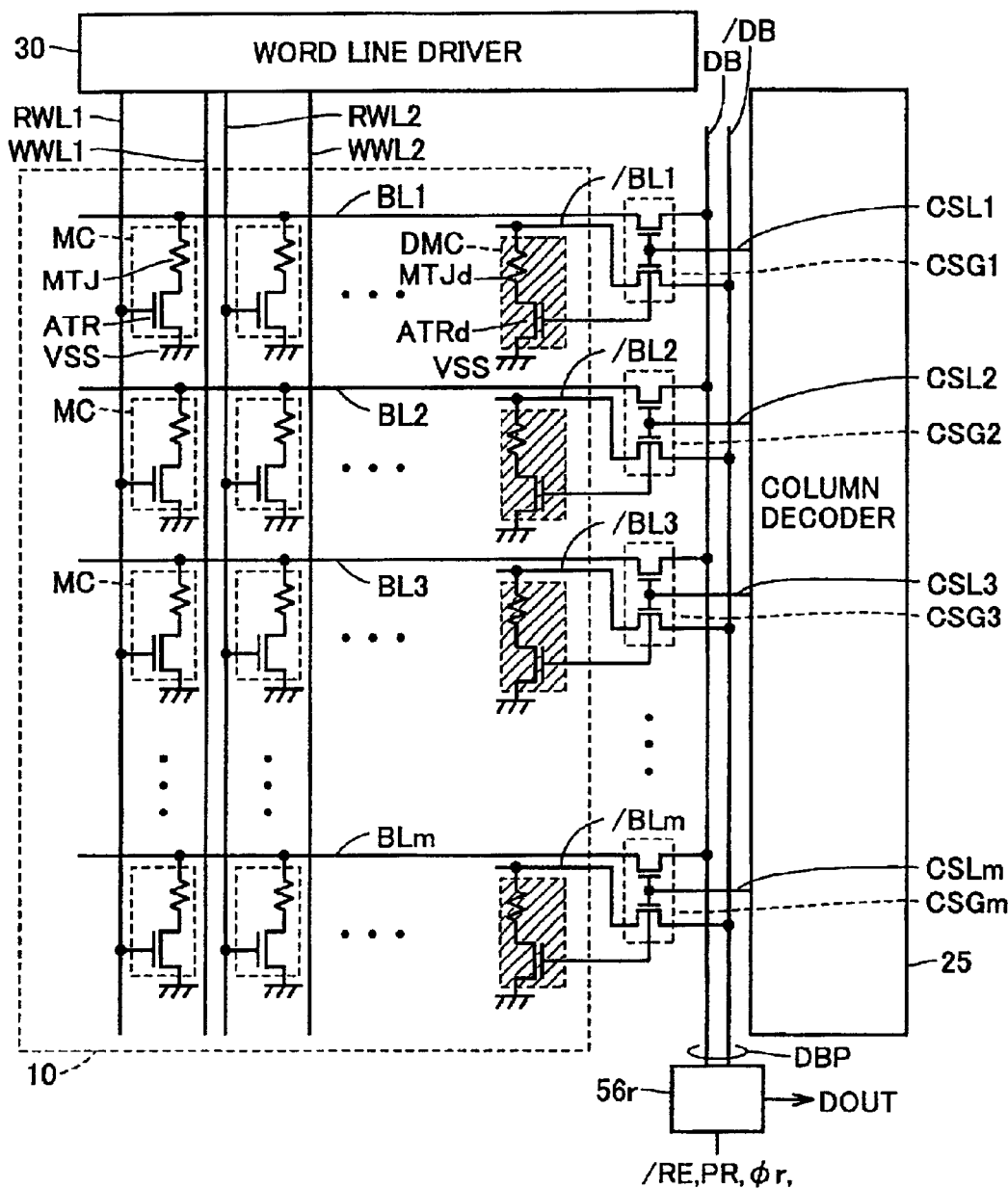
FIG. 33 is a conceptual diagram showing the structure of a memory array 10 and its peripheral circuitry according to a fourth embodiment of the present invention.

FIG. 33 shows the structure of a memory array 10 and its peripheral circuitry according to the fourth embodiment. FIG. 33 mainly shows the structure associated with the data read operation.

Referring to FIG. 33, in the memory array 10, read word lines RWL and write word lines WWL are provided respectively corresponding to the memory cell rows, and bit lines BL, /BL are provided respectively corresponding to the memory cell columns. When a corresponding read word line RWL is activated, each memory cell MC is electrically coupled between a corresponding bit line BL and the ground voltage VSS in response to turning ON of the access transistor ATR.

FIG. 33 exemplarily shows the write word lines WWL1, WWL2, read word lines RWL1, RWL2, bit lines BL1, BL2, BL3, BLm and some memory cells corresponding to the first and second rows and the first, second, third and $m^{th}$ columns.

Data buses DB, /DB of a data bus pair are provided in a region adjacent to the memory array 10 so as to extend in the same direction as that of the read word lines RWL and write word lines WWL.

Column selection gates CSG1 to CSGm are provided respectively corresponding to the memory cell columns. Each column selection gate CSG is turned ON in response to activation of a corresponding column selection line CSL, and electrically couples the corresponding bit lines BL, /BL to the data buses DB, /DB, respectively. In the data read operation, the selected memory cell is thus electrically coupled between the data bus DB and the ground voltage VSS.

Moreover, m dummy memory cells DMC are provided respectively corresponding to the memory cell columns. Since the dummy memory cells DMC have the same structure as that of FIG. 8, detailed description thereof will not be repeated. A dummy access transistor ATRd is turned ON in response to activation of a corresponding column selection line CSL. The dummy memory cell corresponding to the turned ON dummy access transistor ATRd is activated to be electrically coupled between the data bus /DB and the ground voltage VSS.

Accordingly, only the dummy memory cell DMC on the selected column is activated in the data read operation. No charging/discharging current is produced on the bit lines /BL of the non-selected columns, allowing for reduction in power consumption in the data read operation.

A data read circuit 56r senses the voltage difference between the data bus DB electrically coupled to the selected memory cell MC and the data bus /DB electrically coupled to the dummy memory cell DMC, thereby producing read data DOUT.

Figure 34:
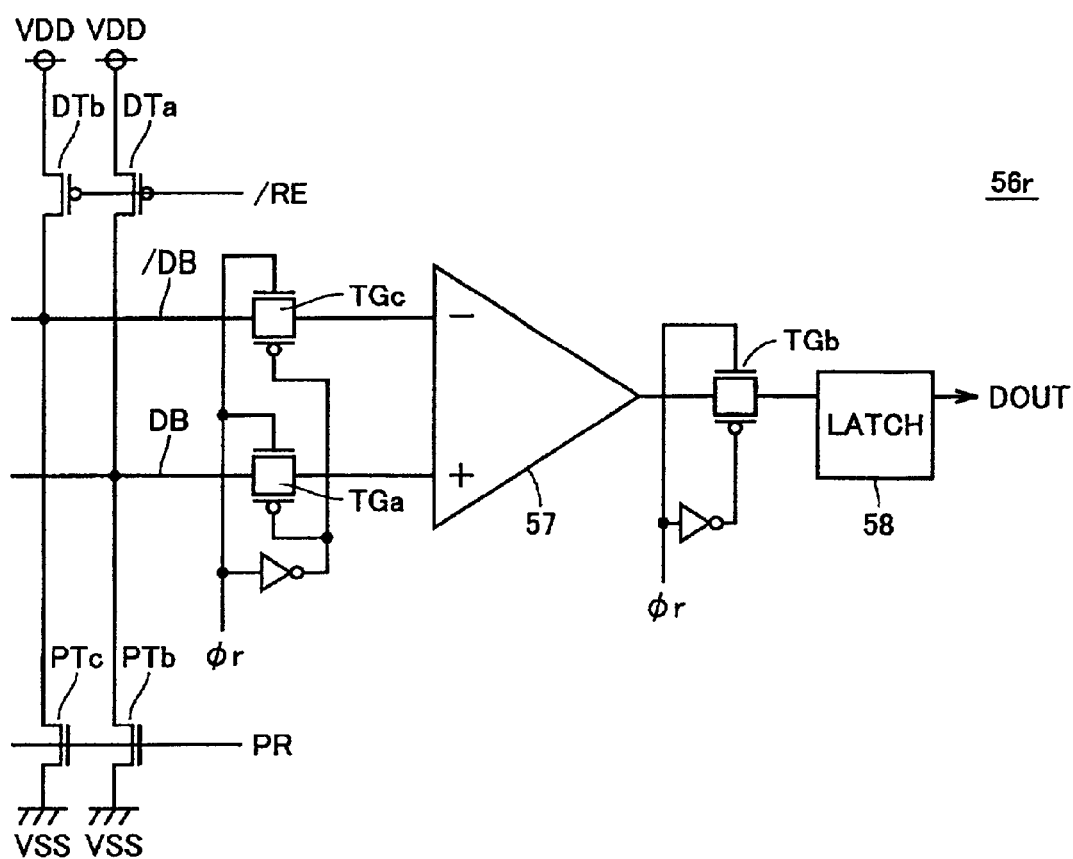
FIG. 34 is a circuit diagram showing the structure of a data read circuit of FIG. 33.

Referring to FIG. 34, the data read circuit 56r further includes driving transistors DTa and DTb in addition to the elements of the data read circuit 53r of FIG. 9. Since the structure of the data read circuit 56r is otherwise the same as that of the data read circuit 56r, detailed description thereof will not be repeated.

The driving transistors DTa, DTb are electrically coupled between the power supply voltage VDD and the data buses DB, /DB, respectively. The driving transistors DTa, DTb are turned ON/OFF in response to a control signal /RE that is activated to L level in the data read operation. Accordingly, in the data read operation, the data buses DB, /DB are driven with the power supply voltage VDD.

Figure 35:
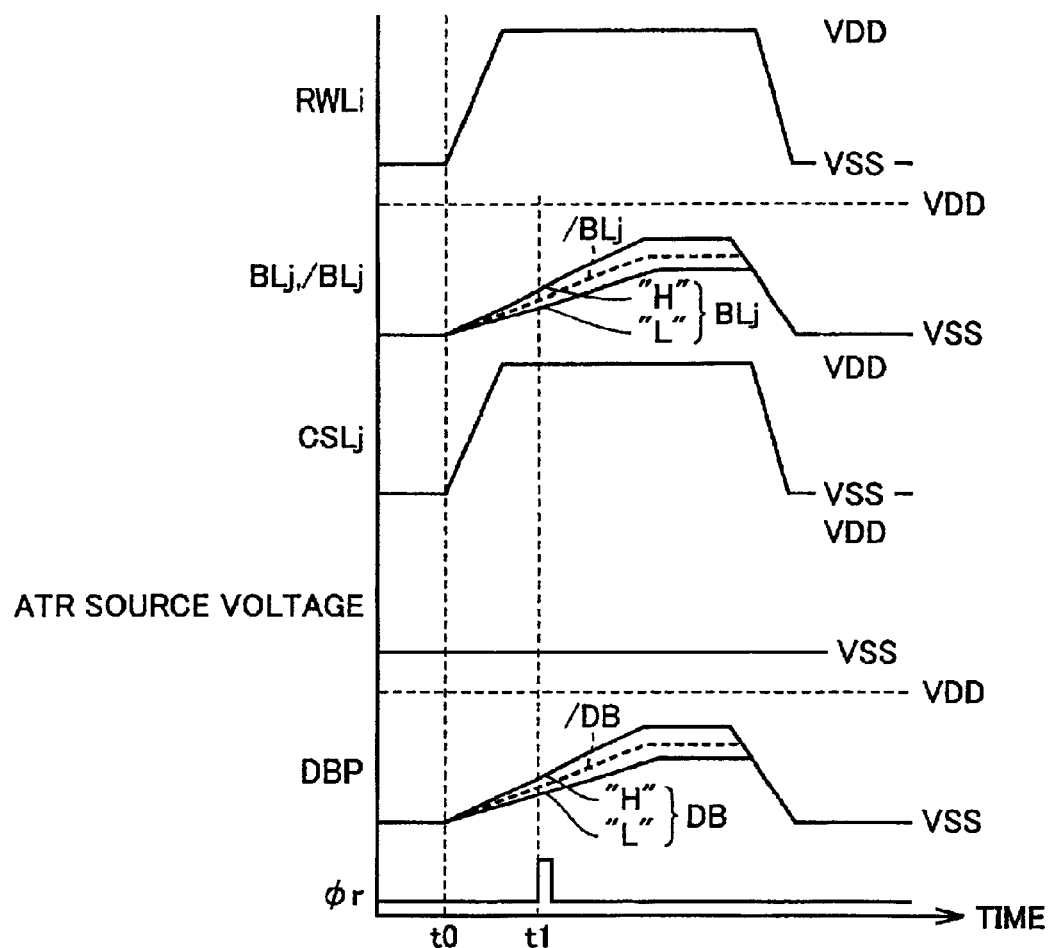
FIG. 35 is a timing chart illustrating the data read operation according to the fourth embodiment.

Referring to FIG. 35, the bit lines BL, /BL, and the data buses DB, /DB are precharged to the ground voltage VSS before data read operation. Note that, in each memory cell, the source voltage of the access transistor ATR is fixed to the ground voltage VSS.

At time t0, the data read operation is started, whereby the read word line RWLi and the column selection line CSLj corresponding to the selected memory cell are activated. In response to this, the selected memory cell and the dummy memory cell of the selected column are electrically coupled between the data buses DB, /DB and the ground voltage VSS, respectively.

Thus, a sense current (data read current) flows between the data buses DB, /DB driven to the power supply voltage VDD by the data read circuit 56r and the ground voltage VSS to which the data lines DB, /DB are electrically coupled through the selected memory cell MC and the dummy memory cell DMC, respectively.

As a result, the voltages on the bit lines BL, /BL and the data buses DB, /DB change according to the electric resistance value of the memory cell or dummy memory cell electrically coupled thereto. As in the second modification of the first embodiment, the voltage difference between the data buses DB and /DB is sensed and amplified at prescribed time t1 in response to a trigger pulse ϕr. Thus, the storage data can be read from the selected memory cell.

Accordingly, the data read operation can be conducted with a large signal margin while suppressing power consumption in the dummy memory cells. Note that, since the bit lines BL, /BL and the data buses DB, /DB are driven with the power supply voltage, the voltages on the data buses DB, /DB are settled to different values. By comparing the settled voltages, i.e., by activating the trigger pulse ϕr after settling of the voltages on the data buses DB, /DB, further stabilized data read operation can be implemented.

In order to accurately conducting the data read operation using the dummy memory cell DMC, the data buses DB, /DB and the bit lines BL, /BL must be designed so that first and second current paths formed between the data read circuit 56r and the ground voltage VSS, i.e., first and second current paths respectively including the selected memory cell MC and the dummy memory cell DMC, have the same electric resistance value.

First Modification of Fourth Embodiment

The arrangement of dummy memory cells in the folded bit line structure is shown in the first modification of the fourth embodiment.

Figure 36:
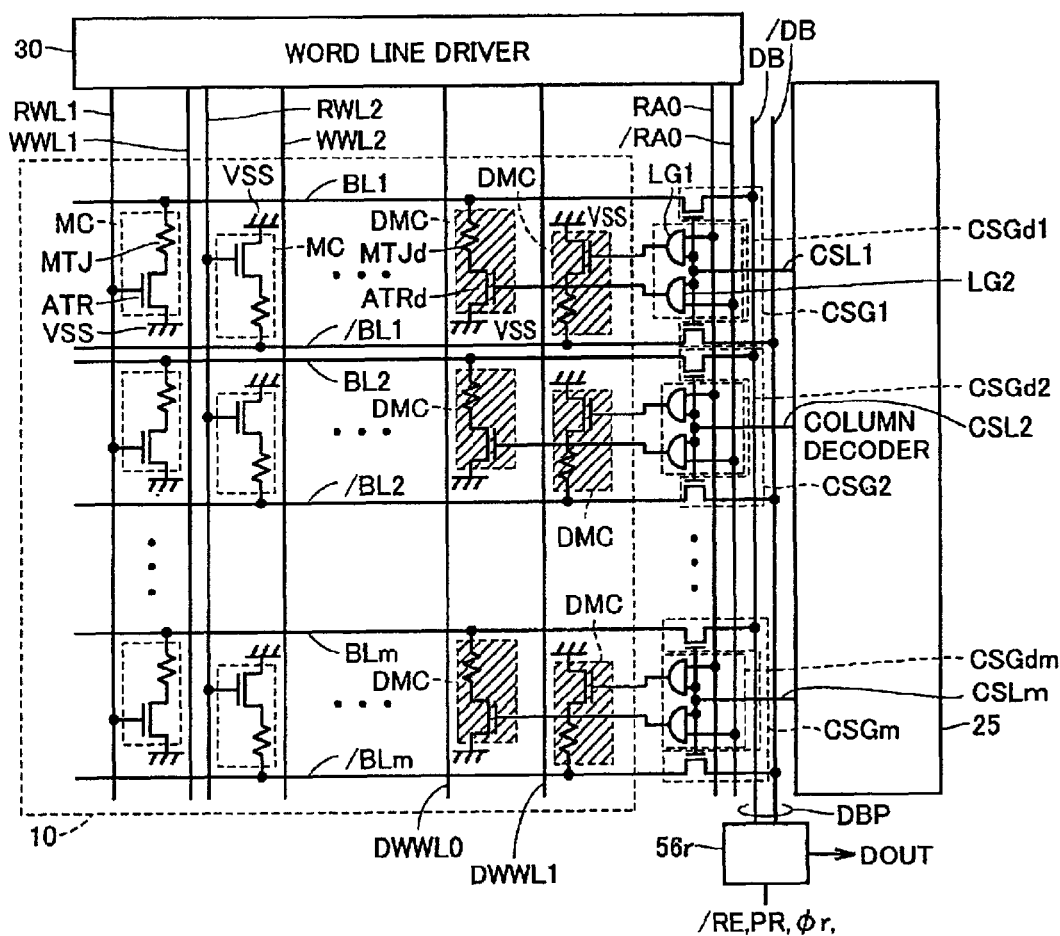
FIG. 36 is a conceptual diagram showing the structure of a memory array 10 and its peripheral circuitry according to a first modification of the fourth embodiment.

Referring to FIG. 36, in the structure of the first modification of the fourth embodiment, the bit lines BL, /BL are arranged based on the folded bit line structure. In each memory cell column, the memory cells MC are alternately provided between the bit lines BL, /BL and the ground voltage VSS. More specifically, the memory cells are provided between the bit line BL and the ground voltage VSS in odd rows, and provided between the bit line /BL and the ground voltage VSS in even rows.

Two dummy memory cells DMC are provided in every memory cell column. In each memory cell column, two dummy memory cells DMC are electrically coupled between the bit lines BL, /BL and the ground voltage VSS, respectively.

Column selection gates CSG are provided respectively corresponding to the memory cell columns. The column selection gate CSG is turned ON/OFF in response to a corresponding column selection line CSL. The bit lines BL, /BL of the selected row are electrically coupled to the data buses DB, /DB, respectively, through a corresponding column selection gate CSG.

Dummy column selection gates CSGd1 to CSGdm are provided respectively corresponding to the memory cell columns. The dummy column selection gate CSGd1 includes a logic gate LG1 for outputting the AND logic operation result of the respective voltage levels of a control signal RA0 and the column selection line CSL1, and a logic gate LG2 for outputting the AND logic operation result of the respective voltage levels of a control signal /RA0 and the column selection line CSL1.

The control signal RA0 is set to H level when an odd row is selected, and to L level when an even row is selected. The control signal /RA0 is opposite in signal level to the control signal RA0, and is set to H level when an even row is selected.

The dummy access transistor ATRd of the dummy memory cell corresponding to the bit line /BL1 is turned ON when the output of the logic gate LG1 is at H level. The dummy access transistor ATRd of the dummy memory cell corresponding the bit line BL1 is turned ON when the output of the logic gate LG2 is at H level.

The other dummy column selection gates CSGd2 to CSGdm have the same structure.

When the selected memory cell column is an odd column, a corresponding dummy column selection gate CSGd1 to CSGdm activates the dummy memory cell provided between a corresponding bit line /BL and the ground voltage VSS. When the selected memory cell column is an even column, a corresponding dummy column selection gate CSGd1 to CSGdm activates the dummy memory cell provided between a corresponding bit line BL and the ground voltage VSS. Thus, the dummy memory cell is activated only in the selected memory cell column.

When an odd row is selected, the selected memory cell is electrically coupled between the data bus DB and the ground voltage VSS, whereas the selected dummy memory cell DMC is electrically coupled between the data bus /DB and the ground voltage VSS.

When an even row is selected, the selected memory cell is electrically coupled between the data bus /DB and the ground voltage VSS, whereas the selected dummy memory cell DMC is electrically coupled between the data bus DB and the ground voltage VSS. The data read circuit 56r produces read data DOUT in the same manner as that of the fourth embodiment, based on the voltages on the data buses DB, /DB.

Thus, the data read operation can be conducted based on the folded bit line structure that is highly resistant to the electric noise, while suppressing power consumption in the dummy memory cells.

Note that, in the fourth embodiment and the first modification thereof, it is also possible to precharge the data buses DB, /DB to the power supply voltage VDD before data read operation and disconnect the data buses DB, /DB therefrom in the data read operation, as in the first embodiment. In this case, the data read circuit 51r of FIG. 3 including also for the data bus /DB the same precharging transistor PTa and transfer gate TGa as those for the data bus DB may be used instead of the data read circuit 56r of FIGS. 33 and 36. In this structure, the voltage on the data bus /DB electrically coupled to the dummy memory cell DMC changes at an intermediate rate of the respective voltage change rates on the data bus DB when the storage data is at H level and at L level, as shown in FIG. 4. Accordingly, the data read operation can be conducted in the same manner as that of the first embodiment by comparing the voltages on the data buses DB, /DB at prescribed timing.

Second Modification of Fourth Embodiment

The arrangement of dummy memory cells in the open bit line structure is shown in the second modification of the fourth embodiment.

Figure 37:
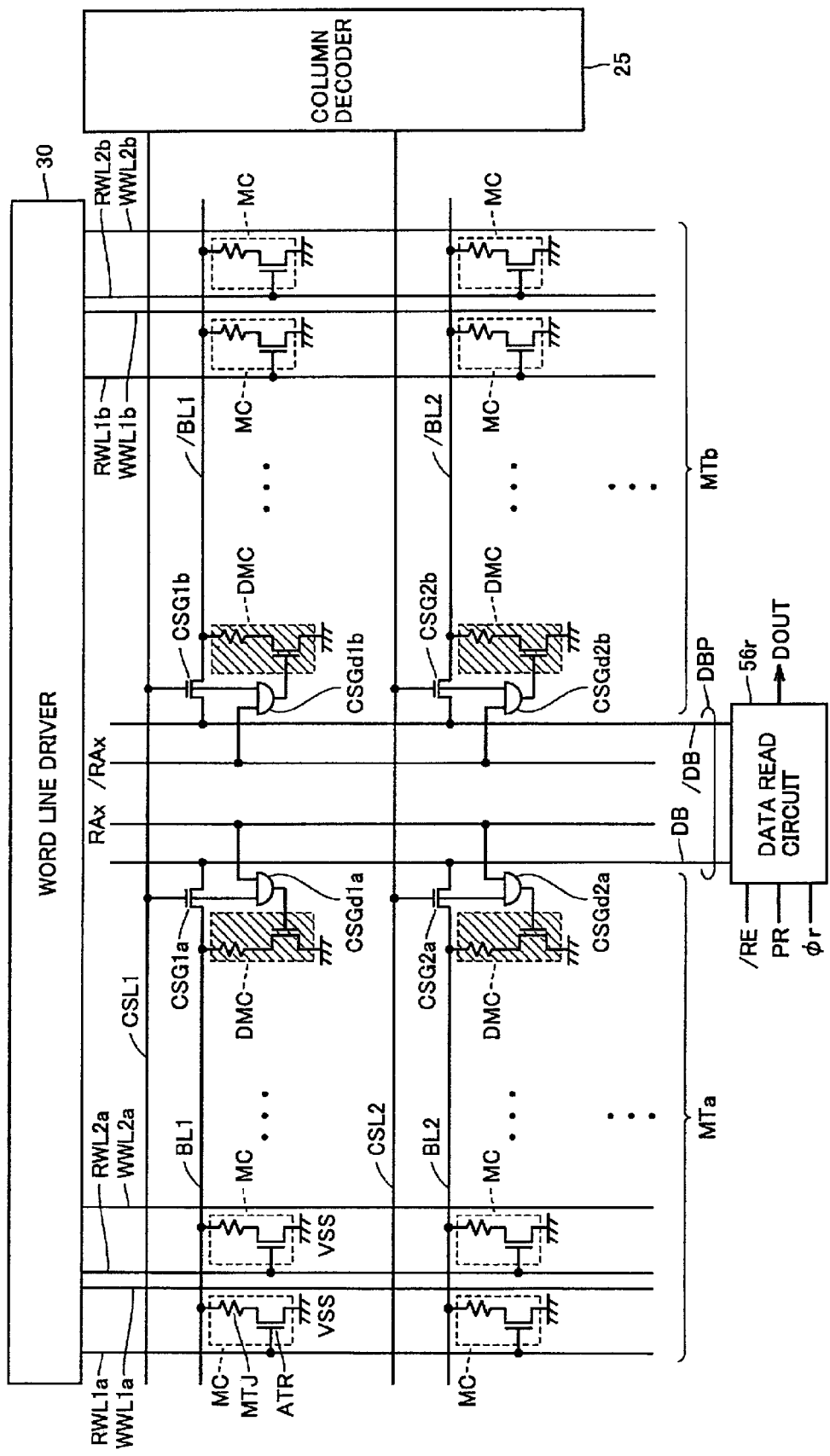
FIG. 37 is a conceptual diagram showing the structure of a memory array 10 and its peripheral circuitry according to a second modification of the fourth embodiment.

Referring to FIG. 37, in the second modification of the fourth embodiment, the memory array 10 is divided into two memory mats MTa and MTb in the same manner as that of FIG. 11. In the memory mat MTa, read word lines RWL1a, RWL2a, ... and write word lines WWL1a, WWL2a, ... are provided respectively corresponding to the memory cell rows. In the memory mat MTb, read word lines RWL1b, RWL2b, ... and write word lines WWL1b, WWL2b, ... are similarly provided respectively corresponding to the memory cell rows. When a corresponding read word line RWL is activated, each memory cell MC is electrically coupled between a corresponding bit line BL and the ground voltage VSS in response to turning-ON of the access transistor ATR.

In either the memory mat MTa or MTb, a single row corresponding to the selected memory cell is designated, and a read word line RWL of the selected row is activated in the data read operation. The memory mats MTa, MTb share the column selection lines CSL. A single column selection line CSL of the selected column is selectively activated to H level.

When the selected memory mat is located in the memory mat MTa, a control signal RAx is set to H level, and a control signal /RAx is set to L level. On the other hand, when the selected memory mat is located in the memory mat MTb, the control signal /RAx is set to H level.

The same number of bit lines corresponding to the memory cell columns are provided in each memory mat MTa, MTb based on a so-called open bit line structure. In FIG. 37, the bit lines in the memory mat MTa are denoted with BL1, BL2, ..., and the bit lines in the memory mat MTb are denoted with /BL1, /BL2, ...

In each memory mat MTa, MTb, a plurality of dummy memory cells DMC are arranged in a single dummy row. The plurality of dummy memory cells DMC in the memory mat MTa are respectively provided between the bit lines BL1 to BLm and the ground voltage VSS. Similarly, the plurality of dummy memory cells DMC in the memory mat MTb are respectively provided between the bit lines /BL1 to BLm and the ground voltage VSS.

In the memory mat MTa, column selection gates CSG1a, CSG2a, . . . are provided between the data bus DB and the bit lines BL1, BL2, . . . respectively. Each column selection gate CSG1a, CSG2a, . . . is turned ON/OFF in response to a corresponding column selection line CSL. In the memory mat MTb, column selection gates CSG1b, CSG2b, . . . are similarly provided between the data bus /DB and the bit lines /BL1, /BL2, . . . , respectively. Each column selection gate CSG1b, CSG2b, . . . is turned ON/OFF in response to a corresponding column selection line CSL.

Thus, the bit lines BL (in the memory mat MTa) and /BL (in the memory mat MTb) of the selected column are electrically coupled to the data buses DB and /DB, respectively.

In the memory mat MTa, dummy column selection gates CSGd1a, CSGd2a, . . . are provided respectively corresponding to the memory cell columns. In the memory mat MTb, dummy column selection gates CSGd1b, CSGd2b, . . . are provided respectively corresponding to the memory cell columns.

The dummy column selection gate CSGd1a is formed from a logic gate for outputting the AND logic operation result of the respective voltage levels of the corresponding column selection line CSL1 and the control signal RAx. The dummy column selection gates CSGd2a, . . . of the other memory cell columns have the same structure.

The dummy column selection gate CSGd1b is formed from a logic gate for outputting the AND logic operation result of the respective voltage levels of the corresponding column selection line CSL1 and the control signal /RAx. The dummy column selection gates CSGd2b, . . . of the other memory cell columns have the same structure.

When the memory mat MTa is selected, the dummy column selection gate in the memory mat MTa activates the dummy memory cell provided between a corresponding bit line BL and the ground voltage VSS in response to selection of a corresponding memory cell column.

Similarly, when the memory mat MTb is selected, the dummy column selection gate in the memory mat MTb activates the dummy memory cell provided between a corresponding bit line /BL and the ground voltage VSS in response to selection of a corresponding memory cell column. Thus, only the dummy memory cell corresponding to the selected memory cell column in the selected memory mat is activated.

Accordingly, when the memory mat MTa is selected, the selected memory cell is electrically coupled between the data bus DB and the ground voltage VSS, whereas the selected dummy memory cell DMC is electrically coupled between the data bus /DB and the ground voltage VSS.

When the memory mat MTb is selected, the selected memory cell is electrically coupled between the data bus /DB and the ground voltage VSS, whereas the selected dummy memory cell DMC is electrically coupled between the data bus DB and the ground voltage VSS. The data read circuit 56r produces read data DOUT in the same manner as that of the fourth embodiment, based on the voltages on the data buses DB, /DB.

Thus, the data read operation can be conducted based on the open bit line structure while suppressing power consumption in the dummy memory cells.

Third Modification of Fourth Embodiment

Combination of the second modification of the fourth embodiment and the first embodiment is shown in the third modification of the fourth embodiment.

Figure 38:
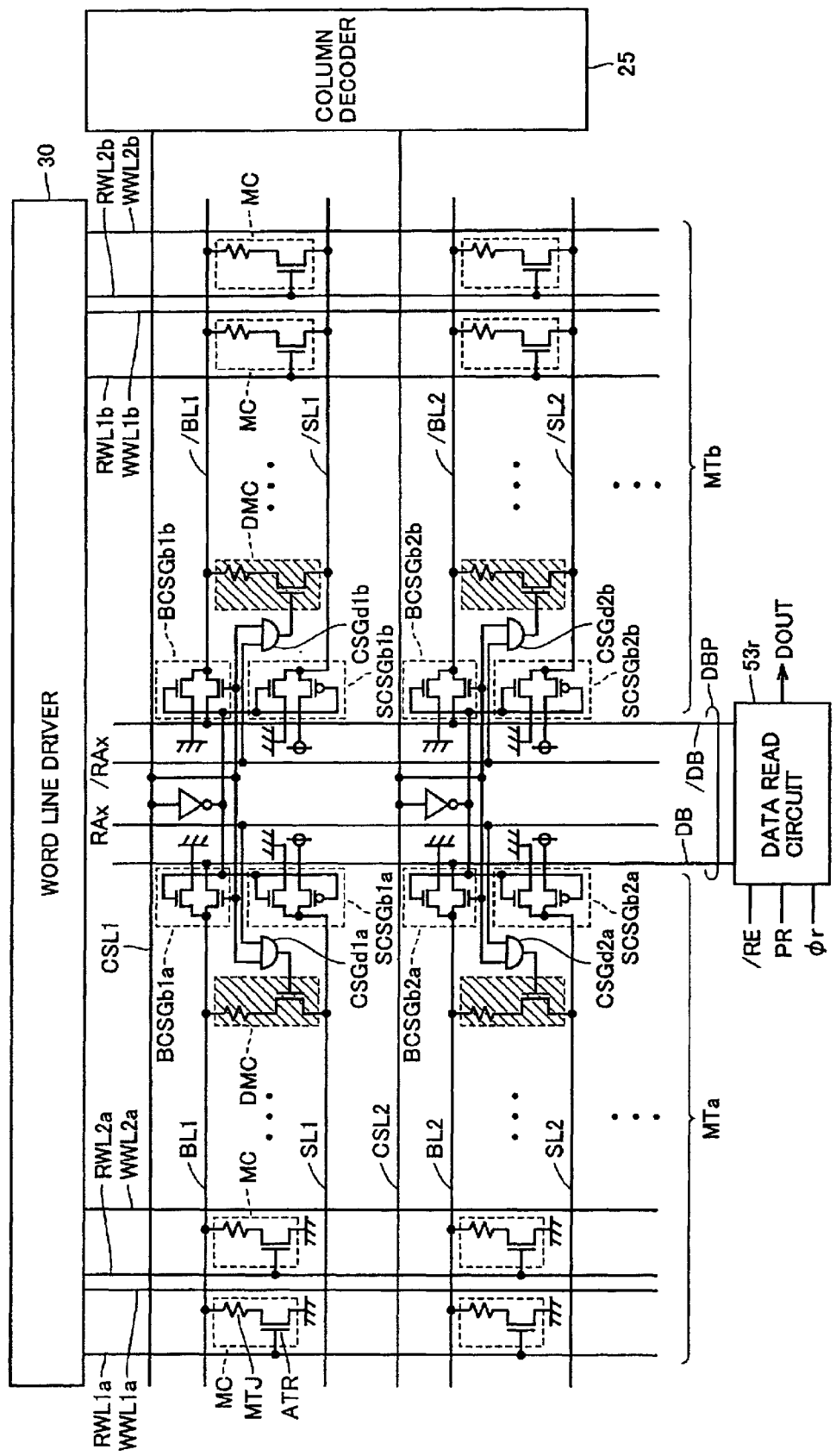
FIG. 38 is a conceptual diagram showing the structure of a memory array 10 and its peripheral circuitry according to a third modification of the fourth embodiment.

Referring to FIG. 38, the structure of the third modification of the fourth embodiment is different from the structure of FIG. 37 in that source lines SL respectively corresponding to the memory cell columns are provided in each memory mat MTa, MTb. Each memory cell MC and dummy memory cell DMC are provided between a corresponding bit line BL and source line SL.

The same bit line driving gates BCSGb and source line driving gates SCSGb as those of the first modification of the first embodiment are provided respectively corresponding to the bit lines BL and the source lines SL. Thus, the data read circuit 53r of FIG. 9 is provided instead of the data read circuit 56r.

This structure enables reduced power consumption and improved read operation margin as described in the first embodiment, in addition to the effects obtained by the structure of the second modification of the fourth embodiment.

Note that the bit line driving gates BCSGb and the source line driving gates SCSGb may be replaced with the bit line driving gates BCSGa and the source line driving gates SCSGa of FIG. 2.

The source lines SL, bit line selection gates BCSGa or BCSGb, and source line selection gates SCSGa or SCSGb may be provided to the structure of the fourth embodiment and the first modification thereof in order to further obtain the same effects as those of the first embodiment.

In the structure in which the source line SL is driven to the ground voltage VSS in the data read operation as shown in the first embodiment, the data read operation may alternatively be conducted by driving the data bus DB to the power supply voltage VDD so as to actively supply a sense current (data read current).

Similarly, in the structure in which the source line SL is driven to the power supply voltage VDD in the data read operation as shown in the modifications of the first embodiment, the second, third and fourth embodiments and the modifications thereof, the data read operation may alternatively be conducted by driving the data bus DB to the ground voltage VSS so as to actively supply a sense current (data read current).

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A thin film magnetic memory device, comprising:
   a plurality of memory cells each having its electric resistance value varying according to a storage data level written thereto by an applied magnetic field;
   a plurality of first data lines respectively provided for fixed groupings of said plurality of memory cells, for reading said storage data level in data read operation;
   a plurality of source lines provided respectively corresponding to said plurality of first data lines, and each electrically coupled to a corresponding one of said plurality of first data lines through a selected one of the memory cells in a corresponding fixed grouping in said data read operation;
   a plurality of first data line selection portions provided respectively corresponding to said plurality of first data lines, each of said plurality of first data line selection portions precharging a corresponding one of said plurality of first data lines to a first voltage before said data read operation, and electrically disconnecting said corresponding first data line from said first voltage in said data read operation; and a plurality of source line selection portions provided respectively corresponding to said plurality of source lines, each of said plurality of source line selection portions including
 a source line precharging portion for precharging a corresponding one of said plurality of source lines to a second voltage before said data read operation, and
 a source line driving portion for electrically coupling said corresponding source line to a third voltage in said data read operation.

2. The thin film magnetic memory device according to claim 1, wherein said first and second voltages are a same voltage.

3. The thin film magnetic memory device according to claim 2, wherein said same voltage is the ground voltage.

4. The thin film magnetic memory device according to claim 1, wherein
 each of said memory cells has such characteristics that a difference in electric resistance value resulting from a difference in said storage data level is less likely to appear as a voltage applied to both ends of the memory cell is increased,
 said first and second voltages are a same voltage, and
 each of said source line driving portions includes a first current switch portion for forming a path of a prescribed passing current amount between said corresponding source line and said third voltage to adjust a change rate of a voltage on said corresponding source line in said data read operation.

5. The thin film magnetic memory device according to claim 4, wherein
 each of said source line precharging portions includes a second current switch portion electrically coupled between said corresponding source line and said second voltage, and
 said passing current amount of said first current switch portion is smaller than that of said second current switch portion.

6. The thin film magnetic memory device according to claim 1, wherein
 said plurality of memory cells are arranged in a matrix,
 said plurality of first data lines are provided respectively corresponding to memory cell columns,
 each of said first data line selection portions electrically disconnects said corresponding first data line from said first voltage when a corresponding memory cell column is selected for the data read operation, and
 the remaining first data lines of non-selected memory cell columns are retained at said first voltage.

7. The thin film magnetic memory device according to claim 6, further comprising a plurality of column selection lines provided respectively corresponding to said memory cell columns, and each activated and inactivated respectively in response to selection and non-selection of a corresponding memory cell column, wherein
 each of said first data line selection portions includes a transistor switch electrically coupled between said corresponding first data line and said first voltage, and turned ON and OFF in response to said activation and inactivation of a corresponding column selection line, respectively.

8. The thin film magnetic memory device according to claim 1,
 said plurality of memory cells are arranged in a matrix,
 said plurality of source lines are provided respectively corresponding to memory cell columns,
 each of said source line selection portions electrically couples said corresponding source line to said third voltage when a corresponding memory cell column is selected for the data read operation, and
 the remaining source lines of non-selected memory cell columns are retained at said second voltage.

9. The thin film magnetic memory device according to claim 8, further comprising a plurality of column selection lines provided respectively corresponding to said memory cell columns, and each activated and inactivated respectively in response to selection and non-selection of a corresponding memory cell column, wherein
 each of said source line driving portions includes a first transistor switch electrically coupled between said corresponding source line and said third voltage, and turned ON and OFF respectively in response to said activation and inactivation of a corresponding one of said plurality of column selection lines, and
 each of said source line precharging portions includes a second transistor switch electrically coupled between said corresponding source line and said second voltage, and turned ON and OFF respectively in response to said activation and inactivation of said corresponding column selection line.

10. The thin film magnetic memory device according to claim 1, further comprising:
 a second data line for transmitting a reference voltage to be compared with a voltage on a selected one of said plurality of first data lines corresponding to a memory cell selected for said data read operation;
 a data read circuit for sensing and amplifying a voltage difference between the selected first data line and said second data lines;
 a dummy memory cell having an intermediate electric resistance value of the electric resistance values of each memory cell respectively corresponding to the storage data levels;
 a dummy source line provided corresponding to said second data line, and electrically coupled to said second data line through said dummy memory cell in said data read operation;
 a second data line selection portion corresponding to said second data line; and
 a dummy source line selection portion corresponding to said dummy source line, wherein
 said second data line selection portion precharges said second data line to said first voltage before said data read operation, and electrically disconnects said second data line from said first voltage in said data read operation, and
 said dummy source lines selection portion includes
  a dummy source line precharging portion for precharging said dummy source line to said second voltage before said data read operation, and
  a dummy source line driving portion for electrically coupling said dummy source line to said third voltage in said data read operation.

11. The thin film magnetic memory device according to claim 10, wherein an electric resistance value per unit length of said plurality of first data lines and said second data line is designed so that the first data line in a first current path including the memory cell selected for said data read operation has a same electric resistance value as that of said second data line in a second current path including said dummy memory cell, said first and second current paths being formed between said data read circuit and said third voltage.

12. The thin film magnetic memory device according to claim 10, wherein said plurality of second data lines are provided respectively corresponding said plurality of first data lines, each of said dummy source lines respectively corresponding to said plurality of second data lines is provided as a wiring common to a corresponding one of said plurality of source lines, and each of said dummy source line selection portions respectively corresponding to said dummy source lines is common to a corresponding one of said source selection portions.

13. A thin film magnetic memory device, comprising:

a memory cell for storing data, wherein each of said memory cells includes a magnetic storage portion having its electric resistance value varying according to a storage data level, said magnetic storage portion including a first magnetic layer retaining a prescribed fixed magnetization direction, and a second magnetic layer retaining a magnetization direction written according to combination of a first data write magnetic field for applying a magnetic field in a hard magnetization axis direction and a second data write magnetic field for applying a magnetic field in an easy magnetization axis direction, said thin film magnetic memory device further comprising:

a first signal line for passing therethrough a first data write current generating said first data write magnetic field; and a second signal line for passing therethrough a second data write current generating said second data write magnetic field, wherein supply of said first data write current is started prior to supply of said second data write current in data write operation.

14. The thin film magnetic memory device according to claim 13, wherein said second signal line passes therethrough a data read current to be applied across said magnetic storage portion in data read operation, and a time period from start of said data read operation until said data read current starts to flow through said second signal line is shorter than a time period from start of said data write operation until said second data write current starts to flow through said second signal line.

15. The thin film magnetic memory device according to claim 13, further comprising:

a third signal line electrically coupled to said second signal line through said memory cell in data read operation;

a first signal line selection portion for controlling a voltage on said second signal line; and a second signal line selection portion for controlling a voltage on said third signal line, wherein said first signal line selection portion precharges said second signal line to a first voltage before said data read operation, and electrically disconnects said second signal line from said first voltage in said data read operation, and said second signal line selection portion includes a precharging portion for precharging said third signal line to a second voltage before said data read operation, and a signal line driving portion for electrically coupling said third signal line to a third voltage in said data read operation.

16. A thin film magnetic memory device, comprising:

a plurality of memory cells arranged in a matrix, each of said plurality of memory cells including a magnetic storage portion having its electric resistance value varying according to a storage data level written therein by combination of first and second data write magnetic fields;

a plurality of write word lines provided respectively corresponding to memory cell rows, and selectively activated in data write operation to pass therethrough a first data write current for generating said first data write magnetic field;

a plurality of bit lines provided respectively corresponding to memory cell columns;

a plurality of source lines provided respectively corresponding to said memory cell columns, each of said plurality of source lines interposing the memory cells on a corresponding memory cell column between itself and a corresponding one of said plurality of bit lines;

a plurality of coupling switches provided respectively corresponding to said memory cell columns, for electrically coupling one of said plurality of source lines and one of said plurality of bit lines to each other at their respective one ends in said data write operation according to a column selection result; and a data write circuit for supplying a second data write current for generating said second data write magnetic field in said data write operation, said data write circuit coupling, according to said column selection result, one of said plurality of source lines to one of first and second voltages and one of said plurality of bit lines to the other voltage at the other ends according to said storage data level.

17. The thin film magnetic memory device according to claim 16, wherein each of said memory cells further includes an access portion selectively turned ON in data read operation to electrically couple said magnetic storage portion between a corresponding one of said plurality of bit lines and a corresponding one of said plurality of source lines, said thin film magnetic memory device further comprising:

a data read circuit for electrically coupling one of said source lines and one of said bit lines respectively to said first and second voltages at the other ends in said data read operation according to said column selection result, and conducting said data read operation based on a voltage change on the bit line corresponding to said column selection result, wherein said plurality of coupling switches electrically disconnect said respective one ends of one of said source lines and one of said bit lines from each other in said data read operation according to said column selection result.

18. A thin film magnetic memory device, comprising:

a plurality of memory cells arranged in a matrix, each of said plurality of memory cells including a magnetic storage portion having its electric resistance value varying according to a storage data level written by combination of first and second data write magnetic fields;

a plurality of write word lines provided respectively corresponding to memory cell rows, and selectively activated in data write operation to pass therethrough a first data write current for generating said first data write magnetic field;

a plurality of source lines provided respectively corresponding to said memory cell rows, and coupled to a first voltage at their respective one ends;

a plurality of bit lines provided respectively corresponding to memory cell columns, and selectively receiving a second data write current for generating said second data write magnetic field in said data write operation according to a column selection result; and a word line driver for coupling the activated write word line to a second voltage at its one end in said data write operation, wherein said first data write current flows through a current path formed from said activated write word line and at least one of said plurality of source lines which is electrically coupled to said activated write word line at the other ends.

19. The thin film magnetic memory device according to claim 18, wherein each of said plurality of write data lines is electrically coupled to one of said plurality of source lines corresponding to a same memory cell row at the other ends, and said write word lines and said source lines are arranged such that magnetic fields respectively generated in said magnetic storage portion from said data write current flowing through the write word line and the source line have a same direction.

20. The thin film magnetic memory device according to claim 19, wherein each write word line and each source line are arranged so as to interpose said magnetic storage portion therebetween in a vertical direction.

21. The thin film magnetic memory device according to claim 18, further comprising a plurality of coupling switches respectively provided between each write word line and a plurality of source lines of other memory cell rows, wherein at least one coupling switch corresponding to said activated write word line is turned ON in said data write operation.

22. A thin film magnetic memory device, comprising:

a plurality of memory cells arranged in a matrix, each of said plurality of memory cells including a magnetic storage portion having its electric resistance value varying according to a storage data level written therein by combination of first and second data write magnetic fields, and an access portion coupled in series with said magnetic storage portion, and selectively turned ON in data read operation to pass a data read current therethrough and turned OFF in data write operation, said thin film magnetic memory device further comprising:

a plurality of read word lines provided respectively corresponding to memory cell rows, for turning ON said access portion in said data read operation according to a row selection result;

a plurality of write word lines provided respectively corresponding to said memory cell rows, and selectively activated to pass therethrough a first data write current generating said first data write magnetic field in said data write operation;

a plurality of bit lines provided respectively corresponding to memory cell columns, each of said plurality of bit lines being electrically coupled to said plurality of write word lines through said memory cells;

a word line driver for coupling the activated write word line to a first voltage at its one end and setting the remaining write word lines to a second voltage in order to supply said first data write current in said data write operation;

coupling switches respectively coupled between each write word line and a plurality of write word lines of other memory cell rows, each of the coupling switches being turned ON when one of the two write word lines coupled thereto is activated; and a data read circuit for supplying said data read current to one of said plurality of bit lines in said data read operation according to a column selection result, and conducting said data read operation based on a voltage change on said bit line corresponding to said column selection result, wherein said word line driver sets each of said plurality of write word lines to a prescribed voltage in said data read operation.

23. A thin film magnetic memory device, comprising:

a plurality of memory cells arranged in a matrix, each of said plurality of memory cells including a magnetic storage portion having its electric resistance value varying according to a storage data level written therein, and an access portion selectively turned ON in data read operation to pass a data read current therethrough, said thin film magnetic memory device further comprising:

a plurality of data lines provided respectively corresponding to memory cell columns, for selectively receiving said data read current in said data read operation; and a plurality of reference voltage generating portions provided respectively corresponding to said memory cell columns, each of said plurality of reference voltage generating portions being selectively activated in said data read operation according to a column selection result to produce a reference voltage to be compared with a voltage on a corresponding one of said plurality of data lines, wherein each of said plurality of memory cells is coupled between a corresponding one of said plurality of data lines and a prescribed voltage.

24. The thin film magnetic memory device according to claim 23, further comprising dummy data lines provided respectively corresponding said memory cell columns, for receiving said data read current when a corresponding memory cell column is selected for said data read operation, wherein each of said plurality of reference voltage generating portions includes a dummy memory cell including a dummy resistance having an intermediate electric resistance value of the electric resistance values respectively corresponding to the storage data levels of each memory cell, and a dummy access portion electrically coupled in series with said dummy resistance between said corresponding one of said plurality of data lines and said prescribed voltage, and turned ON when a corresponding memory cell column is selected, and a dummy selection portion for turning ON said dummy access portion when a corresponding memory cell column is selected for said data read operation.

25. The thin film magnetic memory device according to claim 24, wherein two reference voltage producing portions are provided in every memory cell column, each data line and each dummy data line are provided using two signal lines corresponding to a corresponding column, and one of said two signal lines is electrically coupled to said memory cell and the other is electrically coupled to said dummy memory cell according to a row selection result.

26. The thin film magnetic memory device according to claim 23, further comprising:

a plurality of source lines provided respectively corresponding to said plurality of data lines, each of said plurality of source lines being electrically coupled to a corresponding one of said plurality of data lines through a selected memory cell of a same memory cell column in said data read operation;

a plurality of data line selection portions provided respectively corresponding to said plurality of data lines; and a plurality of source line selection portions provided respectively corresponding to said plurality of source lines, wherein each of said plurality of data line selection portions precharges a corresponding one of said plurality of data lines to a first voltage before said data read operation, and electrically disconnect said corresponding bit line from said first voltage in said data read operation, and each of said plurality of source line selection portions includes a source line precharging portion for precharging a corresponding one of said plurality of source lines to a second voltage before said data read operation, and a source line driving portion for electrically coupling said corresponding source line to said prescribed voltage in said data read operation.

27. A thin film magnetic memory device, comprising:

a plurality of memory cells each having its electric resistance value varying according to a storage data level written thereto by an applied magnetic field;

a plurality of first data lines provided for fixed groupings of said plurality of memory cells, for reading said storage data level in data read operation; and a plurality of source lines provided corresponding to said plurality of first data lines, and each electrically coupled to a corresponding one of said plurality of first data lines through a selected one of the memory cells in a corresponding fixed grouping in said data read operation.

28. A thin film magnetic memory device, comprising:

a plurality of memory cells each having its electric resistance value varying according to a storage data level written thereto by an applied magnetic field;

a plurality of first data lines provided for fixed groupings of said plurality of memory cells, for reading said storage data level in data read operation; and a plurality of first data line selection portions provided respectively corresponding to said plurality of first data lines, and each precharging a corresponding first data line of said plurality of first data lines to a predetermined voltage before said data read operation, wherein said plurality of first data line selection portions electrically disconnects a selected first data line of said plurality of first data lines from said predetermined voltage in said data read operation.

29. The thin film magnetic memory device according to claim 28, wherein said plurality of first data line selection portions electrically connects the first data lines other than said selected first data line to said predetermined voltage in said data read operation.

30. The thin film magnetic memory device according to claim 28, wherein said fixed groupings correspond to columns of said plurality of memory cells, and said plurality of first data line selection portions operates in accordance with selection of said columns by inputted column address.

31. A thin film magnetic memory device, comprising:

a plurality of memory cells each having its electric resistance value varying according to a storage data level written thereto by an applied magnetic field;

a plurality of first data lines provided for fixed groupings of said plurality of memory cells, for reading said storage data level in data read operation;

a plurality of source lines provided corresponding to said plurality of first data lines, and each electrically coupled to a corresponding one of said plurality of first data lines through a selected one of the memory cells in a corresponding fixed grouping in said data read operation;

a plurality of source line selection portions provided respectively corresponding to said plurality of source lines, each precharging a corresponding source line of said plurality of source lines to a first voltage before said data read operation, wherein said plurality of source line selection portions electrically connects a selected source line corresponding to a selected one of said plurality of first data lines to a second voltage different from said first voltage in said data read operation.

32. The thin film magnetic memory device according to claim 31, wherein said plurality of source line selection portions electrically connects the source lines other than said selected source line to said first voltage in said data read operation.

33. The thin film magnetic memory device according to claim 31, wherein said fixed groupings correspond to columns of said plurality of memory cells, and said plurality of source line selection portions operates in accordance with selection of said columns by inputted column address.

* * * * *